US012766663B2

(12) United States Patent
Suzuki et al.

(10) Patent No.: US 12,766,663 B2
(45) Date of Patent: Oct. 20, 2026

(54) POLISHING APPARATUS AND POLISHING METHOD

(71) Applicant: EBARA CORPORATION, Tokyo (JP)

(72) Inventors: Yuta Suzuki, Tokyo (JP); Taro Takahashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 745 days.

(21) Appl. No.: 16/207,958

(22) Filed: Dec. 3, 2018

(65) Prior Publication Data

US 2019/0168355 A1 Jun. 6, 2019

(30) Foreign Application Priority Data

Dec. 5, 2017 (JP) ................................ 2017-233315

(51) Int. Cl.
*B24B 37/10* (2012.01)
*B24B 37/013* (2012.01)
(Continued)

(52) U.S. Cl.
CPC .......... *B24B 37/105* (2013.01); *B24B 37/013* (2013.01); *B24B 49/10* (2013.01);
(Continued)

(58) Field of Classification Search
CPC . B24B 37/103; B24B 37/013; B24B 37/0023; B24B 37/205; B24B 37/32;
(Continued)

(56) References Cited

U.S. PATENT DOCUMENTS 5,639,388 A 6/1997 Kimura et al.
5,770,521 A * 6/1998 Pollock ................ B24B 37/345 438/692
(Continued)

FOREIGN PATENT DOCUMENTS

JP 2001-252866 A 9/2001
JP 2004-249458 A 9/2004
(Continued)

OTHER PUBLICATIONS

Xuejun et al.; "Design of CMP End-Point Detector"; China Academic Journal Electronic Publishing House; Semiconductor Technology; vol. 33 ; Aug. 2008; p. 670-673 (contains English Abstract).

*Primary Examiner* — Keath T Chen
*Assistant Examiner* — Margaret Klunk
(74) *Attorney, Agent, or Firm* — BakerHostetler

(57) ABSTRACT

A polishing pad is held using a polishing table. The polishing table is driven to rotate using a first electric motor. The top ring for holding a semiconductor wafer and pressing the top ring against a polishing pad is driven to rotate by a top ring motor. The top ring is held by the swing arm. The swing arm is made to swing around a swing center on the swing arm by a swing shaft motor. A first output is generated by detecting a current value of the swing shaft motor. While polishing the semiconductor wafer by causing the semiconductor wafer to swing around the swing center on the swing arm, a change of a frictional force between the polishing pad and the semiconductor wafer is detected by increasing a change amount of the first output.

9 Claims, 28 Drawing Sheets

(51) Int. Cl.

| | |
|---|---|
| ***B24B 49/10*** | (2006.01) |
| ***B24B 49/16*** | (2006.01) |
| ***H10P 52/00*** | (2026.01) |
| *B24B 27/00* | (2006.01) |
| *B24B 37/20* | (2012.01) |
| *B24B 37/32* | (2012.01) |
| *B24B 49/12* | (2006.01) |
| *B24B 53/017* | (2012.01) |
| *B24B 57/02* | (2006.01) |

(52) U.S. Cl.
CPC .............. *B24B 49/16* (2013.01); *H10P 52/00* (2026.01); *B24B 27/0023* (2013.01); *B24B 37/205* (2013.01); *B24B 37/32* (2013.01); *B24B 49/105* (2013.01); *B24B 49/12* (2013.01); *B24B 53/017* (2013.01); *B24B 57/02* (2013.01)

(58) Field of Classification Search
CPC ......... B24B 49/10; B24B 49/16; B24B 49/12; B24B 49/105; H01L 21/304
See application file for complete search history.

(56) References Cited

U.S. PATENT DOCUMENTS

| | | | | |
|---|---|---|---|---|
| 5,904,608 | A * | 5/1999 | Watanabe | G05B 19/416 451/21 |
| 6,293,845 | B1 * | 9/2001 | Clark-Phelps | B24B 37/013 156/345.13 |
| 6,609,962 | B1 * | 8/2003 | Wakabayashi | B24B 1/04 451/443 |
| 2001/0001755 | A1 * | 5/2001 | Sandhu | B23Q 15/013 451/8 |
| 2002/0142706 | A1 * | 10/2002 | Glashauser | B24B 53/017 451/41 |
| 2004/0176015 | A1 * | 9/2004 | Lahnor | B24B 49/00 451/8 |
| 2008/0071414 | A1 * | 3/2008 | Fujita | B24B 37/013 700/121 |
| 2009/0137190 | A1 | 5/2009 | Togawa et al. | |
| 2010/0041316 | A1 * | 2/2010 | Wang | B24B 53/017 451/37 |
| 2013/0189801 | A1 * | 7/2013 | Molnar | B24B 37/042 438/8 |
| 2014/0020830 | A1 | 1/2014 | Rangarajan et al. | |
| 2014/0065931 | A1 | 3/2014 | Shinozaki | |
| 2014/0295737 | A1 * | 10/2014 | Kosuge | B24B 37/005 451/8 |
| 2015/0125971 | A1 * | 5/2015 | Takahashi | B24B 37/013 451/5 |
| 2015/0343594 | A1 * | 12/2015 | Shinozaki | B24B 49/16 451/5 |
| 2017/0106493 | A1 * | 4/2017 | Takahashi | B24B 37/013 |
| 2017/0282325 | A1 * | 10/2017 | Takahashi | B24B 37/046 |
| 2018/0093360 | A1 | 4/2018 | Shinozaki et al. | |

FOREIGN PATENT DOCUMENTS

| | | | | | |
|---|---|---|---|---|---|
| JP | 6227821 | B1 | 11/2017 | | |
| KR | 2014-0030045 | A | 3/2014 | | |
| WO | WO-2016035673 | A1 * | 3/2016 | | B24B 37/013 |

* cited by examiner

POLISHING APPARATUS AND POLISHING METHOD

CROSS-REFERENCE TO RELATED APPLICATION

This application is based upon and claims benefit of priority from Japanese Patent Application Nos. 2017-233315 filed on Dec. 5, 2017, the entire contents of which is incorporated herein by reference.

TECHNICAL FIELD

The present invention relates to a polishing apparatus and a polishing method.

BACKGROUND ART

The trend of a semiconductor device in recent years has been a highly integrated structure, which entails finer interconnects of a circuit and a smaller distance between the interconnects. In fabrication of the semiconductor device, many types of materials are deposited in a shape of film on a semiconductor wafer repeatedly to form a multilayer structure. It is important for forming the multilayer structure to planarize a surface of a wafer. A polishing apparatus for performing chemical mechanical polishing (CMP) is typically used as one technique of planarizing the surface of the semiconductor wafer (also called a chemical mechanical polishing apparatus).

This chemical mechanical polishing (CMP) apparatus typically includes a polishing table supporting a polishing pad thereon for polishing a polishable object (substrate such as a semiconductor wafer) and a top ring for holding a semiconductor wafer for holding and pressing the polishable object against the polishing pad. The polishing table and the top ring are respectively driven to rotate by a drive section (e.g., motor). The polishing apparatus is further provided with a nozzle for supplying a polishing liquid onto the polishing pad. The top ring presses the semiconductor wafer against the polishing pad, while the polishing liquid is supplied onto the polishing pad from the nozzle, and the top ring and the polishing table are moved relative to each other, whereby the semiconductor wafer is polished to have a planarized surface. Examples of the holding scheme for holding the top ring and the drive section of the top ring include a scheme of holding them at an end portion of a swing arm (cantilever arm) and a scheme of holding them onto a carousel.

When polishing of a polishable object is not sufficient, the polishing apparatus cannot ensure insulation between circuits, which may result in a short-circuit. On the other hand, when excessive polishing occurs, a cross-sectional area of wiring decreases, the resistance thereby increases or the wiring itself is completely removed, resulting in a problem that the circuit itself is not formed. Therefore, the polishing apparatus is required to detect an optimum polishing end point.

As one of the polishing end point detection means, a method of detecting a change in the polishing frictional force when the polishing reaches a point where there is a change from a substance to another substance of a different material is known. The semiconductor wafer which is the polishable object includes a multilayer structure made up of a semiconductor, a conductor and an insulator of different materials and friction factor varies among layers of different materials. For this reason, this is a method of detecting a change in the polishing frictional force generated when the polishing changes to a layer of different material. According to this method, a time point at which polishing reaches the different material layer is an end point of polishing.

The polishing apparatus can also detect a polishing end point by detecting a change in the polishing frictional force when the polishing surface of the polishable object is changed from a non-flat state to a flat state.

Here, the polishing frictional force generated when the polishable object is polished appears as a drive load of the drive section that drives to rotate the polishing table or the top ring. For example, in a case where the drive section is an electric motor, the drive load (torque) can be measured as a current that flows through the motor. For this reason, it is possible to detect a motor current (torque current) using a current sensor and detect an end point of polishing based on a change in the detected motor current.

Japanese Patent Application Laid-Open No. 2004-249458 discloses a method for detecting an end point of polishing in a scheme of holding a top ring at an end portion of a swing arm by measuring a polishing frictional force using a motor current of a motor that drives a polishing table. Regarding a scheme of holding a plurality of top rings onto a carousel, an end point detection method by detecting a torque current (motor current) of a carousel rotation motor (Japanese Patent Application Laid-Open No. 2001-252866, U.S. Pat. No. 6,293,845). There is also a scheme in which the top ring is driven laterally by a linear motor attached to a carousel. In this scheme, an end point is detected by detecting a torque current (motor current) of the linear motor.

CITATION LIST

Patent Literature

PTL 1: Japanese Patent Application Laid-Open No. 2004-249458

PTL 2: Japanese Patent Application Laid-Open No. 2001-252866

PTL 3: U.S. Pat. No. 6,293,845

SUMMARY OF INVENTION

Technical Problem

A polishing process executed by a polishing apparatus includes a plurality of polishing conditions according to a combination of a case where polishing is performed while swinging a swing arm, a case where polishing is performed while not causing a swing arm to swing, a type of a polishable object, a type of a polishing pad, a type of a polishing abrasive liquid (slurry) or the like. Among the plurality of polishing conditions, there are some conditions under which even when a change occurs in a drive load of the drive section, no large change (feature point) may appear in a torque current. When the change in the torque current is small, polishing may be affected by noise appearing in the torque current or an undulating part generated on a waveform of the torque current, and the end point of polishing may not be detected appropriately, resulting in a problem such as excessive polishing.

Particularly, when polishing is performed while swinging the swing arm, detecting a frictional force fluctuation caused by fluctuation of the motor current of the top ring or the polishing table involves the following problems. The motor current fluctuates due to a swing operation of the swing arm. For example, when the top ring swings, a relative speed between the top ring and the polishing table changes, and this causes the motor current to fluctuate. As a factor of fluctuation of the motor current, the number of fluctuation factors increases compared to a case where polishing is performed without causing the swing arm to swing. For this reason, it has been difficult to detect fluctuations of the frictional force from fluctuations of the motor currents of the top ring and the polishing table.

Note that appropriately detecting an end point of polishing is important also for dressing of the polishing pad. Dressing is performed by pressing a pad dresser, on a surface of which a grindstone of diamond or the like is disposed, against the polishing pad. The surface of the polishing pad is shaven or coarsened using the pad dresser, slurry retainability of the polishing pad is improved before polishing starts or slurry retainability of the polishing pad in use is recovered, and the polishing capability is thereby maintained.

Thus, it is an object of an embodiment of the present invention to improve the accuracy of polishing end point detection in a scheme of holding the top ring at an end portion of the swing arm.

Solution to Problem

In order to solve the above-described problem, a first aspect adopts a configuration of a polishing apparatus for polishing between a polishing pad and a polishable object disposed opposed to the polishing pad, the polishing apparatus including a polishing table that can hold the polishing pad, a first electric motor that can drive to rotate the polishing table, a holding section that can hold the polishable object and press the polishable object against the polishing pad, a second electric motor that can drive to rotate the holding section, a swing arm that holds the holding section, a third electric motor that can swing the swing arm around a swing center on the swing arm, a detection section that can detect a current value of one of the first, second and third electric motors and/or a torque command value of the one electric motor and can generate a first output, and a change detection section that can increase a change amount of the first output while causing the polishable object to swing around the swing center on the swing arm and polishing the polishable object and, can detect a change of a frictional force between the polishing pad and the polishable object.

Here, examples of the polishable object include “substrate”, “wafer”, “silicon wafer”, “semiconductor wafer”, “glass substrate”, and “printed circuit board”. A shape of a polishable object is not limited to a circular shape, and, for example, a rectangular shape may be adopted. Furthermore, examples of the polishable object also include a polishing pad in addition to a substrate. That is, the present embodiment is also applicable to dressing of a polishing pad. Therefore, an end of polishing means an end of polishing on a surface of a substrate or the like in the case of the substrate. The end of processing means an end of polishing when a substrate or the like is polished and an end of a surface smoothing process (or dressing process) of a polishing pad when the polishing pad is dressed.

In the present embodiment, a change amount of the first output is increased while swinging the polishable object around the swing center on the swing arm and polishing the polishable object to detect a change of a frictional force between the polishing pad and the polishable object, and it is thereby possible to improve the accuracy of polishing end point detection.

In the case of the scheme in which torque is measured at the root of the swing arm (e.g., a scheme in which a current of the third electric motor is measured), the detection sensitivity (S/N) of frictional force fluctuation is improved compared to the detection scheme of frictional force fluctuation caused by motor current fluctuation of the top ring or the polishing table. However, the prior art has a difficulty in detecting a change of the frictional force while swinging because of the aforementioned problem that occurs when polishing is performed while swinging the swing arm.

In the scheme of holding the top ring at an end portion of the swing arm, the waveform of a current value of the motor that drives the swing arm varies depending on whether or not polishing is performed while swinging the swing arm, as will be described later. When polishing is performed while not swinging the swing arm, the motor that drives the swing arm supplies a current for holding the top ring at a predetermined position (servo lock state). When polishing is performed while swinging the swing arm, the motor that drives the swing arm supplies a current for rotating the motor. When polishing is performed while swinging the swing arm, it has been found that change amounts of the current of the motor that drives the swing arm and the torque command value are smaller when the frictional force varies compared to the case where polishing is performed while not swinging the swing arm. Therefore, when polishing is performed while swinging the swing arm, it is relatively more difficult to detect change points of the motor current and the torque command value compared to the case where polishing is performed while not swinging the swing arm.

When the swing arm is swinging, there are influences of accessories of the swing arm and the bearing, more noise is generated in the drive current of the motor compared to the case where polishing is performed while not swinging the swing arm. In this context, when polishing is performed while swinging the swing arm, it is relatively more difficult to detect change points of the motor current and the torque command value compared to the case where polishing is performed while not swinging the swing arm.

In the present embodiment, it is possible to improve the accuracy of polishing end point detection in a situation in which it is relatively more difficult to detect change points of the motor current and/or the torque command value.

A second aspect adopts a configuration of the polishing apparatus according to the first aspect, in which the first output can be synchronized with swing motion of the swing arm.

A third aspect adopts a configuration of the polishing apparatus according to the first or second aspect, in which the first output can be synchronized with the fluctuation of arm torque added to the swing arm regarding to the swing center.

A fourth aspect adopts a configuration of the polishing apparatus according to any one of the first to third aspects, in which the change detection section can increase the change amount of the first output by multiplying the first output by a constant.

A fifth aspect adopts a configuration of the polishing apparatus according to any one of the first to fourth aspects, in which the change detection section averages the first output and can thereby reduce noise included in the first output.

A sixth aspect adopts a configuration of the polishing apparatus according to any one of the first to fifth aspects, further including an end point detection section that can detect a polishing end point indicating an end of polishing based on a change of the detected frictional force.

A seventh aspect adopts a configuration of the polishing apparatus according to any one of the first to sixth aspects, in which the change detection section amplifies the first output or adds a predetermined value in accordance with the first output to the first output and can thereby increase the change amount of the first output.

An eighth aspect adopts a configuration of the polishing apparatus according to any one of the first to seventh aspects, in which the change detection section can obtain an amount of the first output subjected to smoothing.

A ninth aspect adopts a configuration of a polishing method for polishing between a polishing pad and a polishable object disposed opposed to the polishing pad, the polishing method including a step of holding the polishing pad using a polishing table, a step of driving to rotate the polishing table using a first electric motor, a step of driving to rotate a holding section for holding the polishable object and pressing the polishable object against the polishing pad using a second electric motor, a step of holding the holding section using a swing arm, a step of swinging the swing arm around a swing center on the swing arm using a third electric motor, a step of detecting a current value of one of the first, second and third electric motors and/or a torque command value of the one electric motor and generating a first output, and a step of increasing a change amount of the first output while swinging the polishable object around the swing center on the swing arm and polishing the polishable object, and detecting a change of a frictional force between the polishing pad and the polishable object.

A tenth aspect adopts a configuration of a computer readable recording medium that records a program for causing a computer to control a polishing apparatus that can polish a polishable object, the polishing apparatus including a first electric motor that can drive to rotate a polishing table that can hold a polishing pad, a second electric motor that can drive to rotate a holding section that can hold the polishable object and can press the polishable object against the polishing pad, a third electric motor that can swing a swing arm that holds the holding section around a swing center on the swing arm, and a detection section that can detect a current value of one of the first, second and third electric motors and/or a torque command value of the one electric motor and can generate a first output, and causing the computer to function as change detection means that can detect a change of a frictional force between the polishing pad and the polishable object by increasing a change amount of the first output while swinging the polishable object around the swing center on the swing arm and polishing the polishable object and control means that can control polishing by the polishing apparatus.

An eleventh aspect adopts a configuration of the polishing apparatus according to any of the first to eighth aspects, the polishing apparatus including an optical system that irradiates the polishable surface of the polishable object with light from an optical fiber through a through hole provided in the polishing pad and receives reflected light through the optical fiber and analysis processing means for analyzing and processing the reflected light received by the optical system, analysis processing means analyzing and processing the reflected light, a polishable object film thickness monitoring apparatus that monitors a polishing progress situation of a thin film formed on the polishable surface of the polishable object, in which the polishing apparatus provides a liquid supply hole for supplying a transparent liquid into the through hole provided in the polishing pad in the polishing table, the liquid supply hole is disposed and formed so as to form a flow of a transparent liquid supplied therefrom advancing perpendicularly to the polishable surface of the polishable object and fill the through hole, the optical fiber is disposed so that the radiation light and the reflected light pass through the transparent liquid of the flow portion advancing perpendicularly to the polishable surface, a liquid discharge hole for discharging the transparent liquid of the through hole is provided, the liquid discharge hole is positioned in the rear in the moving direction of the polishing table with respect to the liquid supply hole and is open toward an end face opposite to the polishable object of the through hole.

A twelfth aspect adopts a configuration of the polishing apparatus according to the eleventh aspect, in which a middle point of a line segment connecting the center of the liquid supply hole and the center of the liquid discharge hole is located ahead of the central point of the through hole in the moving direction of the polishing table.

A thirteenth aspect adopts a configuration of the polishing apparatus according to the eleventh or twelfth aspect, in which the through hole is a hole having a substantially elliptic cross section so that the outer periphery of the end face surrounds the end faces of the liquid supply hole and the liquid discharge hole.

A fourteenth aspect adopts a configuration of the polishing apparatus according to any of the eleventh to thirteenth aspects, including a forced liquid discharge mechanism, in which the forced liquid discharge mechanism forcibly discharges a liquid from the liquid discharge hole.

A fifteenth aspect adopts a configuration of the polishing method according to the ninth aspect, including a translucent liquid nozzle and a translucent liquid receiving section disposed on the peripheral portion of the translucent liquid nozzle so as to surround the translucent liquid nozzle, in which a columnar translucent liquid flow is brought into contact with the polishable surface of the polishable object from the translucent liquid nozzle, the translucent liquid flow is received by the translucent liquid receiving section, the translucent liquid in the translucent liquid nozzle and the translucent liquid in the translucent liquid receiving section thereby communicate with each other, a translucent liquid flow hermetically sealed from outside is formed, the translucent liquid flow is passed via an optical system, the polishable surface of the polishable object is irradiated with light, the translucent liquid flow is passed therethrough, light reflected by the polishable surface of the polishable object is received by the optical system and a film thickness of the polishable surface is measured from the intensity of the received reflected light.

A sixteenth aspect adopts a configuration of the polishing method according to the fifteenth aspect, in which the optical system includes at least one optical fiber, a distal end portion of the optical fiber is inserted into the translucent liquid flow, the optical fiber and the translucent liquid flow are passed therethrough, the polishable surface of the polishable object is irradiated with light, and light reflected by the polishable surface is received via the translucent liquid flow and the optical fiber.

A seventeenth aspect adopts a configuration of the polishing apparatus according to any one of the first to eighth and eleventh to fourteenth aspects, including a plurality of processing areas in which a plurality of light-shielded processing units are disposed in upper and lower parts and housed therein, and transfer areas in which a transporter is housed and arranged between the processing areas, in which the processing areas are light-shielded from the transfer areas by a light-shielding wall and the front of the transfer area is light-shielded by a maintenance door and the processing unit is connected to the light-shielding wall in a light-shielded state.

An eighteenth aspect adopts a configuration of the polishing apparatus according to the seventeenth aspect, in which the processing unit includes a substrate insertion port having an openable/closable shutter, the light-shielding wall is provided with a light-shielding film that surrounds the polishable object insertion port and an opening is provided in a region of the light-shielding wall surrounded by the light-shielding film.

A nineteenth aspect adopts a configuration of the polishing apparatus according to the seventeenth or eighteenth aspect, in which the processing area is a cleaning area and processing on a polishable object is cleaning of a polishable object.

A twentieth aspect adopts a configuration of the polishing apparatus according to any one of the first to eighth, eleventh to fourteenth and seventeenth to nineteenth aspects, including a polishing section that polishes the polishable object, a cleaning section that cleans and dries the polishable object, a barrier that separates the polishing section from the cleaning section, a transfer mechanism that transfers the polishable object subjected to polishing from the polishing section to the cleaning section through an opening of the barrier, and a housing having a side wall to house the polishing section, the cleaning section and the transfer mechanism therein, in which the cleaning section includes cleaning means for cleaning the polishable object subjected to polishing with a cleaning liquid, drying means for drying the cleaned polishable object and transfer means that can transfer the polishable object so as to be horizontally and vertically movable between the cleaning means and the drying means, and the polishing section includes the polishing table, the holding section, the swing arm and the first, second and third electric motors. Note that U.S. Pat. No. 5,885,138 is incorporated in the present specification by reference in its entirety.

A twenty-first aspect adopts a configuration of the polishing method according to any of the ninth, fifteenth and sixteenth aspects using a polishing apparatus including a polishing section that polishes the polishable object, a cleaning section that cleans and dries the polishable object, a barrier that separates the polishing section from the cleaning section, a transfer mechanism that transfers the polishable object subjected to polishing from the polishing section to the cleaning section through the opening of the barrier, and a housing having a side wall to house the polishing section, the cleaning section and the transfer mechanism, in which the cleaning section cleans the polished polishable object with a cleaning liquid, dries the cleaned polishable object and transfers the polishable object between the cleaning step and the drying step so as to be horizontally and vertically movable to transfer the polishable object.

A twenty-second aspect adopts a configuration of the polishing apparatus according to any one of the first to eighth, eleventh to fourteenth and seventeenth to twentieth aspects, including an optical sensor that irradiates the polishable object with light and measures intensity of reflected light from the polishable object, in which the optical sensor detects a polishing end point indicating an end of the polishing based on the first output and the intensity of reflected light from the polishable object measured by the optical sensor.

A twenty-third aspect adopts a configuration of the polishing apparatus according to the twenty-second aspect, including a window incorporated at a position in the polishing table where the window can face the polishable object during polishing, in which the optical sensor is disposed below the window.

A twenty-fourth aspect adopts a configuration of the polishing apparatus according to the twenty-second aspect, in which the polishing table includes an opening at a position in the polishing table where the opening can face the polishable object during polishing, the optical sensor is disposed below the window and the optical sensor includes a fluid supply section that supplies a cleaning fluid into the opening.

A twenty-fifth aspect adopts a configuration of the polishing apparatus according to any one of the first to eighth, eleventh to fourteenth and seventeenth to twentieth and twenty-second to twenty-fourth aspects, including an eddy current type sensor that generates a magnetic field in the polishable object and detects intensity of the magnetic field generated, in which the polishing apparatus detects a polishing end point indicating an end of the polishing based on the first output and the intensity of the magnetic field measured by the eddy current type sensor.

A twenty-sixth aspect adopts a configuration of a program for controlling a polishing apparatus that polishes a polishable object, the polishing apparatus including a holding section for holding the polishable object, a swing arm for holding the holding section and an arm torque detection section that directly or indirectly detects arm torque applied to the swing arm, the program causing a computer to function as end point detection means for detecting an end of the polishing based on the arm torque detected by the arm torque detection section and control means for controlling polishing by the polishing apparatus.

A twenty-seventh aspect adopts a configuration of the program according to the twenty-sixth aspect, in which the program is updatable.

A twenty-eighth aspect adopts a configuration of a polishing apparatus including a substrate processing apparatus that polishes a substrate and acquires a polishing-related signal and a data processing apparatus that is connected to the substrate processing apparatus via communication means, in which the data processing apparatus updates parameters relating to a polishing process based on the signal acquired by the substrate processing apparatus. Here, the signal is an analog signal and/or a digital signal.

Examples of the polishing parameters include (1) pressing forces on four regions of a semiconductor wafer, that is, a central part, an inside intermediate part, an outside intermediate part and a peripheral edge, (2) a polishing time, (3) the number of revolutions of the polishing table or the top ring, (4) a threshold for determining a polishing end point or the like. Parameter updating means updating these parameters.

A twenty-ninth aspect adopts a configuration of the polishing apparatus according to the twenty-eighth aspect, in which the signal is acquired by one type of sensor or a plurality of different types of sensors. Examples of the different types of sensors used in the present aspect include the following sensors. That is, (1) a sensor that acquires a measurement signal relating to torque fluctuation of a swing shaft motor, (2) SOPM (optical sensor), (3) eddy current sensor and (4) a sensor for acquiring a measurement signal relating to a fluctuation in the motor current of the polishing table rotation motor.

A thirtieth aspect adopts a configuration of a polishing method, including a step of connecting a substrate processing apparatus and a data processing apparatus via communication means, a step of polishing a substrate using the substrate processing apparatus and acquiring a polishing-related signal and a step of updating parameters relating to a polishing process by the data processing apparatus based on the signal acquired by the substrate processing apparatus.

A thirty-first aspect adopts a configuration of a polishing apparatus, including a substrate processing apparatus that polishes a substrate and acquires a polishing-related signal, an intermediate processing apparatus and a data processing apparatus, in which the substrate processing apparatus and the intermediate processing apparatus are connected by first communication means, the intermediate processing apparatus and the data processing apparatus are connected by second communication means, the intermediate processing apparatus creates a data set relating to a polishing process based on the signal acquired by the substrate processing apparatus, the data processing apparatus monitors a polishing processing state of the substrate processing apparatus based on the data set, and the intermediate processing apparatus or the data processing apparatus detects a polishing end point indicating an end of the polishing based on the data set.

A thirty-second aspect can adopt a configuration of the polishing apparatus according to the thirty-first aspect, in which the signal is acquired by one type of sensor or a plurality of different types of sensors. Examples of the different types of sensors used in the present aspect include the following sensors. That is, (1) a sensor for acquiring a measurement signal relating to a torque fluctuation of a swing shaft motor, (2) SOPM (optical sensor), (3) an eddy current sensor, and (4) a sensor for acquiring a measurement signal relating to a motor current fluctuation of a polishing table rotation motor.

A thirty-third aspect corresponds to the thirty-first aspect, in which examples of the data set include the following. The sensor signal outputted from the sensor and necessary control parameters can be configured as a data set. That is, the data set can include a pressure of the top ring on the semiconductor wafer, a current of the swing shaft motor, a motor current of the polishing table, a measurement signal of the optical sensor, a measurement signal of the eddy current sensor, the position of the top ring on the polishing pad, a flow rate/type of slurry and chemical liquid and correlation calculation data thereof.

A thirty-fourth aspect corresponds to the thirty-first aspect, in which examples of the method of transmitting the data set include the following. The data set can be transmitted using a transmission system that transmits one-dimensional data in parallel or a transmission system that transmits one-dimensional data sequentially. Furthermore, the one-dimensional data can be processed into two-dimensional data to be used as a data set.

A thirty-fifth aspect corresponds to the thirty-first aspect, in which signals having a large fluctuation in signal values can be extracted to update polishing parameters. Examples of the method of updating the polishing parameters include the following. An influence ratio is defined between a sensor as a master and a sensor as a slave by providing priority ratio coefficients (weighting factors) in target values for both the master sensor and the slave sensor. Signals having a large fluctuation in signal values are extracted and the priority ratio coefficients are changed. Fluctuations in signal values include fluctuations lasting only for a short time and fluctuations lasting for a long time. A fluctuation in a signal value means a differential value of the signal value with respect to time or a difference value of a signal value with respect to time or the like.

A thirty-sixth aspect adopts a configuration of a polishing method, including a step of connecting a substrate processing apparatus and an intermediate processing apparatus that polish a substrate and acquire a polishing-related signal using first communication means, a step of connecting the intermediate processing apparatus and the data processing apparatus using second communication means, a step for the intermediate processing apparatus to create a data set relating to a polishing process based on the signal acquired by the substrate processing apparatus, a step for the data processing apparatus to monitor a state of the polishing process of the substrate processing apparatus based on the data set and a step for the intermediate processing apparatus or the data processing apparatus to detect a polishing end point indicating an end of the polishing based on the data set.

BRIEF DESCRIPTION OF DRAWINGS

FIG. 29A illustrating a plan view and FIG. 29B illustrating a cross-sectional side view;

DESCRIPTION OF EMBODIMENTS

Figure 1:
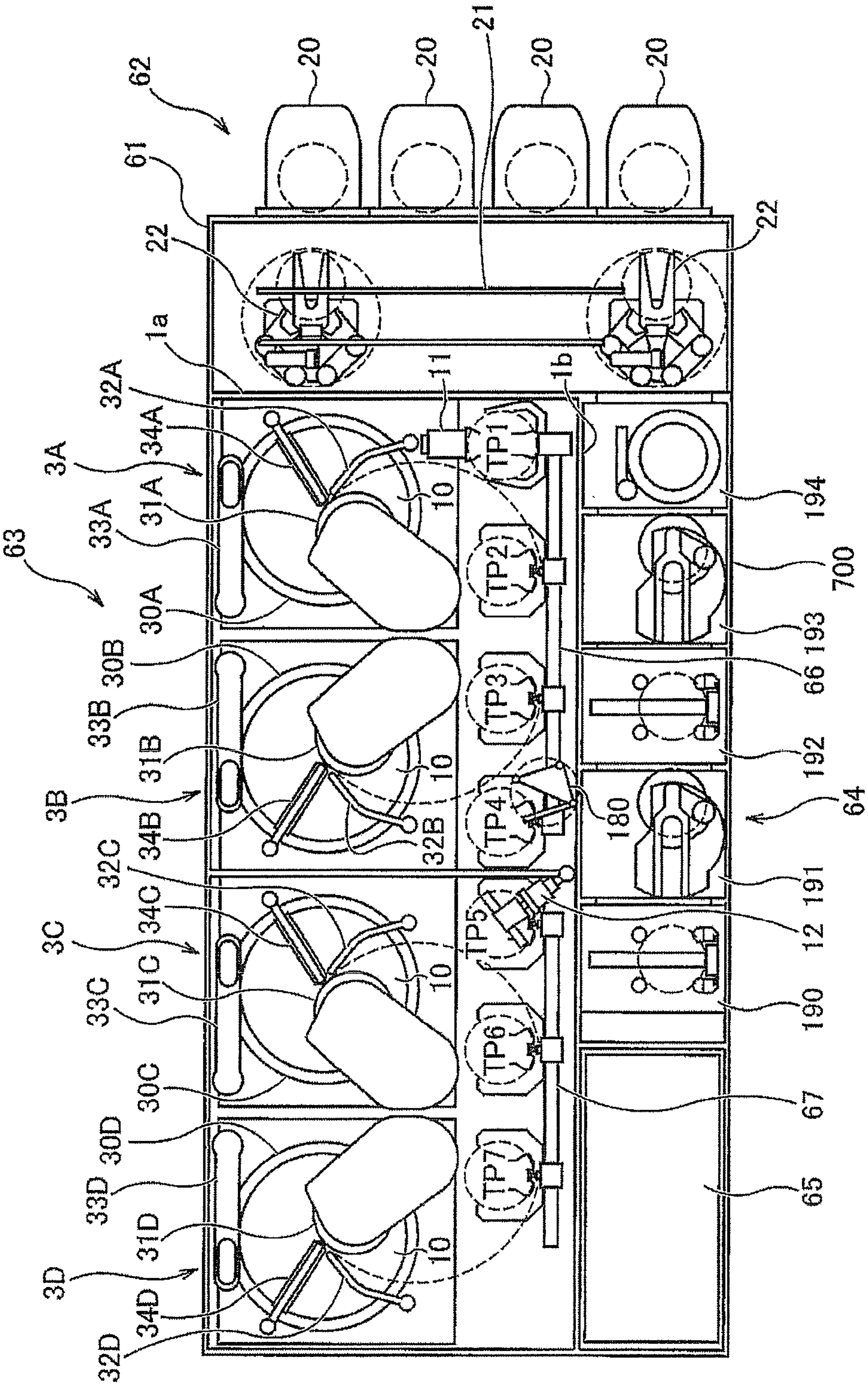
FIG. 1 is a plan view illustrating an overall configuration of a substrate processing apparatus according to an embodiment of the present invention.

Hereinafter, embodiments of the present invention will be described with reference to the accompanying drawings. Note that identical or corresponding members among the following embodiments are assigned identical reference numerals and duplicate description will be omitted.

FIG. 1 is a plan view illustrating a whole arrangement of a substrate processing apparatus according to an embodiment of the present invention. As shown in FIG. 1, the substrate processing apparatus is provided with a housing, that is, substantially rectangular housing 61 in the present embodiment. The housing 61 includes a side wall 700. An interior of the housing 61 is partitioned into a load/unload section 62, a polishing section 63 and a cleaning section 64 by barriers 1*a* and 1*b*. These load/unload section 62, polishing section 63 and cleaning section 64 are assembled independently and a gas therein is exhausted independently. Furthermore, the substrate processing apparatus includes a control section 65 that controls substrate processing operation.

The load/unload section 62 is provided with two or more (four in the present embodiment) front load sections 20 on which wafer cassettes for stocking many semiconductor wafers (substrates) are placed. The front load sections 20 are arranged adjacent to the housing 61 and arrayed along a width direction of the substrate processing apparatus (direction perpendicular to a longitudinal direction). The front load section 20 can mount an open cassette, a SMIF (standard manufacturing interface) pod or a FOUP (front opening unified pod). Here, the SMIF and the FOUP are airtight containers that house a wafer cassette, cover it with a barrier and can thereby maintain an environment independent of an external space.

A traveling mechanism 21 is laid on the load/unload section 62 along a direction in which the front load sections 20 are arranged side by side. Two transfer robots (loaders) 22 which are movable along a wafer cassette array direction are laid on the traveling mechanism 21. The transfer robots 22 can access the wafer cassettes mounted on the front load sections 20 by moving on the traveling mechanism 21. Each transfer robot 22 is provided with two hands, upper and lower. The upper hand is used to return a processed semiconductor wafer to the wafer cassette. The lower hand is used to unload a wafer before processing from the wafer cassette. In this way, the upper and lower hands are used for different purposes. The semiconductor wafer can be turned over by causing the lower hand of the transfer robot 22 to turn around its shaft center.

The load/unload section 62 is a region that must be kept most clean. Therefore, the interior of the load/unload section 62 is always kept to a higher pressure than the outside of the substrate processing apparatus, the polishing section 63 and the cleaning section 64. The polishing section 63 uses slurry as a polishing liquid, and is therefore the dirtiest region. Therefore, a negative pressure is formed inside the polishing section 63 and the pressure thereof is kept lower than the inner pressure of the cleaning section 64. The load/unload section 62 is provided with a filter fan unit (not shown) including a clean air filter such as a HEPA filter, ULPA filter or chemical filter. Clean air stripped of particles, poisonous vapor or poisonous gas is always blown from the filter fan unit.

The polishing section 63 is a region where a semiconductor wafer is polished (planarized) and is provided with a first polishing unit 3A, a second polishing unit 3B, a third polishing unit 3C and a fourth polishing unit 3D. The first polishing unit 3A, second polishing unit 3B, third polishing unit 3C and fourth polishing unit 3D are arrayed along the longitudinal direction of the substrate processing apparatus as shown in FIG. 1.

As shown in FIG. 1, the first polishing unit 3A is provided with a polishing table 30A, a top ring 31A, a polishing liquid supply nozzle 32A, a dresser 33A, and an atomizer 34A. A polishing pad 10 having a polishing surface is attached to the polishing table 30A. The top ring (holding section) 31A holds the semiconductor wafer and polishes the semiconductor wafer while pressing the semiconductor wafer against the polishing pad 10 on the polishing table 30A. The polishing liquid supply nozzle 32A supplies a polishing liquid or a dressing liquid (e.g., pure water) to the polishing pad 10. The dresser 33A performs dressing on the polishing surface of the polishing pad 10. The atomizer 34A atomizes a fluid in which a liquid (e.g., pure water) and a gas (e.g., nitrogen gas) are mixed or a liquid (e.g., pure water) and jets the fluid or liquid onto the polishing surface.

Similarly, the second polishing unit 3B is provided with a polishing table 30B to which the polishing pad 10 is attached, a top ring 31B, a polishing liquid supply nozzle 32B, a dresser 33B and an atomizer 34B. The third polishing unit 3C is provided with a polishing table 30C to which the polishing pad 10 is attached, a top ring 31C, a polishing liquid supply nozzle 32C, a dresser 33C and an atomizer 34C. The fourth polishing unit 3D is provided with a polishing table 30D to which the polishing pad 10 is attached, a top ring 31D, a polishing liquid supply nozzle 32D, a dresser 33D and an atomizer 34D.

The first polishing unit 3A, the second polishing unit 3B, the third polishing unit 3C and the fourth polishing unit 3D have identical configurations, and so the details of the polishing units will be described using the first polishing unit 3A as a target.

Figure 2:
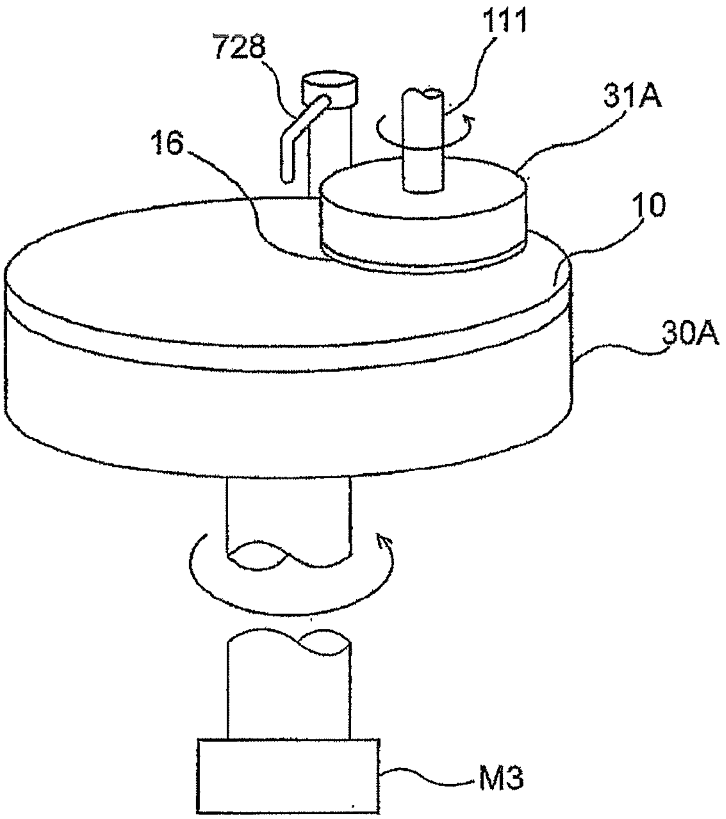
FIG. 2 is a perspective view schematically illustrating a first polishing unit.

FIG. 2 is a perspective view schematically illustrating the first polishing unit 3A. The top ring 31A is supported by a top ring shaft 111. The polishing pad 10 is pasted to the top surface of the polishing table 30A and the top surface of the polishing pad 10 constitutes a polishing surface for polishing a semiconductor wafer 16. Note that fixed abrasive grains may also be used instead of the polishing pad 10. The top ring 31A and the polishing table 30A are configured to rotate around the shaft center as shown by an arrow. The semiconductor wafer 16 is held to the undersurface of the top ring 31A by vacuum suction. During polishing, a polishing liquid is supplied from the polishing liquid supply nozzle 32A to the polishing surface of the polishing pad 10, and the semiconductor wafer 16 which is the polishable object is pressed against the polishing surface by the top ring 31A and is polished.

Figure 3:
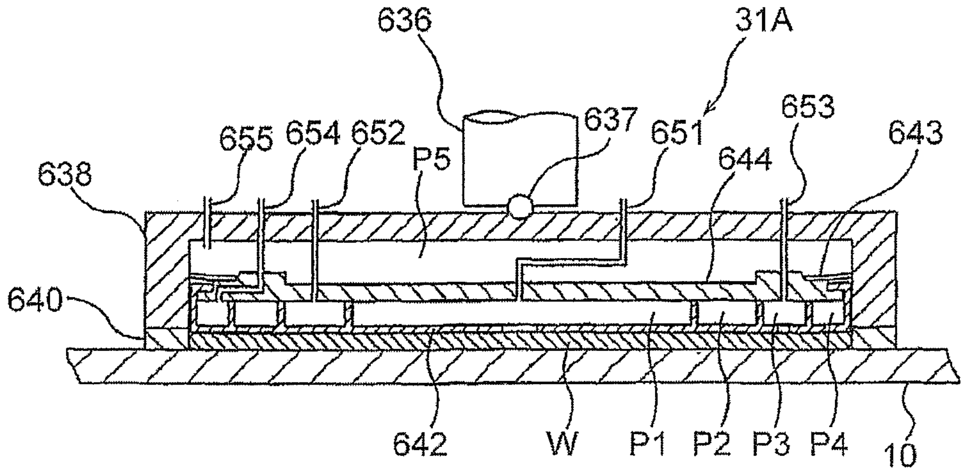
FIG. 3 is a cross-sectional view schematically illustrating a structure of a top ring.

FIG. 3 is a cross-sectional view schematically illustrating a structure of the top ring 31A. The top ring 31A is connected to a bottom end of the top ring shaft 111 via a universal joint 637. The universal joint 637 is a ball joint that transmits the rotation of the top ring shaft 111 to the top ring 31A while allowing mutual tilting of the top ring 31A and the top ring shaft 111. The top ring 31A is provided with a substantially disk-shaped top ring body 638 and a retainer ring 640 disposed below the top ring body 638. The top ring body 638 is formed of a material with high strength and rigidity such as metal or ceramics. The retainer ring 640 is formed of a resin material or ceramics with high rigidity. Note that the retainer ring 640 may be formed integrally with the top ring body 638.

A circular elastic pad 642 in contact with the semiconductor wafer 16, a ring-shaped pressuring sheet 643 made of an elastic film and a substantially disk-shaped chucking plate 644 for holding the elastic pad 642 are housed in a space formed inside the top ring body 638 and the retainer ring 640. An upper circumferential edge of the elastic pad 642 is held to the chucking plate 644, and four pressure chambers (airbags) P1, P2, P3 and P4 are provided between the elastic pad 642 and the chucking plate 644. The pressure chambers P1, P2, P3 and P4 are formed of the elastic pad 642 and the chucking plate 644. The pressure chambers P1, P2, P3 and P4 are respectively supplied with a pressurized fluid such as pressurized air or evacuated via fluid channels 651, 652, 653 and 654. The pressure chamber P1 in the center is circular and the pressure chambers P2, P3 and P4 are annular. The pressure chambers P1, P2, P3 and P4 are concentrically arranged.

Inner pressures of the pressure chambers P1, P2, P3 and P4 can be changed independently by a pressure adjusting section, which will be described later, and it is possible to thereby adjust pressing forces on four regions of the semiconductor wafer 16, that is, a central part, an inside intermediate part, an outside intermediate part and a peripheral edge independently. The retainer ring 640 can be pressed against the polishing pad 10 with a predetermined pressing force by causing the entire top ring 31A to ascend or descend. A pressure chamber P5 is formed between the chucking plate 644 and the top ring body 638, a pressurized fluid is supplied to the pressure chamber P5 or evacuated via a fluid channel 655. This allows the chucking plate 644 and the elastic pad 642 as a whole to move in the vertical direction.

The peripheral edge of the semiconductor wafer 16 is surrounded by the retainer ring 640 so that the semiconductor wafer 16 does not slip out of the top ring 31A during polishing. An opening (not shown) is formed in the region of the elastic pad 642 making up the pressure chamber P3, and by forming vacuum in the pressure chamber P3, the semiconductor wafer 16 is suctioned and held to the top ring 31A. Furthermore, by supplying a nitrogen gas, dry air, compressed air or the like to the pressure chamber P3, the semiconductor wafer 16 can be released from the top ring 31A.

Figure 4:
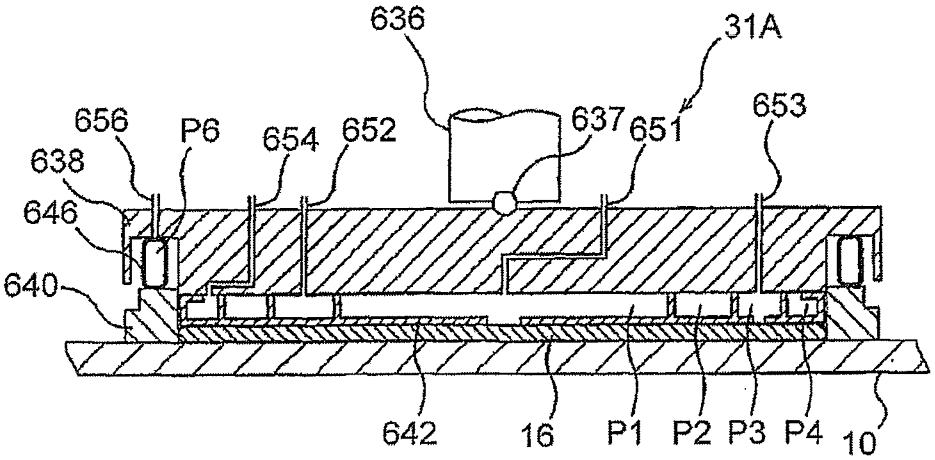
FIG. 4 is a cross-sectional view schematically illustrating another structure example of the top ring.

FIG. 4 is a cross-sectional view schematically illustrating another structure example of the top ring 31A. In this example, no chucking plate is provided and the elastic pad 642 is attached to an undersurface of the top ring body 638. No pressure chamber P5 is provided between the chucking plate and the top ring body 638, either. Instead, an elastic bag 646 is disposed between the retainer ring 640 and the top ring body 638, and a pressure chamber P6 is formed inside the elastic bag 646. The retainer ring 640 is designed to be movable relative to the top ring body 638 in the vertical direction. A fluid channel 656 communicates with the pressure chamber P6 and a pressurized fluid such as pressurized air is supplied to the pressure chamber P6 via the fluid channel 656. An inner pressure of the pressure chamber P6 can be adjusted by a pressure adjusting section, which will be described later. Therefore, it is possible to adjust the pressing force of the retainer ring 640 on the polishing pad 10 independently of the pressing force on the semiconductor wafer 16. Other components and operations are the same as the components of the top ring shown in FIG. 20. Either type of top ring in FIG. 20 or FIG. 21 can be used in the present embodiment.

FIG. 4 is a cross-sectional view for describing a mechanism for causing the top ring 31A to rotate and swing. The top ring shaft (e.g., spline shaft) 111 is rotatably supported by a top ring head 660. Furthermore, the top ring shaft 111 is connected to a rotation shaft of a motor M1 via pulleys 661 and 662, and a belt 663, and the motor M1 causes the top ring shaft 111 and the top ring 31A to rotate around a shaft center thereof. The motor M1 is attached above the top ring head 660. The top ring head 660 and the top ring shaft 111 are connected via an air cylinder 665 as a vertical drive source. Air (compressed gas) supplied to the air cylinder 665 causes the top ring shaft 111 and the top ring 31A to integrally move in the vertical direction. Note that a mechanism including a ball screw and a servo motor may also be used as the vertical drive source instead of the air cylinder 665.

The top ring head 660 is rotatably supported by a support shaft 667 via a bearing 672. The support shaft 667 is a fixed shaft and has a non-rotating structure. A motor M2 is installed in the top ring head 660, and relative positions of the top ring head 660 and the motor M2 are fixed. The rotation shaft of the motor M2 is connected to the support shaft 667 via a rotation transmission mechanism (gear or the like) which is not shown, and by causing the motor M2 to rotate, the top ring head 660 swings around the support shaft 667. Therefore, through swing motion of the top ring head 660, the top ring 31A supported at a distal end thereof moves between a polishing position above the polishing table 30A and a transfer position on a side of the polishing table 30A. Note that the swing mechanism for causing the top ring 31A to swing is constructed of the motor M2 in the present embodiment.

A through hole (not shown) extending in a longitudinal direction is formed inside the top ring shaft 111. The fluid channels 651, 652, 653, 654, 655 and 656 of the aforementioned top ring 31A pass through the through hole and are connected to a rotary joint 669 provided at a top end of the top ring shaft 111. A fluid such as a pressurized gas (clean air) or nitrogen gas is supplied to the top ring 31A via the rotary joint 669 and a gas is evacuated from the top ring 31A. A plurality of fluid pipes 670 communicating with the above-described fluid channels 651, 652, 653, 654, 655 and 656 (see FIG. 20 and FIG. 21) are connected to the rotary joint 669 and the fluid pipes 670 are connected to a pressure adjusting section 675. A fluid pipe 671 that supplies pressurized air to the air cylinder 665 is also connected to the pressure adjusting section 675.

The pressure adjusting section 675 includes an electropneumatic regulator that adjusts a pressure of the fluid supplied to the top ring 31A, pipes connected to the fluid pipes 670 and 671, air operation valves provided in these pipes, an electropneumatic regulator that adjusts a pressure of air which becomes an operation source of the air operation valves and an ejector that forms vacuum in the top ring 31A, and these components are congregated together to form one block (unit). The pressure adjusting section 675 is fixed to the upper part of the top ring head 660. The pressures of the pressurized gas supplied to the pressure chambers P1, P2, P3, P4 and P5 (see FIG. 20) of the top ring 31A and pressurized air supplied to the air cylinder 665 are adjusted by the electropneumatic regulator of the pressure adjusting section 675. Similarly, a vacuum is formed by an ejector of the pressure adjusting section 675 in the airbags P1, P2, P3 and P4 of the top ring 31A and the pressure chamber P5 between the chucking plate 644 and the top ring body 638.

Since the electropneumatic regulator which is a pressure adjusting device or a valve is installed near the top ring 31A in this way, controllability of the pressure in the top ring 31A is improved. More specifically, since the distances from the electropneumatic regulator to the pressure chambers P1, P2, P3, P4 and P5 are small, responsivity to a pressure change command from the control section 65 improves. Since the ejector which is a vacuum source is also installed near the top ring 31A, responsivity when a vacuum is formed in the top ring 31A improves likewise. Furthermore, it is possible to use a reverse side of the pressure adjusting section 675 as a pedestal for mounting electrical equipment and thereby eliminate the necessity for a mounting frame which is conventionally required.

The top ring head 660, the top ring 31A, the pressure adjusting section 675, the top ring shaft 111, the motor M1, the motor M2 and the air cylinder 665 are configured as one module (hereinafter referred to as a "top ring assembly"). That is, the top ring shaft 111, the motor M1, the motor M2, the pressure adjusting section 675 and the air cylinder 665 are attached to the top ring head 660. The top ring head 660 is configured to be removable from the support shaft 667. Therefore, by separating the top ring head 660 from the support shaft 667, it is possible to remove the top ring assembly from the substrate processing apparatus. Such a configuration can improve maintainability of the support shaft 667, the top ring head 660 or the like. For example, when an abnormal sound is generated from the bearing 672, the bearing 672 can be easily replaced and when replacing the motor M2 or the rotation transmission mechanism (reduction gear), adjacent devices need not be removed.

Figure 6:
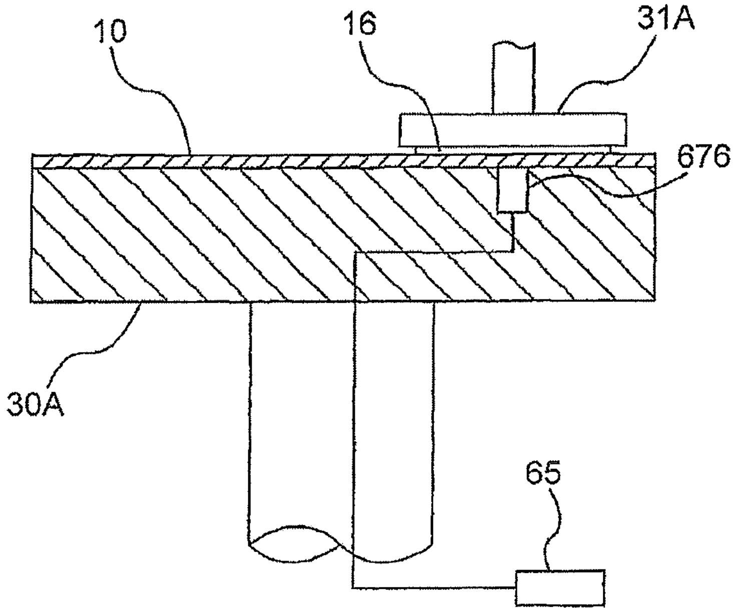
FIG. 6 is a cross-sectional view schematically illustrating an inner structure of a polishing table.

FIG. 6 is a cross-sectional view schematically illustrating an inner structure of the polishing table 30A. As shown in FIG. 6, a sensor 676 for detecting a state of the film of the semiconductor wafer 16 is embedded in the polishing table 30A. In this example, an eddy current sensor is used as the sensor 676. A signal of the sensor 676 is transmitted to the control section 65 and the control section 65 generates a monitoring signal indicating a film thickness. Although the value of the monitoring signal (and the sensor signal) does not indicate the film thickness itself, the value of the monitoring signal varies in accordance with the film thickness. Therefore, the monitoring signal can be said to be a signal indicating a film thickness of the semiconductor wafer 16.

The control section 65 determines inner pressures of the respective pressure chambers P1, P2, P3 and P4 based on the monitoring signal and issues a command to the pressure adjusting section 675 so that the determined inner pressures are formed in the respective pressure chambers P1, P2, P3 and P4. The control section 65 functions as a pressure control section that operates the inner pressures of the respective pressure chambers P1, P2, P3 and P4 and an end point detection section that detects a polishing end point based on the monitoring signal.

As in the case of the first polishing unit 3A, the sensor 676 is also provided in each polishing table of the second polishing unit 3B, the third polishing unit 3C and the fourth polishing unit 3D. The control section 65 generates a monitoring signal from signals sent from each sensor 676 of the respective polishing units 3A to 3D and monitors the progress of polishing of the semiconductor wafer in the respective polishing units 3A to 3D. When a plurality of semiconductor wafers are polished in the polishing units 3A to 3D, the control section 5 monitors the monitoring signal indicating the film thickness of the semiconductor wafer during polishing and controls the pressing forces of the top rings 31A to 31D based on the monitoring signals so that polishing times in the polishing units 3A to 3D become substantially identical. By adjusting the pressing forces of the top rings 31A to 31D during polishing based on the monitoring signals in this way, it is possible to level the polishing times in the polishing units 3A to 3D.

The semiconductor wafer 16 may be polished by any one of the first polishing unit 3A, the second polishing unit 3B, the third polishing unit 3C and the fourth polishing unit 3D or may be polished consecutively by a plurality of polishing units selected in advance from among the polishing units 3A to 3D. For example, the semiconductor wafer 16 may be polished in order of the first polishing unit 3A, and the second polishing unit 3B or may be polished in order of the third polishing unit 3C, and the fourth polishing unit 3D. Moreover, the semiconductor wafer 16 may be polished in order of the first polishing unit 3A, the second polishing unit 3B, the third polishing unit 3C, and the fourth polishing unit 3D. In all cases, it is possible to improve a throughput by leveling polishing times of all the polishing units 3A to 3D.

An eddy current sensor is preferably used when the film of the semiconductor wafer is a metal film. When the film of the semiconductor wafer is a film having a light transmissive property such as an oxide film, an optical sensor can be used as the sensor 76. Alternatively, a microwave sensor may be used as the sensor 676. A microwave sensor can also be used for both a metal film and a non-metal film. Hereinafter, examples of an optical sensor and a microwave sensor will be described.

Figure 7:
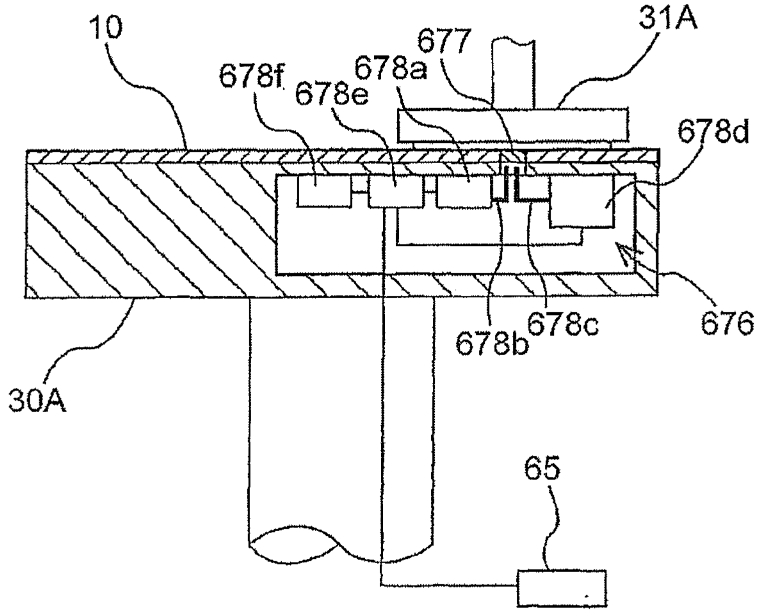
FIG. 7 is a schematic diagram illustrating a polishing table provided with an optical sensor.

FIG. 7 is a schematic view illustrating a polishing table provided with an optical sensor. As shown in FIG. 7, the optical sensor 676 for detecting a film state of the semiconductor wafer 16 is embedded in the polishing table 30A. The sensor 676 irradiates the semiconductor wafer 16 with light and detects the film state (film thickness or the like) of the semiconductor wafer 16 from the intensity (reflection intensity or reflection factor) of reflected light from the semiconductor wafer 16.

The polishing pad 10 is provided with a light transmitting section 677 for transmitting light from the sensor 676. The light transmitting section 677 is formed of a material with high transmittance such as non-foaming polyurethane. Alternatively, the light transmitting section 677 may also be configured by providing a through hole in the polishing pad 10 and causing a transparent liquid to flow from below while the through hole is closed by the semiconductor wafer 16. The light transmitting section 677 is disposed at a position corresponding to the center of the semiconductor wafer 16 held to the top ring 31A.

As shown in FIG. 7, the sensor 676 is provided with a light source 678*a*, a light-emitting optical fiber 678*b* as a light-emitting section that irradiates a polishable surface of the semiconductor wafer 16 with light from the light source 678*a*, a light-receiving optical fiber 678*c* as a light-receiving section that receives light reflected from the polishable surface, a spectroscope unit 678*d* that incorporates a spectroscope that disperses the light received by the light-receiving optical fiber 678*c* and a plurality of light-receiving devices that store the light dispersed by the spectroscope as electrical information, an operation control section 678*e* that controls lighting on/off of the light source 678*a* and read start timing or the like of the light-receiving device in the spectroscope unit 678*d*, and a power supply 678*f* that supplies power to the operation control section 678*e*. Note that power is supplied to the light source 678*a* and the spectroscope unit 678*d* via the operation control section 678*e*.

A light-emitting end of the light-emitting optical fiber 678*b* and a light-receiving end of the light-receiving optical fiber 678*c* are configured so as to be substantially perpendicular to the polishable surface of the semiconductor wafer 16. As the light-receiving device in the spectroscope unit 678*d*, for example, a photodiode array of 128 elements can be used. The spectroscope unit 678*d* is connected to the operation control section 678*e*. Information from the light-receiving device in the spectroscope unit 678*d* is sent to the operation control section 678*e* and spectral data of the reflected light is generated based on this information. That is, the operation control section 678*e* reads electrical information stored in the light-receiving device and generates spectral data of the reflected light. The spectral data indicates the intensity of the reflected light decomposed according to the wavelength and varies depending on the film thickness.

The operation control section 678*e* is connected to the aforementioned control section 65. The spectral data generated in the operation control section 678*e* is transmitted to the control section 65. The control section 65 calculates a characteristic value associated with the film thickness of the semiconductor wafer 16 based on the spectral data received from the operation control section 678*e* and uses the characteristic value as a monitoring signal.

Figure 8:
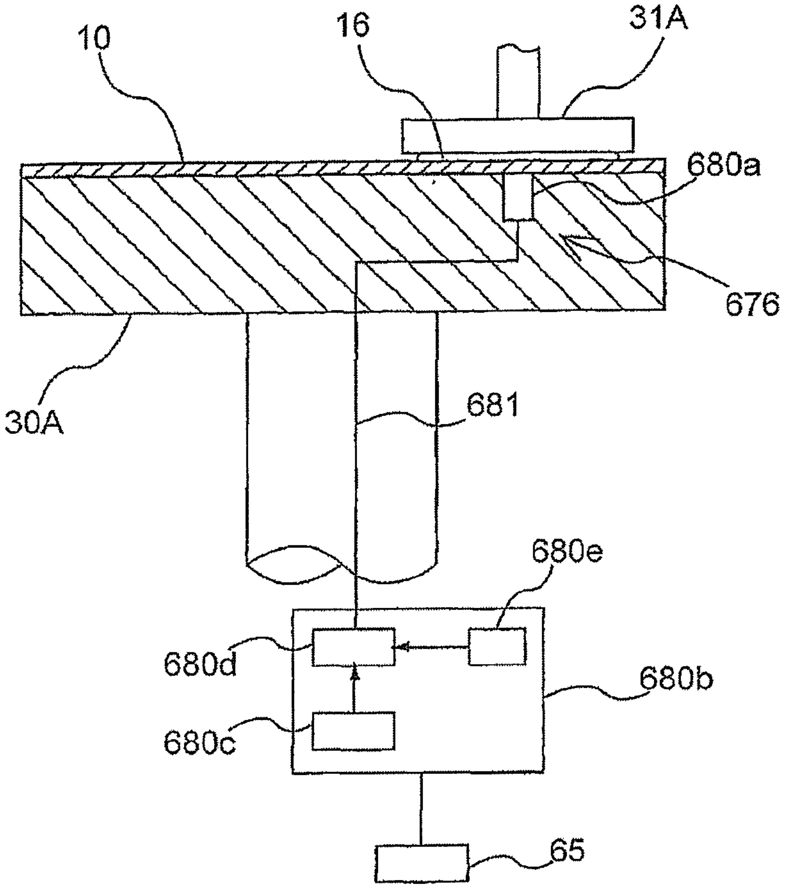
FIG. 8 is a schematic diagram illustrating the polishing table provided with a microwave sensor.

FIG. 8 is a schematic view illustrating the polishing table provided with a microwave sensor. The sensor 676 is provided with an antenna 680*a* that irradiates the polishable surface of the semiconductor wafer 16 with a microwave, a sensor body 680*b* that supplies microwave to the antenna 680*a*, and a waveguide 681 that connects the antenna 680*a* and the sensor body 680*b*. The antenna 680*a* is embedded in the polishing table 30A and is disposed opposed to the center position of the semiconductor wafer 16 held to the top ring 31A.

The sensor body 680*b* is provided with a microwave source 680*c* that generates a microwave and supplies the microwave to the antenna 680*a*, a separator 680*d* that separates the microwave (incident wave) generated from the microwave source 680*c* from the microwave (reflected wave) reflected from the surface of the semiconductor wafer 16 and a detection section 680*e* that receives the reflected wave separated by the separator 680*d* and detects the amplitude and the phase of the reflected wave. Note that a directional coupler is preferably used as the separator 680*d*.

The antenna 680*a* is connected to the separator 680*d* via the waveguide 681. The microwave source 680*c* is connected to the separator 680*d*, and a microwave generated by the microwave source 680*c* is supplied to the antenna 680*a* via the separator 680*d* and the waveguide 681. The microwave is radiated from the antenna 680*a* onto the semiconductor wafer 16, passes (penetrates) through the polishing pad 10 and reaches the semiconductor wafer 16. The reflected wave from the semiconductor wafer 16 passes through the polishing pad 10 again and is then received by the antenna 680*a*.

The reflected wave is sent from the antenna 680*a* to the separator 680*d* via the waveguide 681 and separated into an incident wave and a reflected wave by the separator 680*d*. The reflected wave separated by the separator 680*d* is transmitted to the detection section 680*e*. The detection section 680*e* detects the amplitude and the phase of the reflected wave. The amplitude of the reflected wave is detected as power (dbm or W) or a voltage (V) and the phase of the reflected wave is detected by a phase measuring instrument (not shown) incorporated in the detection section 680*e*. The amplitude and the phase of the reflected wave detected by the detection section 680*e* are sent to the control section 65, where the film thickness of a metal film or non-metal film or the like of the semiconductor wafer 16 is analyzed based on the amplitude and the phase of the reflected wave. The analyzed values are monitored by the control section 65 as monitoring signals.

Figure 9:
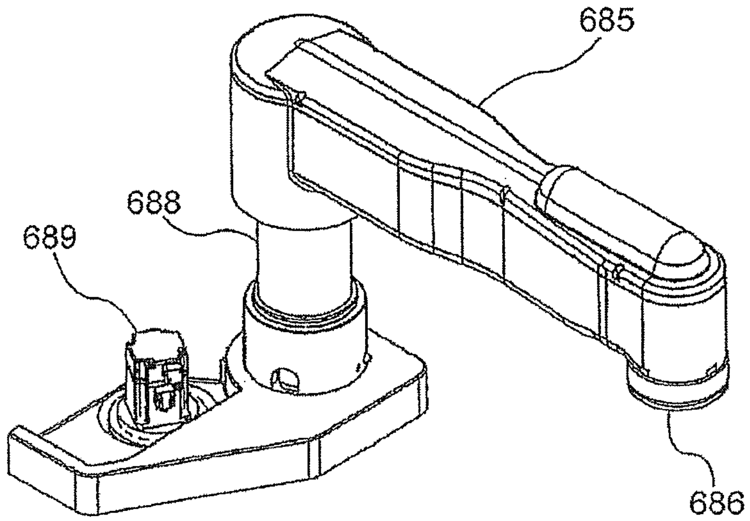
FIG. 9 is a perspective view illustrating a dresser.

FIG. 9 is a perspective view illustrating the dresser 33A usable as an embodiment of the present invention. As shown in FIG. 9, the dresser 33A is provided with a dresser arm 685, a dressing member 686 rotatably attached to a distal end of the dresser arm 685, a swing shaft 688 connected to the other end of the dresser arm 685 and a motor 689 as a drive mechanism that causes the dresser arm 685 to swing around the swing shaft 688. The dressing member 686 has a circular dressing surface and rigid grains are fixed to the dressing surface. Examples of the rigid grains include diamond grains and ceramic grains. The dresser arm 685 incorporates a motor which is not shown and the motor causes the dressing member 686 to rotate. The swing shaft 688 is connected to an ascending/descending mechanism which is not shown and the dresser arm 685 descends through the ascending/descending mechanism, whereby the dressing member 686 presses the polishing surface of the polishing pad 10.

Figure 10A:
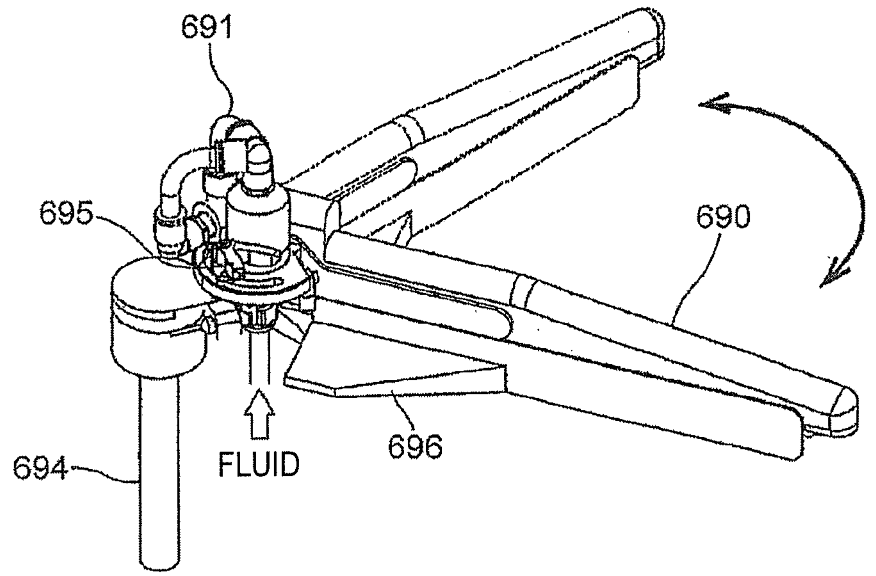
FIG. 10A is a perspective view illustrating an atomizer and FIG. 10B is a schematic diagram illustrating a bottom of an arm.
Figure 10B:
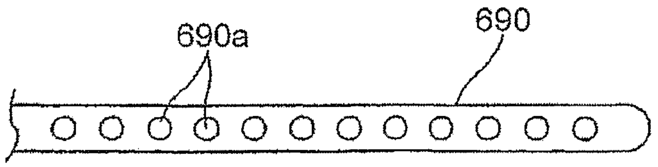

FIG. 10A is a perspective view illustrating the atomizer 34A. The atomizer 34A is provided with an arm 690 provided with one or a plurality of jet holes below, a fluid channel 691 connected to the arm 690 and a swing shaft 694 that supports the arm 690. FIG. 10B is a schematic view illustrating a lower part of the arm 690. In the example shown in FIG. 10B, a plurality of jet holes 690*a* are formed at equal intervals in the lower part of the arm 690. The fluid channel 691 can be made up of a tube or a pipe or a combination thereof.

Figure 11A:
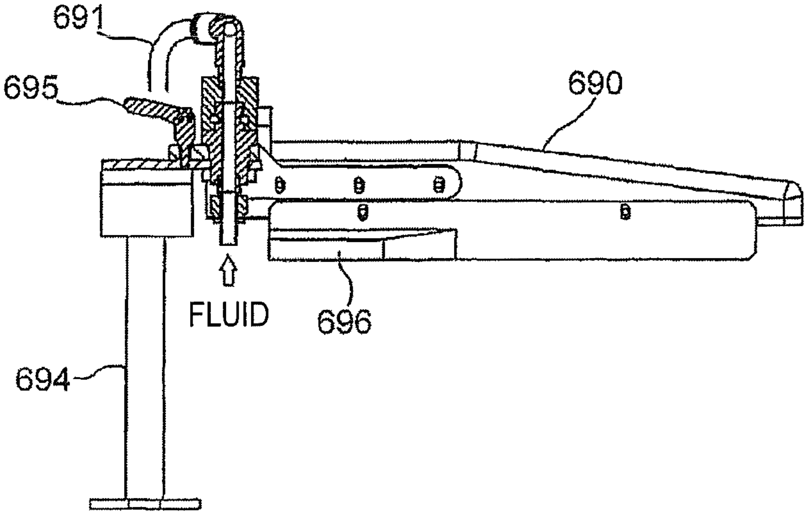
FIG. 11A is a side view illustrating an inner structure of the atomizer and FIG. 11B is a plan view illustrating the atomizer.
Figure 11B:
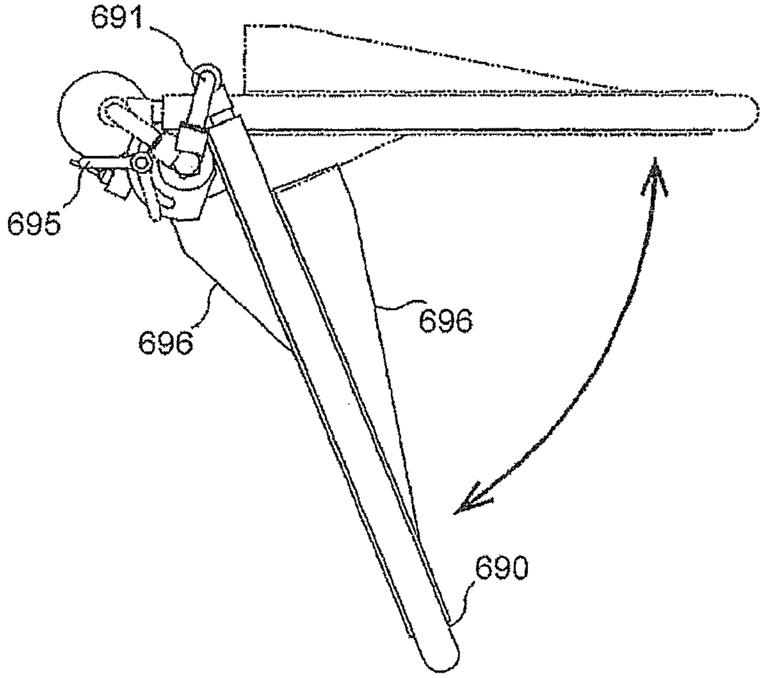

FIG. 11A is a side view illustrating an inner structure of the atomizer 34A and FIG. 11B is a plan view illustrating the atomizer 34A. An opening end portion of the fluid channel 691 is connected to a fluid supply pipe which is not shown and a fluid is supplied from the fluid supply pipe to the fluid channel 691. Examples of the fluid used include a liquid (e.g., pure water), or a fluid as a liquid and gas mixture (e.g., a fluid with a mixture of pure water and nitrogen gas). The fluid channel 691 communicates with the jet holes 690*a* of the arm 690 and the fluid is atomized and jetted out from the jet holes 690*a* onto the polishing surface of the polishing pad 10.

The arm 690 is turnable around the swing shaft 694 between a cleaning position and a retracted position as shown by dotted lines in FIG. 10A and FIG. 11B. A movable angle of the arm 690 is approximately 90°. The arm 690 is normally located at the cleaning position and disposed along the diameter direction of the polishing surface of the polishing pad 10 as shown in FIG. 1. During maintenance such as replacement of the polishing pad 10, the arm 690 is manually moved to the retracted position. Therefore, the arm 690 need not be removed during maintenance, and it is thereby possible to improve maintainability. Note that a rotation mechanism may be connected to the swing shaft 694 so that the rotation mechanism may cause the arm 690 to turn.

As shown in FIG. 11B, two reinforcement members 696, 696 having different shapes are provided on both sides of the arm 690. The reinforcement members 696, 696 provided in this way prevent, when the arm 690 is turned between the cleaning position and the retracted position, the shaft center of the arm 690 from shaking by a large margin and allows an atomizing operation to be effectively performed. The atomizer 34A is provided with a lever 695 for fixing the turning position of the arm 690 (angle range within which the arm 690 can turn). That is, it is possible to adjust the turnable angle of the arm 690 according to conditions by operating the lever 695. When the lever 695 is turned, the arm 690 can turn freely and the arm 690 can be manually moved between the cleaning position and the retracted position. When the lever 695 is tightened, the position of the arm 690 is fixed at either the cleaning position or the retracted position.

The arm 690 of the atomizer can have a foldable structure. More specifically, the arm 690 can be constructed of at least two arm members which are connected via a joint. In this case, an angle formed by the arm members when the arm 690 is folded is set to be equal to or greater than 1° and equal to or less than 45°, or preferably set to be equal to or greater than 5° and equal to or less than 30°. When the angle formed between the arm members is equal to or greater than 45°, the space occupied by the arm 690 increases, and on the other hand, when the angle formed between the arm members is less than 1°, the width of the arm 690 cannot help but be reduced and the mechanical strength is weakened. In this example, the arm 690 may be configured so as not to rotate around the swing shaft 694. By folding the arm 690 during maintenance such as replacement of the polishing pad 10, it is possible to prevent the atomizer from disturbing the maintenance operation. The arm 690 of the atomizer can have an expandable structure as another modification. In this example, if the arm 690 is contracted during maintenance, the atomizer never becomes a hindrance.

An object of providing the atomizer 34A is to wash away polishing waste or abrasive grains or the like remaining on the polishing surface of the polishing pad 10 using a high pressure fluid. It is possible to achieve more preferable dressing, that is, regeneration of the polishing surface through cleaning of the polishing surface using a fluid pressure of the atomizer 34A and dressing of the polishing surface using the dresser 33A which is a mechanical contact. Normally, the polishing surface is often regenerated using the atomizer after performing dressing using a contact type dresser (diamond dresser or the like).

Next, a transfer mechanism for conveying a semiconductor wafer will be described using FIG. 1. The transfer mechanism is provided with a lifter 11, a first linear transporter 66, a swing transporter 12, a second linear transporter 67 and a temporary placement table 180.

The lifter 11 receives a semiconductor wafer from the transfer robot 22. The first linear transporter 66 transfers the semiconductor wafer received from the lifter 11 between a first transfer position TP1, a second transfer position TP2, a third transfer position TP3 and a fourth transfer position TP4. The first polishing unit 3A and the second polishing unit 3B receive the semiconductor wafer from the first linear transporter 66 and polish it. The first polishing unit 3A and the second polishing unit 3B hand over the polished semiconductor wafer to the first linear transporter 66.

The swing transporter 12 transfers the semiconductor wafer between the first linear transporter 66 and the second linear transporter 67. The second linear transporter 67 transfers the semiconductor wafer received from the swing transporter 12 among a fifth transfer position TP5, a sixth transfer position TP6 and a seventh transfer position TP7. The third polishing unit 3C and the fourth polishing unit 3D receive the semiconductor wafer from the second linear transporter 67 and polish it. The third polishing unit 3C and the fourth polishing unit 3D hand over the polished semiconductor wafer to the second linear transporter 67. The semiconductor wafer polished by the polishing unit 3 is placed on the temporary placement table 180 by the swing transporter 12.

Figure 12A:
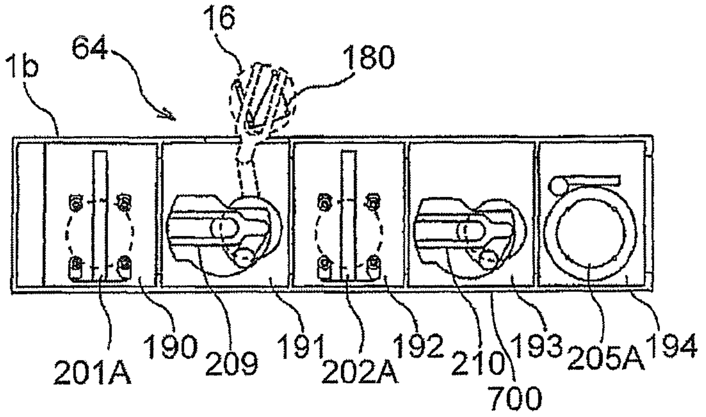
FIG. 12A is a plan view illustrating a cleaning section and FIG. 12B is a side view illustrating the cleaning section.
Figure 12B:
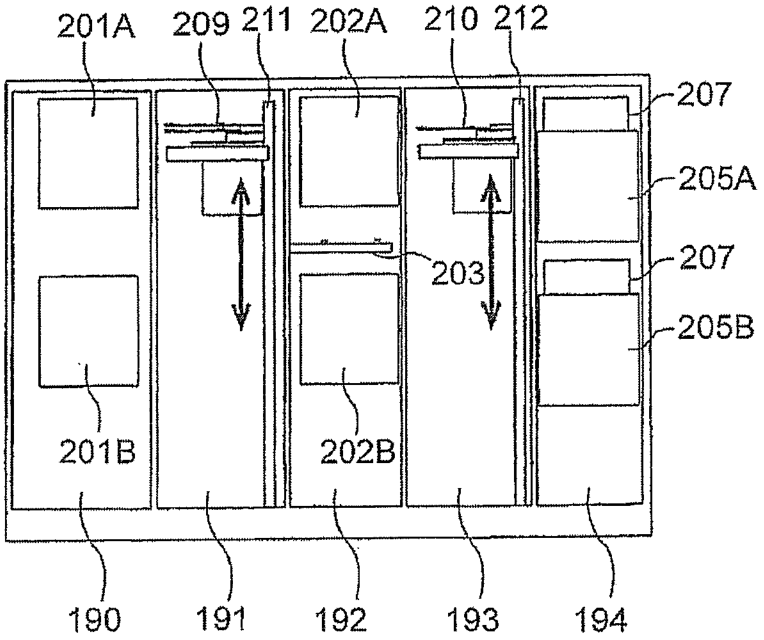

FIG. 12A is a plan view illustrating the cleaning section 64 and FIG. 12B is a side view illustrating the cleaning section 64. As shown in FIG. 12A and FIG. 12B, the cleaning section 64 is partitioned into a first cleaning chamber 190, a first transfer chamber 191, a second cleaning chamber 192, a second transfer chamber 193, and a drying chamber 194. An upper primary cleaning module 201A and a lower primary cleaning module 201B arrayed in a longitudinal direction are arranged in the first cleaning chamber 190. The upper primary cleaning module 201A is disposed above the lower primary cleaning module 201B. Similarly, an upper secondary cleaning module 202A and a lower secondary cleaning module 202B arrayed in the longitudinal direction are arranged in the second cleaning chamber 192. The upper secondary cleaning module 202A is disposed above the lower secondary cleaning module 202B. The primary and secondary cleaning modules 201A, 201B, 202A and 202B are cleaners for cleaning a semiconductor wafer using a cleaning liquid. Since the primary and secondary cleaning modules 201A, 201B, 202A and 202B are arrayed along the vertical direction, they provide an advantage that a footprint area is small.

A temporary semiconductor wafer placement table 203 is provided between the upper secondary cleaning module 202A and the lower secondary cleaning module 202B. In the drying chamber 194, an upper drying module 205A and a lower drying module 205B arrayed along the longitudinal direction are arranged. The upper drying module 205A and the lower drying module 205B are separated from each other. Filter fan units 207, 207 for supplying clean air to the drying modules 205A and 205B are provided on the upper drying module 205A and the lower drying module 205B respectively. The upper primary cleaning module 201A, the lower primary cleaning module 201B, the upper secondary cleaning module 202A, the lower secondary cleaning module 202B, the temporary placement table 203, the upper drying module 205A and the lower drying module 205B are fixed to a frame, which is not shown, via bolts or the like.

A vertically movable first transfer robot 209 is disposed in the first transfer chamber 191 and a vertically movable second transfer robot 210 is disposed in the second transfer chamber 193. The first transfer robot 209 and the second transfer robot 210 are movably supported respectively by support shafts 211 and 212 extending in the longitudinal direction. The first transfer robot 209 and the second transfer robot 210 incorporate a drive mechanism such as a motor therein and are vertically movable along the support shafts 211 and 212. As in the case of the transfer robot 22, the first transfer robot 209 includes two hands, upper and lower. The first transfer robot 209 is disposed at a position where the lower hand thereof can access the aforementioned temporary placement table 180 as shown by a dotted line in FIG. 12A. When the lower hand of the first transfer robot 209 accesses the temporary placement table 180, a shutter (not shown) provided in the barrier 1*b* is designed to be opened.

The first transfer robot 209 operates so as to transfer the semiconductor wafer 16 between the temporary placement table 180, the upper primary cleaning module 201A, the lower primary cleaning module 201B, the temporary placement table 203, the upper secondary cleaning module 202A and the lower secondary cleaning module 202B. The first transfer robot 209 uses the lower hand when transferring a semiconductor wafer before cleaning (semiconductor wafer to which slurry is adhered) and uses the upper hand when transferring a semiconductor wafer after cleaning. The second transfer robot 210 operates so as to transfer the semiconductor wafer 16 between the upper secondary cleaning module 202A, the lower secondary cleaning module 202B, the temporary placement table 203, the upper drying module 205A and the lower drying module 205B. The second transfer robot 210 is provided with only one hand because it transfers only a cleaned semiconductor wafer. Using the upper hand, the transfer robot 22 shown in FIG. 1 unloads a semiconductor wafer from the upper drying module 205A or the lower drying module 205B and returns the semiconductor wafer to the wafer cassette. When the upper hand of the transfer robot 22 accesses the drying modules 205A and 205B, a shutter (not shown) provided in the barrier 1*a* is designed to be opened.

Figure 13:
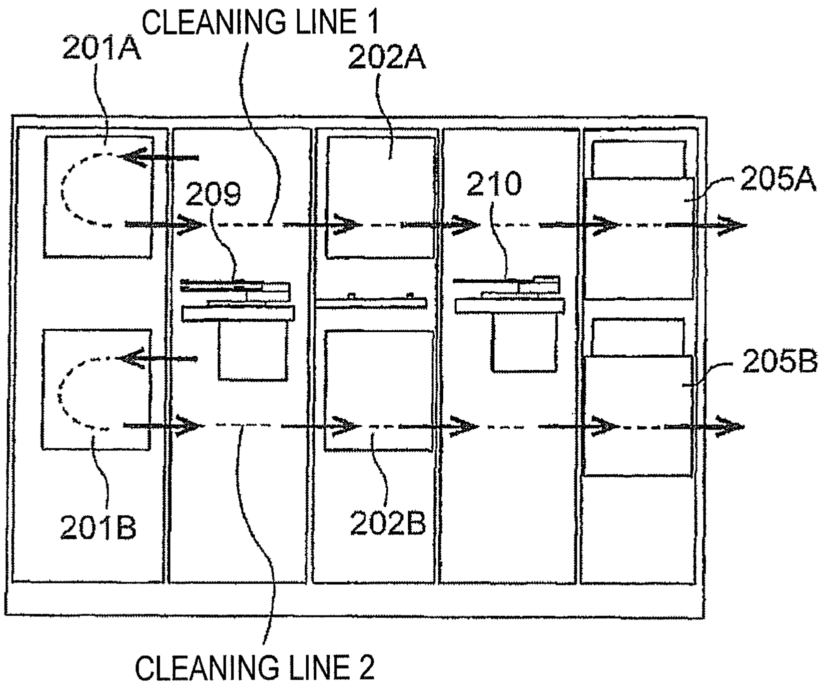
FIG. 13 is a schematic diagram illustrating an example of a cleaning line.

Since the cleaning section 64 is provided with the two primary cleaning modules and the two secondary cleaning modules, it is possible to form a plurality of cleaning lines whereby a plurality of semiconductor wafers are cleaned in parallel. The “cleaning line” means a moving path inside the cleaning section 64 when one semiconductor wafer is cleaned by a plurality of cleaning modules. For example, as shown in FIG. 13, it is possible to convey one semiconductor wafer in order of the first transfer robot 209, the upper primary cleaning module 201A, the first transfer robot 209, the upper secondary cleaning module 202A, the second transfer robot 210 and the upper drying module 205A (see a cleaning line 1), and convey another wafer in parallel to this, in order of the first transfer robot 209, the lower primary cleaning module 201B, the first transfer robot 209, the lower secondary cleaning module 202B, the second transfer robot 210 and the lower drying module 205B (see a cleaning line 2). Thus, it is possible to substantially simultaneously clean and dry a plurality of (typically two) semiconductor wafers using the two parallel cleaning lines.

Figure 14:
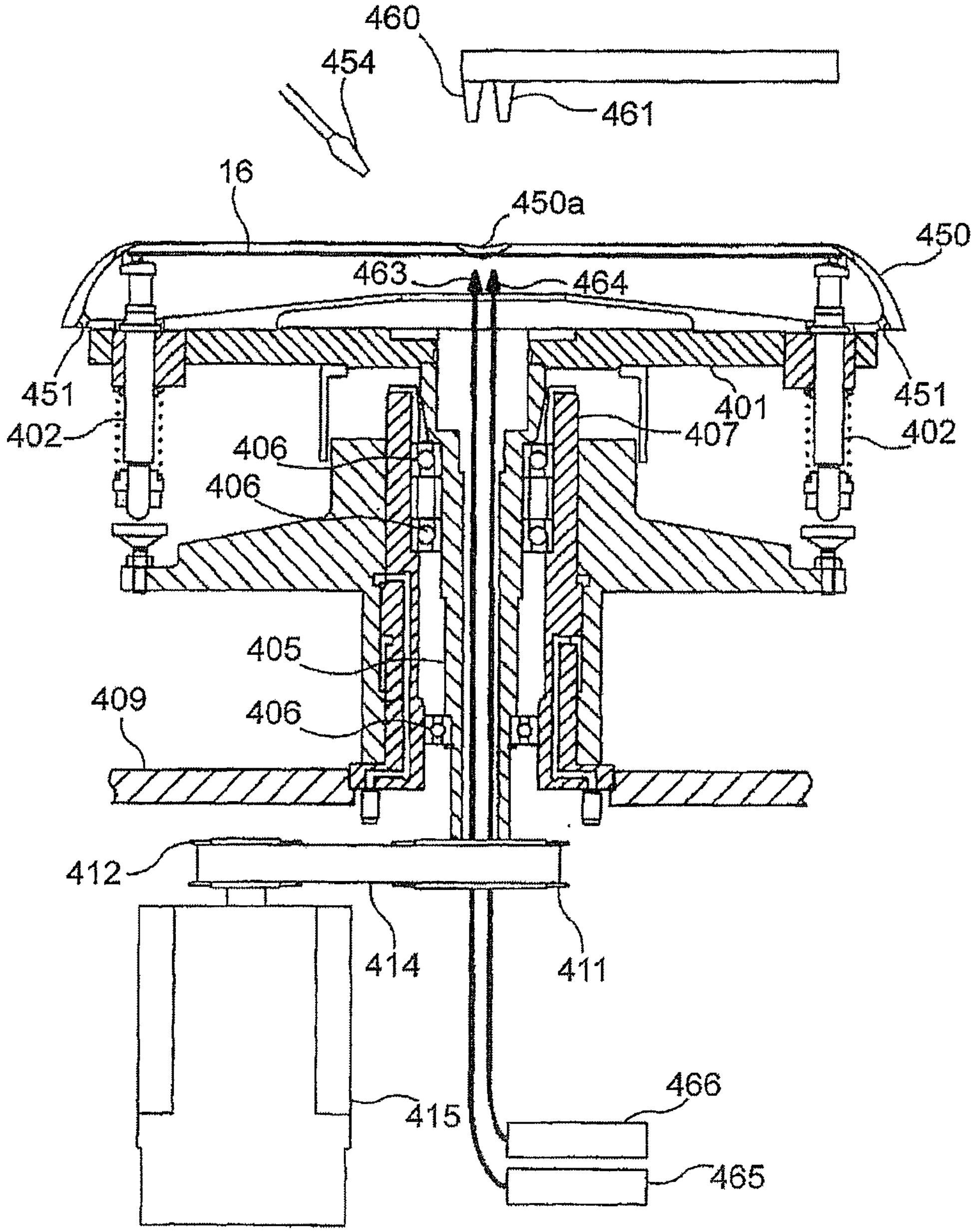
FIG. 14 is a longitudinal cross-sectional view illustrating an upper drying module.
Figure 15:
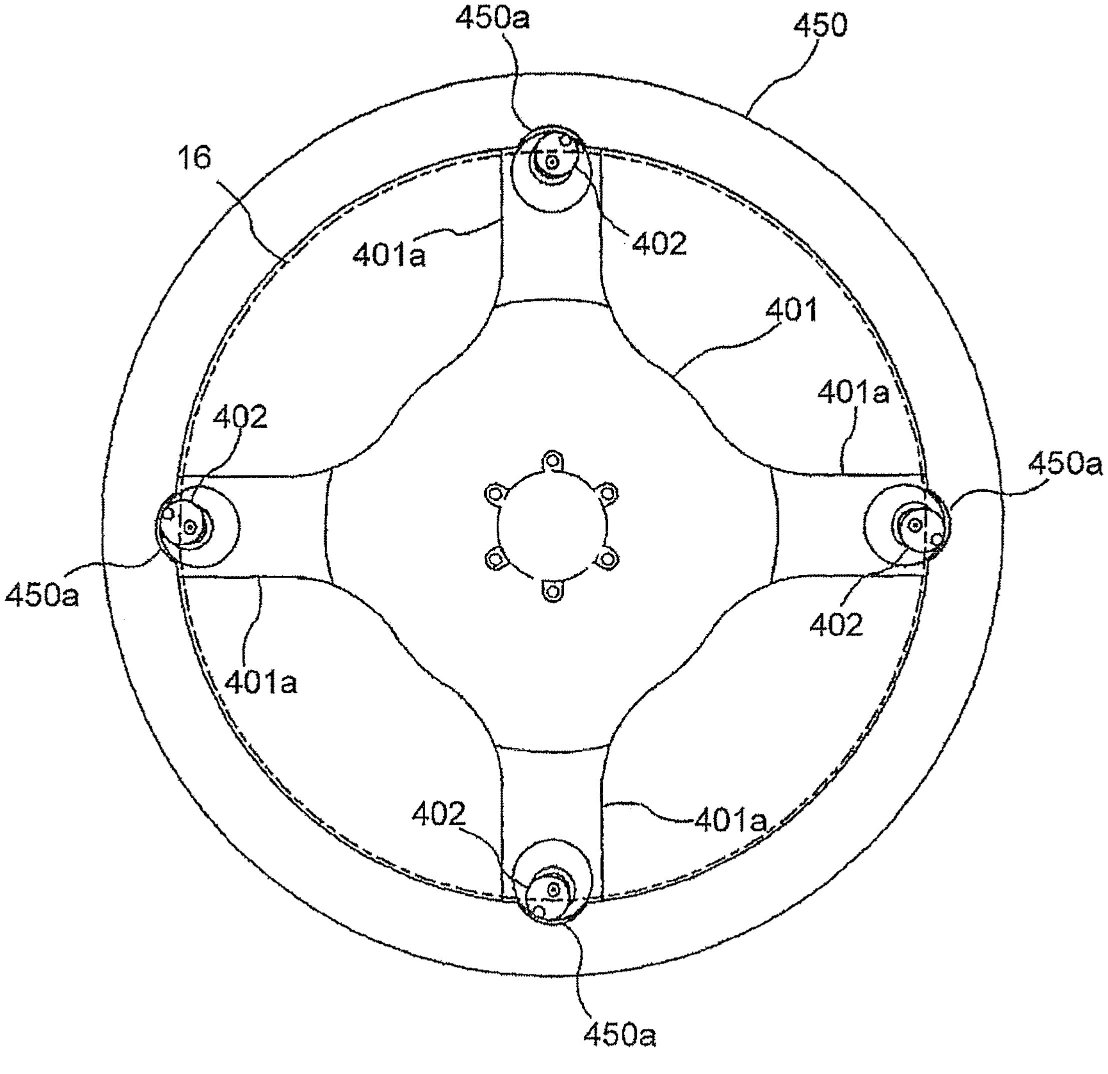
FIG. 15 is a plan view illustrating the upper drying module.

Next, configurations of the upper drying module 205A and the lower drying module 205B will be described. Both the upper drying module 205A and the lower drying module 205B are dryers that perform rotagoni drying. Since the upper drying module 205A and the lower drying module 205B have identical configurations, the upper drying module 205A will be described hereinafter. FIG. 14 is a longitudinal cross-sectional view illustrating the upper drying module 205A and FIG. 15 is a plan view illustrating the upper drying module 205A. The upper drying module 205A is provided with a base 401 and four cylindrical substrate support members 402 supported by the base 401. The base 401 is fixed to a top end of a rotation shaft 406 and the rotation shaft 406 is rotatably supported by a bearing 405. The bearing 405 is fixed to an inner circumferential surface of a cylindrical body 407 that extends parallel to the rotation shaft 406. A bottom end of the cylindrical body 407 is attached to a frame 409 and the position thereof is fixed. The rotation shaft 406 is connected to a motor 415 via pulleys 411 and 412, and a belt 414, and the base 401 is designed to rotate around its shaft center by driving the motor 415.

A rotation cover 450 is fixed to a top surface of the base 401. Note that FIG. 14 illustrates a longitudinal cross section of the rotation cover 450. The rotation cover 450 is disposed so as to surround a whole circumference of the semiconductor wafer 16. The longitudinal cross-sectional shape of the rotation cover 450 is inclined inward in the diameter direction. The longitudinal cross section of the rotation cover 450 is formed of a smooth curve. A top end of the rotation cover 450 is proximate to the semiconductor wafer 16 and an inner diameter of the top end of the rotation cover 450 is set to be slightly greater than the diameter of the semiconductor wafer 16. A notch 450*a* that follows an outer circumferential surface shape of the substrate support member 402 is formed at the top end of the rotation cover 450 so as to correspond to each substrate support member 402. A liquid discharge hole 451 which extends diagonally is formed in a bottom surface of the rotation cover 450.

A front nozzle 454 that supplies pure water as a cleaning liquid onto a surface (front surface) of the semiconductor wafer 16 is disposed above the semiconductor wafer 16. The front nozzle 454 is disposed oriented toward the center of the semiconductor wafer 16. The front nozzle 454 is connected to a pure water supply source (cleaning liquid supply source), which is not shown, and pure water is supplied to the center of the surface of the semiconductor wafer 16 through the front nozzle 454. As the cleaning liquid, a chemical liquid can also be used in addition to pure water. Two nozzles 460 and 461 are disposed in parallel above the semiconductor wafer 16 to execute rotagoni drying. The nozzle 460 is intended to supply IPA vapor (a mixture of isopropyl alcohol and $N_2$ gas) to the surface of the semiconductor wafer 16 and the nozzle 461 is intended to supply pure water to prevent the surface of the semiconductor wafer 16 from drying. The nozzles 460 and 461 are configured to be movable along the diameter direction of the semiconductor wafer 16.

A back nozzle 463 connected to a cleaning liquid supply source 465 and a gas nozzle 464 connected to a drying gas supply source 466 are disposed inside the rotation shaft 406. Pure water is stored in the cleaning liquid supply source 465 as a cleaning liquid and the pure water is designed to be supplied to the reverse side of the semiconductor wafer 16 through the back nozzle 463. An $N_2$ gas or dry air or the like is stored in the drying gas supply source 466 as a drying gas and the drying gas is supplied to the reverse side of the semiconductor wafer 16 through the gas nozzle 464.

Next, the supply of pure water from the front nozzle 454 is stopped, the front nozzle 454 is moved to a predetermined standby position away from the semiconductor wafer 16 and the two nozzles 460 and 461 are moved to working positions above the semiconductor wafer 16. The IPA vapor from the nozzle 460 and the pure water from the nozzle 461 are supplied onto the surface of the semiconductor wafer 16 while causing the semiconductor wafer 16 to rotate at a low speed of 30 to 150 $min^{-1}$. At this time, pure water is also supplied to the reverse side of the semiconductor wafer 16 from the back nozzle 463. The two nozzles 460 and 461 are simultaneously moved along the diameter direction of the semiconductor wafer 16. The surface (top surface) of the semiconductor wafer 16 is thereby dried.

After that, the two nozzles 460 and 461 are moved to the predetermined standby position and the supply of pure water from the back nozzle 463 is stopped. The semiconductor wafer 16 is caused to rotate at a high speed of 1000 to 1500 $min^{-1}$ to shake off pure water adhered to the reverse side of the semiconductor wafer 16. At this time, a drying gas from the gas nozzle 464 is sprayed over the reverse side of the semiconductor wafer 16. The reverse side of the semiconductor wafer 16 is dried in this way. The dried semiconductor wafer 16 is unloaded from the drying module 205A by the transfer robot 22 shown in FIG. 1 and returned to the wafer cassette. Thus, the wafer is subjected to a series of processes including polishing, cleaning and drying. The drying module 205A configured as described above can dry both sides of the semiconductor wafer 16 speedily and effectively, and can also accurately control the end time point of drying processing. Therefore, the processing time for drying processing never becomes a rate-determining step of the whole cleaning process. Since processing times on a plurality of aforementioned cleaning lines formed in the cleaning section 4 can be leveled, it is possible to improve the throughput of the entire process.

According to the present embodiment, when the semiconductor wafer is transferred (before loading) to the polishing apparatus, the semiconductor wafer is in a dried state, and after completion of polishing and cleaning, the semiconductor wafer is in a dried state before unloading and unloaded to the substrate cassette. The semiconductor wafer in a dried state can be unloaded from the polishing apparatus into the cassette. That is, dry in/dry out is possible.

The semiconductor wafer placed on the temporary placement table 180 is transferred to the first cleaning chamber 190 or the second cleaning chamber 192 via the first transfer chamber 191. The semiconductor wafer is subjected to cleaning processing in the first cleaning chamber 190 or the second cleaning chamber 192. The semiconductor wafer subjected to the cleaning processing in the first cleaning chamber 190 or the second cleaning chamber 192 is transferred to the drying chamber 194 via the second transfer chamber 193. The semiconductor wafer is subjected to drying processing in the drying chamber 194. The semiconductor wafer subjected to the drying processing is unloaded from the drying chamber 194 and returned to the cassette by the transfer robot 22.

Figure 16:
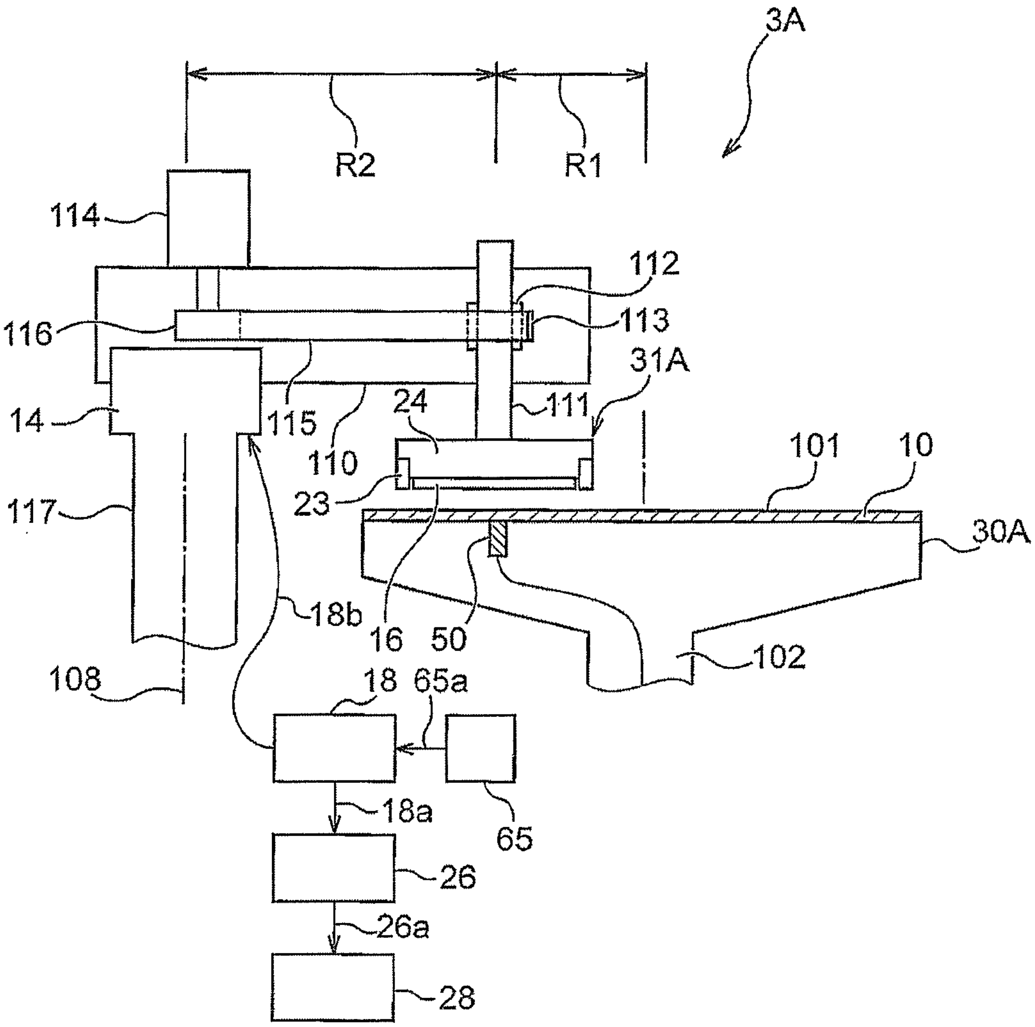
FIG. 16 is a schematic diagram illustrating an overall configuration of a polishing apparatus according to an embodiment of the present invention.

FIG. 16 is a schematic diagram illustrating a whole arrangement of a polishing unit (polishing apparatus) according to an embodiment of the present invention. As shown in FIG. 16, the polishing apparatus is provided with the polishing table 30A and the top ring 31A (holding section) that holds a substrate such as a semiconductor wafer, which is a polishable object, and presses the substrate against the polishing surface on the polishing table.

The first polishing unit 3A is a polishing unit for polishing between the polishing pad 10 and the semiconductor wafer 16 disposed opposed to the polishing pad 10. The first polishing unit 3A includes the polishing table 30A for holding the polishing pad 10 and the top ring 31A for holding the semiconductor wafer 16. The first polishing unit 3A includes the swing arm 110 for holding the top ring 31A, a swing shaft motor 14 for causing the swing arm 110 to swing and a driver 18 that supplies drive power to the swing shaft motor 14. Furthermore, the first polishing unit 3A includes an arm torque detection section 26 that detects arm torque applied to the swing arm 110 and an end point detection section 28 that detects a polishing end point indicating an end of polishing based on the arm torque 26*a* detected by the arm torque detection section 26. The end point detection section 28 detects a polishing end point indicating an end of polishing using at least one of the output of the arm torque detection section 26 and the output of a current detection section 810 which will be described later.

According to the present embodiment described with reference to FIG. 16 to FIG. 37, in the scheme in which the top ring is held at the end portion of the swing arm, it is possible to improve the accuracy of polishing end point detection. As the polishing end point detection means, a method based on arm torque and a method of detecting and using a drive load of the drive section that drives to rotate the polishing table or the top ring are possible in the present embodiment. A scheme will be described in the present embodiment in which the top ring is held at an end portion of the swing arm and a polishing end point is detected based on the arm torque, and it is likewise possible to detect a polishing end point by detecting a drive load of the drive section that drives to rotate the polishing table or the top ring.

The holding section, the swing arm, the arm drive section and the torque detection section form a set and sets of the same configuration are provided in the first polishing unit 3A, the second polishing unit 3B, the third polishing unit 3C and the fourth polishing unit 3D respectively.

The polishing table 30A is connected to a motor M3 (see FIG. 2), which is a drive section, disposed therebelow via a table shaft 102 and is rotatable around the table shaft 102. The polishing pad 10 is pasted to the top surface of the polishing table 30A and a surface 101 of the polishing pad 10 constitutes a polishing surface for polishing the semiconductor wafer 16. A polishing liquid supply nozzle (not shown) is provided above the polishing table 30A and the polishing liquid supply nozzle supplies a polishing liquid Q to the polishing pad 10 on the polishing table 30A. As shown in FIG. 16, an eddy current sensor 50 that can detect a polishing end point by generating an eddy current in the semiconductor wafer 16 and detecting the eddy current may be embedded in the polishing table 30A.

The top ring 31A is constructed of a top ring body 24 that presses the semiconductor wafer 16 against the polishing surface 101 and a retainer ring 23 that holds an outer circumferential edge of the semiconductor wafer 16 so that the semiconductor wafer 16 does not slip out of the top ring.

The top ring 31A is connected to a top ring shaft 111. The top ring shaft 111 is caused by a vertical motion mechanism, which is not shown, to move in the vertical direction relative to the swing arm 110. The vertical motion of the top ring shaft 111 causes the entire top ring 31A to ascend or descend and causes it to be positioned relative to the swing arm 110.

The top ring shaft 111 is connected to a rotary cylinder 112 via a key (not shown). The rotary cylinder 112 is provided with a timing pulley 113 on its circumferential portion. A top ring motor 114 is fixed to the swing arm 110. The timing pulley 113 is connected to a timing pulley 116 provided for the top ring motor 114 via a timing belt 115. As the top ring motor 114 rotates, the rotary cylinder 112 and the top ring shaft 111 integrally rotate via the timing pulley 116, the timing belt 115 and the timing pulley 113, and the top ring 31A rotates.

The swing arm 110 is connected to the rotation shaft of the swing shaft motor 14. The swing shaft motor 14 is fixed to a swing arm shaft 117. Therefore, the swing arm 110 is rotatably supported by the swing arm shaft 117.

The top ring 31A can hold a substrate such as the semiconductor wafer 16 to an undersurface thereof. The swing arm 110 can turn around the swing arm shaft 117. The top ring 31A that holds the semiconductor wafer 16 to its undersurface is moved from a position at which it receives the semiconductor wafer 16 to a position above the polishing table 30A as the swing arm 110 turns. The top ring 31A is caused to descend to press the semiconductor wafer 16 against the surface (polishing surface) 101 of the polishing pad 10. At this time, the top ring 31A and the polishing table 30A are caused to rotate respectively. At the same time, a polishing liquid is supplied onto the polishing pad 10 from the polishing liquid supply nozzle provided above the polishing table 30A. In this way, the surface of the semiconductor wafer 16 is polished by causing the semiconductor wafer 16 to slide on the polishing surface 101 of the polishing pad 10.

The first polishing unit 3A includes a table drive section (not shown) that drives to rotate the polishing table 30A. The first polishing unit 3A may include a table torque detection section (not shown) that detects table torque applied to the polishing table 30A. The table torque detection section can detect table torque from the current of the table drive section, which is a rotation motor. The end point detection section 28 may detect a polishing end point indicating an end of polishing only from the arm torque 26*a* detected by the arm torque detection section 26 or may detect a polishing end point indicating an end of polishing by taking into account the table torque detected by the table torque detection section as well.

The arm torque detection section 26 detects arm torque 26*a* applied to the swing arm 110 at the connection part of the swing arm 110 to the swing shaft motor 14 in FIG. 16. More specifically, the arm drive section is the swing shaft motor (rotation motor) 14 that causes the swing arm 110 to rotate and the arm torque detection section 26 detects the arm torque 26*a* applied to the swing arm 110 from the current value of the swing shaft motor 14. The current value of the swing shaft motor 14 is an amount that depends on arm torque at the connection part of the swing arm 110 to the swing shaft motor 14. The current value of the swing shaft motor 14 is a current value 18*b* supplied from the driver 18 to the swing shaft motor 14 in the present embodiment.

A method of detecting the arm torque 26*a* by the arm torque detection section 26 will be described using FIG. 17. The driver 18 receives a position command 65*a* relating to the position of the swing arm 110 from the control section 65. The position command 65*a* is data corresponding to an angle of rotation of the swing arm 110 with respect to the swing arm shaft 117. The driver 18 also receives an angle of rotation 36*a* of the swing arm shaft 117 from an encoder 36 incorporated in and attached to the swing shaft motor 14.

The encoder 36 can detect the angle of rotation 36*a* of the rotation shaft of the swing shaft motor 14, that is, the angle of rotation 36*a* of the swing arm shaft 117. Although the swing shaft motor 14 and the encoder 36 are illustrated independently of each other in FIG. 17, the swing shaft motor 14 and the encoder 36 are integrated together. An example of such an integrated motor is a synchronization type AC servo motor with a feedback encoder.

The driver 18 includes a deviation circuit 38, a current generation circuit 40 and a PWM circuit 42. The deviation circuit 38 obtains a deviation 38*a* between the position command 65*a* and the angle of rotation 36*a* from the position command 65*a* and the angle of rotation 36*a*. The deviation 38*a* and the current value 18*b* are inputted to the current generation circuit 40. The current generation circuit 40 generates a current command 18*a* corresponding to the deviation 38*a* from the deviation 38*a* and the present current value 18*b*. The PWM circuit 42 receives the current command 18*a* and generates the current value 18*b* under PWM (pulse width modulation) control. The current value 18*b* is a three-phase (U-phase, V-phase, and W-phase) current capable of driving the swing shaft motor 14. The current value 18*b* is supplied to the swing shaft motor 14.

The current command 18*a* is an amount that depends on the current value of the swing shaft motor 14 and an amount that depends on arm torque. The arm torque detection section 26 applies processing such as at least one of AD conversion, amplification, rectification and effective value conversion to the current command 18*a*, and then outputs the processed current command to the end point detection section 28 as the arm torque 26*a*.

The current value 18*b* is a current value of the swing shaft motor 14 itself and is also a value that depends on arm torque. The arm torque detection section 26 may detect arm torque 26*a* applied to the swing arm 110 from the current value 18*b*. The arm torque detection section 26 can use a current sensor such as a Hall sensor to detect the current value 18*b*.

Figure 5:
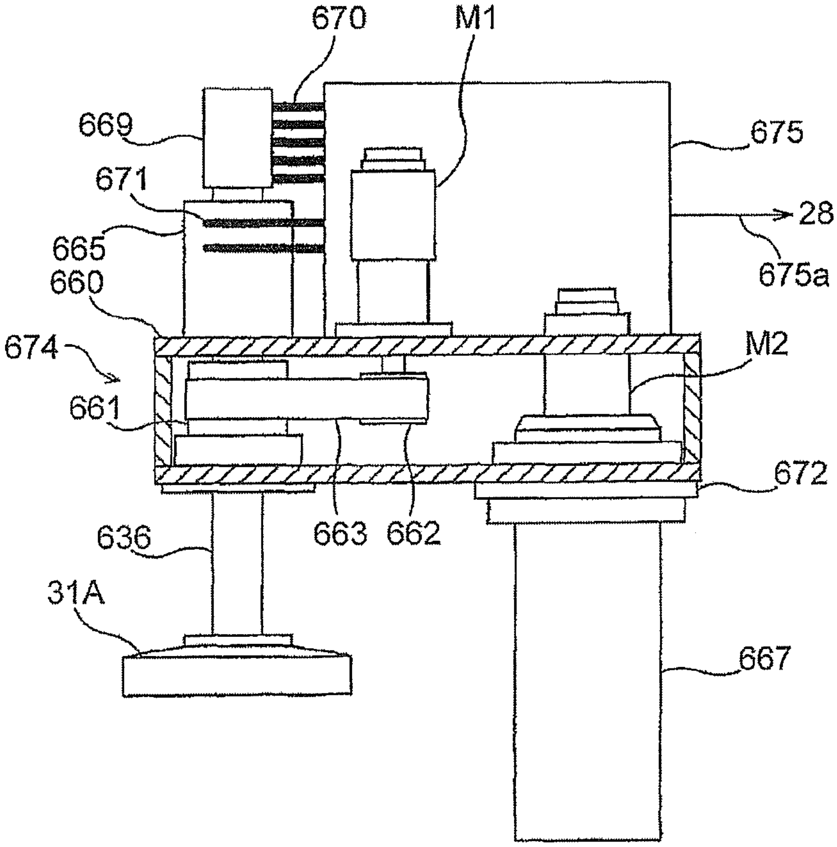
FIG. 5 is a cross-sectional view for describing a mechanism for causing the top ring to rotate and swing.
Figure 17:
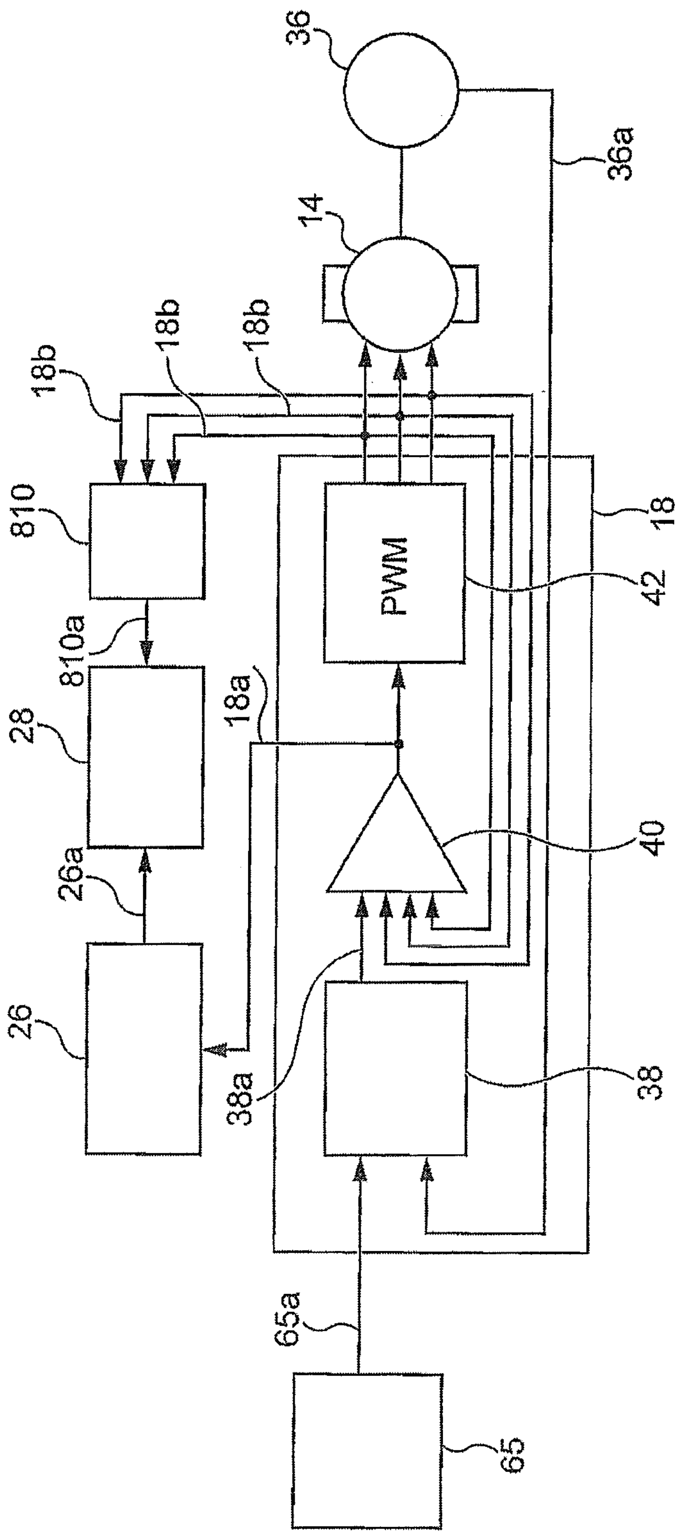
FIG. 17 is a block diagram for describing an arm torque detection method by an arm torque detection section.

With reference to FIG. 17, a description is given about a method of detecting a motor current by a current detection section 810 (detection section) that detects a current value of one electric motor among a motor M3 (first electric motor, see FIG. 2) for driving to rotate the polishing table, a motor M1 (second electric motor, see FIG. 5) for driving to rotate the top ring 31A and a motor M2 (third electric motor, see FIG. 5) for swinging the swing arm, and generates a first output. In the present embodiment, the current detection section 810 detects a current value of the motor M2 and generates a first output 810*a*. A three-phase (U-phase, V-phase and W-phase) current value 18*b* is inputted to the current detection section 810.

The current detection section 810 samples the U-phase, V-phase and W-phase current values 18*b* respectively, for example, every 10 msec and obtains moving average of 100 msec for the sampled current values 18*b* respectively. An object of obtaining moving average is noise reduction. After that, the U-phase, V-phase and W-phase current values 18*b* are subjected to full-wave rectification and effective values are then obtained through effective value conversion respectively. After calculating the effective values, the three values are added up to generate a first output 810*a*. The current detection section 810 outputs the generated first output 810*a* to the end point detection section 28.

Note that noise reduction processing is not limited to the aforementioned moving average processing, but various kinds of noise reduction processing are possible. The current detection section 810 may also carry out processing other than effective value calculation on the current values 18*b*. For example, after calculating respective absolute values of the current values 18*b*, these three values may be added up to generate the first output 810*a*. Furthermore, the current detection section 810 may also generate the sum of squares of the absolute values of three-phase current values of the electric motor as a first output. The current detection section 810 may also calculate an effective value for only one phase or two phases of the three U-phase, V-phase and W-phase current values 18*b*. The first output can take any given amount as long as it is an amount that can represent a torque change.

The end point detection section 28 that detects a polishing end point indicating an end of polishing based on the first output is a change detection section that causes the semiconductor wafer 16 (polishable object) to swing around a swing center 108 on a swing arm 110, increases a change amount of the first output while polishing the semiconductor wafer 16 and detects a change of the frictional force between the polishing pad 10 and the semiconductor wafer 16. The end point detection section 28 detects a polishing end point indicating an end of polishing from the change of the frictional force.

Figure 18:
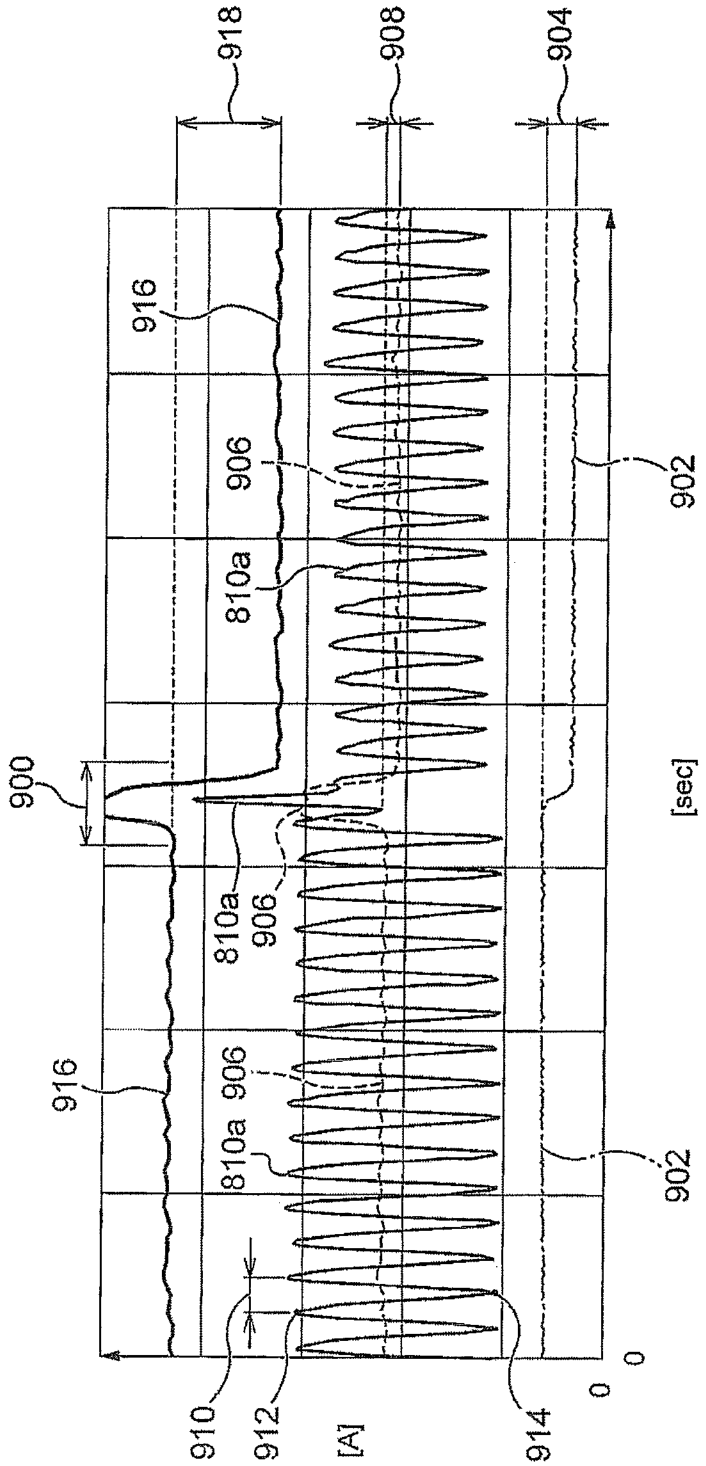
FIG. 18 is a diagram illustrating an example of a first output generated by the current detection section.

The first output is synchronized with the swing motion of the swing arm 110. Furthermore, the first output is synchronized with a fluctuation of arm torque added to the swing arm 110 regarding to the swing center 108. Hereinafter, this will be described with reference to FIG. 18. FIG. 18 illustrates a specific example of the first output 810*a* generated by the current detection section 810. The horizontal axis represents time (seconds) and the vertical axis represents a current (amperes). FIG. 18 illustrates the first output 810*a* before and after a region 900 where the frictional force changes after polishing starts. The region 900 corresponds to the polishing end point indicating an end of polishing in the present embodiment.

Note that in the case of FIG. 18, the polishing end point coincides with a time point at which the amplitude of a curve 906 temporarily increases, but the behavior of the amplitude of the curve 906 at the polishing end point includes various types. For example, in the case where when the amplitude of the curve 906 gradually increases and exceeds a predetermined value is a polishing end point or when the amplitude of the curve 906 gradually decreases and the amplitude falls below a predetermined value, is a polishing end point.

FIG. 18 also shows an output 902 of the current detection section 810 when polishing is performed without causing the swing arm 110 to swing. The first output 810*a* is a waveform similar to a sine wave. Unlike the first output 810*a*, the output 902 has an almost constant value. The output 902 changes in magnitude before and after the region 900. For example, the curve 906 obtained by moving-averaging the first output 810*a* for several seconds is a substantially constant value. The curve 906 also changes in magnitude before and after the region 900. When a difference 908 in magnitude of the curve 906 before and after the region 900 is compared with a difference 904 in magnitude of the output 902 before and after the region 900, the difference 904 is relatively larger.

For this reason, when polishing is performed without causing the swing arm 110 to swing, it is possible to detect an end of polishing directly from the output 902 of the current detection section 810. On the other hand, when polishing is performed by causing the swing arm 110 to swing, it may be difficult to detect an end of polishing directly from the first output 810*a* of the current detection section 810 as shown in FIG. 18. In the present embodiment, in such a case, the change amount of the first output 810*a* is increased as will be described later and a change of the frictional force between the polishing pad 10 and the semiconductor wafer 16 is detected.

Note that the reason that the first output 810*a* has a waveform similar to a sine wave is as follows. The first output 810*a* has a cycle 910 including a maximum value 912 and a minimum value 914. The swing arm 110 swings on a predetermined track, repeating reciprocal motion. When the maximum value 912 is taken, the swing arm 110 is located at an outermost part of the polishing table 30A on the predetermined track. At this time, the rotation speed of the polishing table 30A is fastest on the predetermined track and the frictional force between the polishing pad 10 and the semiconductor wafer 16 is considered to be a maximum. On the other hand, when the minimum value 914 is taken, the swing arm 110 is located closest to the center of the polishing table 30A on the predetermined track. At this time, the rotation speed of the polishing table 30A is slowest on the predetermined track and the frictional force between the polishing pad 10 and the semiconductor wafer 16 is considered to be a minimum.

Next, an overview of the method for increasing the change amount of the first output 810*a* according to the present embodiment will be described. In order to increase the change amount, the first output 810*a* is multiplied by a predetermined coefficient A and the multiplication result (hereinafter, referred to as an "offset value") is added to the first output 810*a*. That is, the first output 810*a* is multiplied (1+A) times. The value of the coefficient A is preferably "1" or greater. The value obtained by multiplying the first output 810*a* (1+A) times is averaged. FIG. 18 shows a curve 916 obtained by the averaging. When a difference 918 in magnitude before and after the region 900 is compared with the difference 908, the difference 918 is considerably larger.

The end point detection section 28 performs the aforementioned processing with the first output 810*a* inputted. This processing in the end point detection section 28 will be described in detail using FIG. 19. When polishing is started, the end point detection section 28 acquires the first output 810*a* from the current detection section 810 (step S10). The end point detection section 28 searches for to what count of swing cycle the present time point corresponds from the first output 810*a* this time and the past first outputs 810*a* stored in the end point detection section 28 (step S12). An object of searching for a swing cycle is not to use the first output 810*a* because the polishing condition is not stable in the first swing cycle. Regarding the search for a swing cycle, the swing cycle is detected by detecting peak values (maximum value 912 or minimum value 914) in the first output 810*a* and thereby setting the interval between peak values as one cycle.

The end point detection section 28 determines to what count of swing cycle the detected swing cycle corresponds (step S14). When the swing cycle is a first time, the flow returns to step S10, the first output 810*a* is acquired from the current detection section 810. When the swing cycle corresponds to a second or later one, the end point detection section 28 determines whether or not the first output 810*a* is within an effective period (step S16). The effective period means a time period when a predetermined period has passed after polishing starts. The effective period is provided so as not to use the first output 810*a* because the polishing condition is not stable for a predetermined period after the polishing starts. The effective period is set to be longer than the swing cycle. Double determination including the determination of the effective period and a determination that the swing cycle is a second or later one is made so as to prevent erroneous determination regarding whether or not the polishing condition is stable.

When a period is not the effective period, the flow returns to step S10 and the first output 810*a* is acquired from the current detection section 810. When the period is the effective period, the amplitude of the first output 810*a* is calculated (step S18). The amplitude is calculated by determining a difference from the latest (immediately preceding) minimum value 914. That is, when the minimum value 914 is detected, a difference between the immediately preceding minimum value 914 and the first output 810*a* is obtained until the next minimum value 914 is detected. The minimum value 914 is detected by comparing the first outputs 810*a* before and after. For example, the three latest first outputs 810*a* are compared and when the second value is smaller than the first value and third value, the second value is determined as the minimum value 914.

Note that when a comparison is made among only the three latest first outputs 810*a*, wrong determinations may be made due to noise. As a countermeasure, after determining that the second value is the minimum value 914, it is determined whether or not the maximum value 912 appears for several subsequent measured values. This is because when the maximum value 912 appears for the several subsequent measured values, a local minimum value may be determined as the minimum value 914. Whether or not the maximum value 912 appears is determined as follows, for example. When the three latest first outputs 810*a* are compared, if the second value is greater than the first value and the third value, the second value is determined to be the maximum value 912. When the maximum value 912 appears, it is determined as a wrong determination.

"Amplitude×coefficient A" is calculated using the amplitude obtained (step S20). The calculation "amplitude×coefficient A" is one method for amplifying the first output. Various methods are available to amplify the first output. Step S26 which will be described later can also be considered as one of such methods. Next, "amplitude×coefficient A" is averaged (step S22). The averaging is, for example, moving averaging on the length of the first output 810*a* corresponding to 3 cycles. An object of performing the averaging is noise reduction. The average value obtained is used as an offset value (step S24). The offset value obtained is added to the first output 810*a* (step S26). Step S26 is a process of adding a predetermined value corresponding to the first output to the first output. The object of adding the offset value to the first output 810*a* is to increase the change amount of the first output 810*a* by increasing the amplitude of the first output 810*a* as has been described above.

The first output 810*a* subjected to the addition is subjected to preliminary averaging and averaging (step S28, step S30). An object of performing two types of averaging: preliminary averaging and averaging, is to reduce noise of different cycles by changing the length of moving averaging. Only one of preliminary averaging and averaging may be performed depending on the type and magnitude of noise. It is the curve 916 shown in FIG. 18 that is obtained by preliminary averaging and averaging. The curve 916 is an amount obtained by smoothing the first output and is an amount detected by the end point detection section 28. The smoothed amount is an amount dependent on the magnitude of amplitude of the first output. The curve 916 can also be deemed to be an amount obtained by smoothing the first output and extracting only the magnitude of amplitude of the first output. Although the curve 916 can be obtained through moving averaging as described above, the curve 916 can also be obtained by processing the first output using a low-pass filter or the like.

The curve 916 is differentiated to detect a change of the first output 810*a* (step S32). The differentiation result is averaged to reduce noise (step S34). The end point detection section 28 detects an end of polishing from the result obtained. Next, the end point detection section 28 determines whether or not the polishing has ended (step S36). When the polishing has not ended, the flow returns to step S10.

The swing cycle count and the length of the effective period in steps S14 and S16, and the length of moving averaging in steps S22, S28, S30 and S34 can be stored as parameters in the end point detection section 28. By changing parameters, it is possible to change the swing cycle count, the length of the effective period and the length of moving averaging.

Performing polishing while causing the swing arm 110 to swing as the present embodiment has the following advantages. Compared to the case where the swing arm 110 is not caused to swing, since the operation of stopping the swing arm 110 becomes unnecessary, the time efficiency improves. That is, productivity improves. More specifically, when the swing arm 110 is not caused to swing, the polishing condition changes when polishing is stopped/resumed, and time loss also occurs. The condition change refers to, for example, deterioration that occurs only in a specific region of the surface of the polishing pad 10 (concentric deterioration of the polishing pad 10). Since a great quantity of objects are processed, if polishing is performed at the same location of the polishing pad 10 in particular, this deterioration becomes remarkable. When the swing arm 110 is not caused to swing, only a specific place of the polishing pad 10 (specific place on a concentric circle of the polishing pad 10) is used and the polishing pad 10 deteriorates in a localized manner. Since deterioration of the polishing pad 10 is averaged, the life of the polishing pad 10 is extended.

Furthermore, when the swing arm 110 is not caused to swing, slurry is fixed below the top ring 31A compared to the case where the swing arm 110 is caused to swing, and slurry below the top ring 31A thereby deteriorates. Alternatively, it is hard for slurry to move toward the center of the semiconductor wafer 16. When the swing arm 110 swings, slurry is not fixed below the top ring 31A, and so the semiconductor wafer 16 can be polished with fresh slurry.

Note that since processing such as calculation, addition and averaging of an offset value is performed in the present embodiment, delays occur in the processing. Due to a delay, if the delay in detection of an end of polishing poses a problem, the following countermeasure can be taken. When an end point of polishing is approached, the polishing speed is slowed down. More specifically, for example, the rotation speed of the polishing table 30A is slowed down or a contact pressure with which the top ring 31A presses the semiconductor wafer 16 is reduced. Timing at which the polishing speed is slowed down can be determined from past polishing data.

As a delay countermeasure, timing at which the polishing end is determined can also be set earlier considering that detection of a polishing end point may be delayed. An end of polishing may also be determined simultaneously using other types of end point detection sensors such as an eddy current sensor or an optical sensor.

The swing arm 110 that swings on the plane of the polishing table 30A in the horizontal direction (circumferential direction) has been described in the present embodiment. However, the present embodiment is also applicable to an arm that moves back and forth on the plane of the polishing table 30A between the rotation center of the polishing table 30A and the end portion of the polishing table 30A in a linear direction in the radius direction. This is because the frictional force becomes a minimum at the rotation center of the polishing table 30A, the frictional force becomes a maximum at an end portion of the polishing table 30A, and the frictional force changes periodically. Note that in the present embodiment, the end point detection section 28 performs end point detection using the first output 810*a*, but end point detection may also be performed using an arm torque 26*a*. In that case, the end point detection section 28 performs the processes shown in FIG. 19 on the arm torque 26*a*.

Note that the end point detection section 28 can be configured as a computer including a CPU, a memory and input/output means. In such a case, it is possible to store in the memory, a program for causing the computer to function as change detection means for increasing the change amount of the first output and detecting a change of the frictional force between the polishing pad 10 and the semiconductor wafer 16 while polishing the semiconductor wafer 16 by causing the semiconductor wafer 16 to swing around the swing center 108 on the swing arm 110.

Next, another embodiment having an optical sensor will be described using FIG. 20. The present embodiment simultaneously uses detection of a torque fluctuation in the swing shaft motor 14 that swings the polishing table 30A and detection of a reflection factor of the polishing surface of the semiconductor wafer 16 using an optical sensor. A sensor is incorporated in the polishing table 30A to detect an end point. The sensor is an optical sensor 724. A sensor using a fiber or the like is used as the optical sensor 724. Note that an eddy current sensor can also be used instead of the optical sensor 724.

Figure 20:
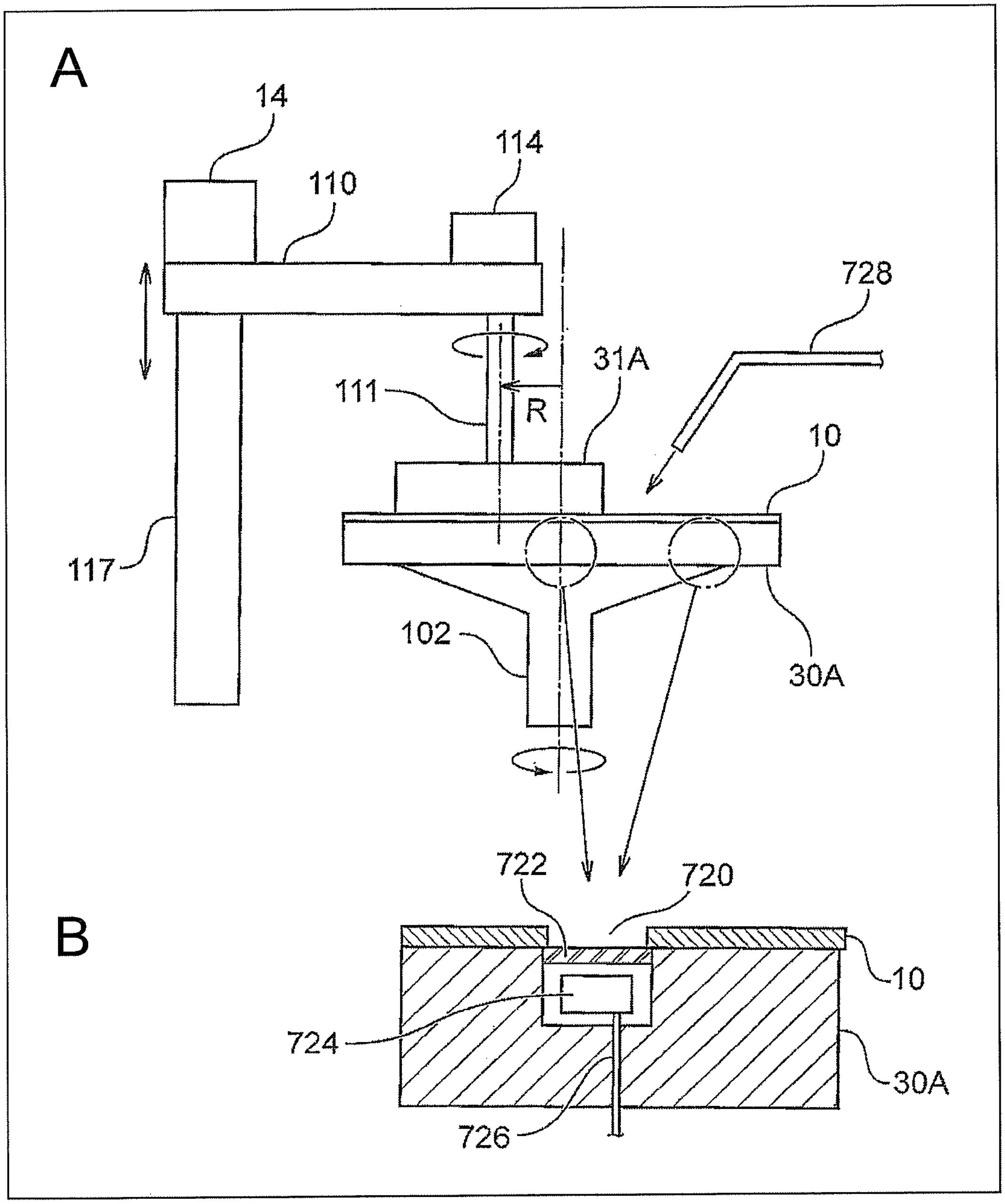
FIG. 20 is a diagram illustrating another embodiment having an optical sensor.

The embodiment in FIG. 20 can solve the following problems. When only one of a torque fluctuation detection scheme and an optical detection scheme is used to detect an end point, if polishing of a polishable object involves a mixture of polishing: polishing of a metal film and polishing of an insulating film, this results in the following problem. The torque fluctuation detection scheme is suitable for detection of a boundary between a metal film and an insulating film, and the optical detection scheme is suitable for detection of a change in a thickness of a film. Thus, when both detection of a boundary of films and detection of a thickness of the remaining film are necessary, use of only one scheme cannot achieve sufficient detection accuracy. This problem can be solved by selectively using either torque fluctuation detection or optical detection depending on which of detection of a boundary of films or detection of a thickness of the remaining film corresponds to the case.

In the case of an optical sensor, the end point detection section of the polishing apparatus exposes the semiconductor wafer 16 to light and measures the intensity of reflected light from the semiconductor wafer 16. The end point detection section detects a polishing end point indicating an end of polishing based on arm torque detected by the arm torque detection section and the intensity of the reflected light from the semiconductor wafer 16 measured by the optical sensor 724. The output of the optical sensor 724 is sent to the control section 65 via a wiring 726.

In the case of the optical sensor, an opening 720 is provided in part of the polishing pad 10. The opening 720 is provided with a view port 722 which is a window. Radiation of light and detection of reflected light are achieved via the view port 722. The view port 722 is incorporated at a position inside the polishing table 30A which can face the semiconductor wafer 16 during polishing. The optical sensor 724 is disposed below the view port 722. When the optical sensor 724 is a fiber sensor, the view port 722 may not be provided.

When there is no view port 722, pure water may be discharged from around the fiber sensor to remove slurry supplied from the nozzle 728 and perform end point detection. The optical sensor includes a fluid supply section (not shown) that supplies pure water (or high purity gas, fluid such as a liquid-gas mixture) to clean slurry into the opening 720.

There can be a plurality of sensors. For example, as shown in FIGS. 20A and 20B, sensors are provided at a center and an end portion to monitor detection signals at both the center and end portion. FIG. 20A illustrates the location of the optical sensor 724 and FIG. 20B is an enlarged view of the optical sensor 724. The end point detection section 28 selects a detection signal unaffected by polishing conditions (or optimum for the polishing conditions) according to a change in the polishing conditions (material, polishing time or the like of the semiconductor wafer 16) from among a plurality of signals, determines an end point and stops polishing.

This point will be described further. A combination of torque fluctuation detection (measurement of motor current fluctuation) by the above-described swing shaft motor 14 and optical detection is effective if it is used to detect a polishing end point of an inter-layer insulating film (ILD) or an element separation film by STI (shallow trench isolation). In optical detection such as SOPM (spectrum optical endpoint monitoring), the thickness of the remaining film is detected and an end point is detected. For example, in a manufacturing process of a multilayer film of LSI, it may be necessary to form the remaining film through polishing of a metal film and polishing of an insulating film. It is necessary to perform polishing of the metal film and polishing of the insulating film, and it is possible to selectively use torque fluctuation detection or optical detection depending on which of polishing of the metal film or polishing of the insulating film is performed.

When the film structure of the end point portion is one in which the metal and the insulating film are present in a mixed state, it is difficult to detect an end point accurately using only one of torque fluctuation detection and optical detection schemes. Therefore, the film thickness is measured through torque fluctuation detection and optical detection, whether or not a certain point is an end point is determined based on both detection results and polishing is completed at an optimum time point. In a mixed state, measurement accuracy deteriorates because a measured signal is weak in both torque fluctuation detection and optical detection. However, it is possible to determine an optimum end point position by making determinations using signals obtained through two or more types of measurement methods. An end point is determined, for example, when all the determinations made using the signals obtained through two or more types of measurement methods have results indicating that an end point is found.

Next, another embodiment having an optical sensor will be described using FIG. 21. The present embodiment simultaneously uses detection of a torque fluctuation (friction fluctuation of the polishing table 30A) in the swing shaft motor 14 that swings the polishing table 30A, detection of a reflection factor of the polishing surface of the semiconductor wafer 16 using an optical sensor and detection of an eddy current in the polishable object of the semiconductor wafer 16 using an eddy current sensor. Three types of detection methods are used simultaneously.

Figure 21:
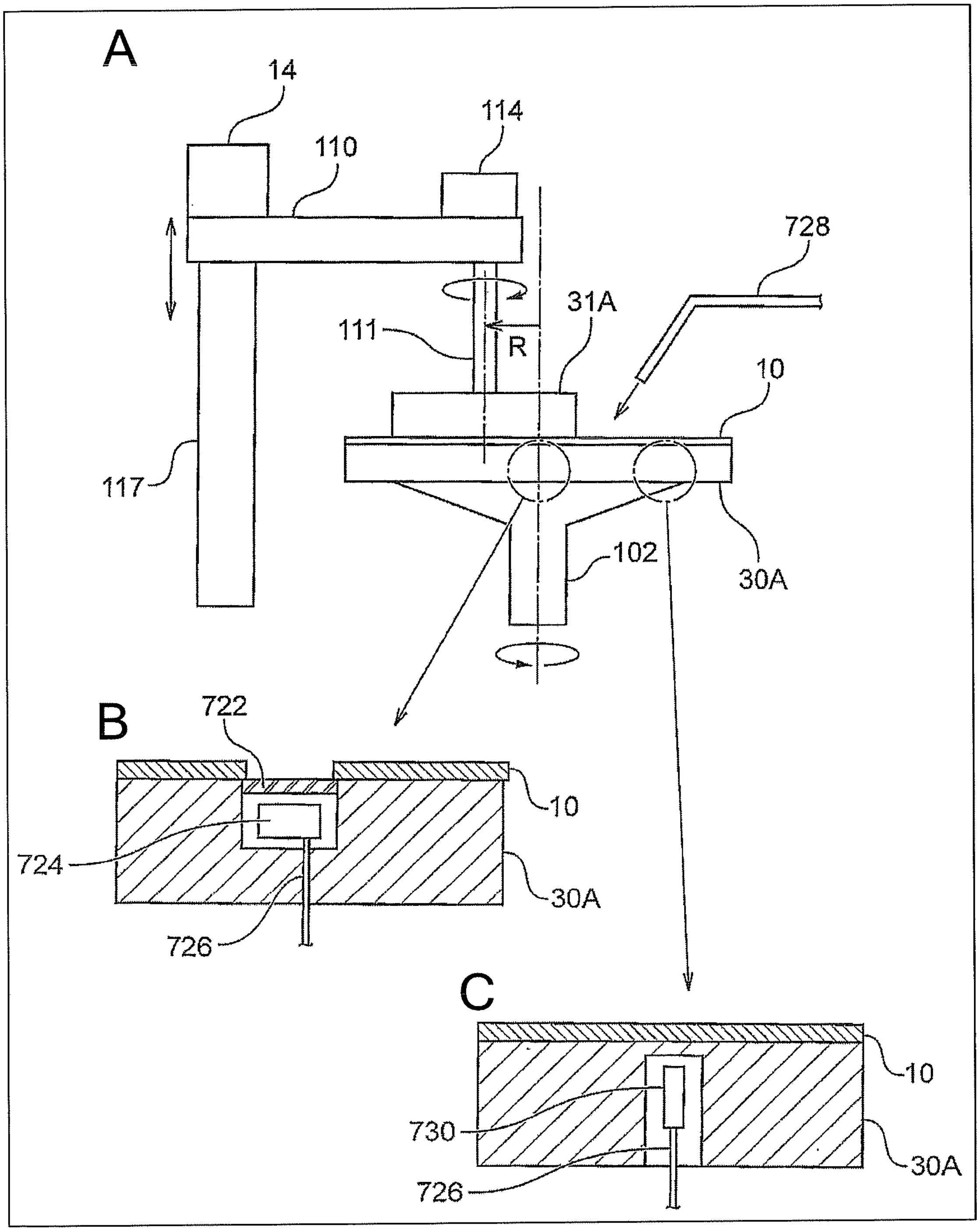
FIG. 21 is a diagram illustrating a further embodiment having an optical sensor.

In the case of the embodiment in FIG. 21, the following problems can be solved. The torque fluctuation detection scheme and the optical detection scheme according to the embodiment in FIG. 20 have a problem of having difficulty in detecting a change in the thickness of a metal film. The embodiment in FIG. 21 is intended to solve this problem and further uses detection of an eddy current in addition to the embodiment in FIG. 20. Since an eddy current in the metal film is detected, it is easier to detect a change in the thickness of a metal film.

FIG. 21A illustrates arrangements of the optical sensor 724 and an eddy current type sensor 730, FIG. 21B is an enlarged view of the optical sensor 724 and FIG. 21C is an enlarged view of the eddy current type sensor 730. The eddy current type sensor 730 is disposed in the polishing table 30A. The eddy current type sensor 730 generates a magnetic field in the semiconductor wafer 16 and detects the intensity of the generated magnetic field. The end point detection section 28 detects a polishing end point indicating an end of polishing based on arm torque detected by the arm torque detection section 26, the intensity of reflected light from the semiconductor wafer 16 measured by the optical sensor 724 and the intensity of the magnetic field measured by the eddy current type sensor 730.

The present embodiment is an example of combining torque fluctuation detection of the swing shaft motor 14 and detection of physical quantities of the semiconductor wafer 16 by the optical sensor 724 and the eddy current type sensor 730 incorporated in the polishing table 30A to detect an end point. The torque fluctuation detection (measurement of motor current fluctuation) by the swing shaft motor 14 excels in detection of an end point in a region where the film quality of a sample to be polished changes. The optical scheme excels in detection of the amount of remaining film of an insulating film such as ILD and STI and detection of an end point thereby. End point detection by the eddy current sensor excels in end point detection at a time point at which polishing is performed up to the insulating film of the lower layer which is an end point by polishing, for example, a plated metal film.

In manufacturing processes of a semiconductor having multiple layers of LSI or the like, multiple layers made of various materials are polished, and so three types of end point detection methods are used to perform polishing of a variety of films and end point detection with high accuracy. Three or more types of end point detection methods can also be used in the present embodiment. For example, torque fluctuation detection (motor current fluctuation measurement (TCM)) of a motor that rotates the polishing table 30A can also be used simultaneously.

It is possible to perform high function control and high accuracy end point detection using a combination of four types of detections of end points. For example, when the top ring 31A moves (swings) on the polishing table 30A to perform polishing, a torque fluctuation of the polishing table 30A due to a change in the position of the top ring 31A is detected using TCM. Thus, it is possible to find a factor whereby a pressure of the top ring 31A on a sample is different due to a torque fluctuation when the top ring 31A is located at the center of the polishing table 30A, when the top ring 31A moves to one end of the polishing table 30A or when the top ring 31A moves to the other end of the polishing table 30A. When the factor is found, it is possible to perform feedback such as adjusting a pressure on the surface of the top ring 31A in order to uniformize the pressure on the sample.

Examples of the factors for a torque fluctuation in the polishing table 30A due to a change in the position of the top ring 31A include a difference in the horizontal level between the top ring 31A and the polishing table 30A, a difference in the horizontal level between the sample face and the surface of the polishing pad 10 or the frictional force being different when the top ring 31A is located at the center and when the top ring 31A is located at a position deviated from the center due to a difference in the abrasion degree of the polishing pad 10.

Note that when the film structure of the polishing end point of the film of the semiconductor wafer 16 is one in which a metal and insulating film are present in a mixed state, it is difficult to perform accurate end point detection using only one detection scheme, and therefore the end point state is determined using a scheme of detecting the fluctuation of arm torque and an optical detection method, or a scheme of detecting the fluctuation of arm torque and a scheme of detecting an eddy current or from detection of all the three types of signals, and polishing is completed at an optimal time point. In the mixed state, since the measured signal is weak in any of the torque fluctuation detection, the optical scheme and the scheme of detecting a detection eddy current, the measurement accuracy deteriorates. However, by making determinations using signals obtained using three or more types of measurement methods, it is possible to determine an optimum end point position. For example, when all the determinations using signals obtained using the three or more types of measurement methods have results indicating that an end point is found, the end point is determined.

These combinations can be enumerated as follows: i. Arm torque detection+table torque detection ii. Arm torque detection+optical detection iii. Arm torque detection+eddy current detection iv. Arm torque detection+optical detection by microwave sensor v. Arm torque detection+optical detection+table torque detection vi. Arm torque detection+optical detection+eddy current detection vii. Arm torque detection+optical detection+optical detection by microwave sensor viii. Arm torque detection+eddy current detection+table torque detection ix. Arm torque detection+eddy current detection+optical detection by microwave sensor x. Arm torque detection+table torque detection+optical detection by microwave sensor xi. In addition, any combination of sensors combined with arm torque detection is included.

Figure 22:
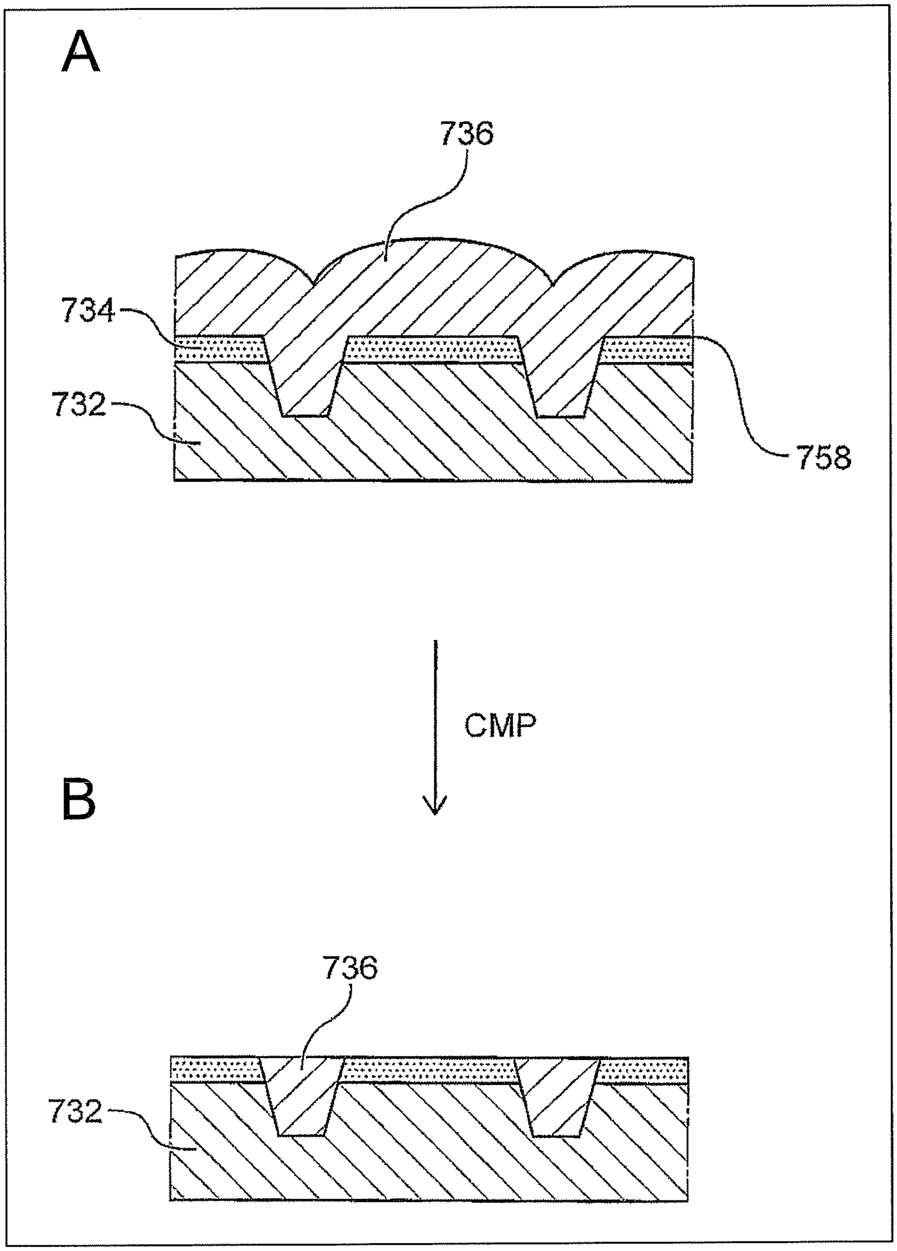
FIG. 22 is a diagram illustrating an example of a case where the film structure of an end point section is a state in which a metal and an insulating film are mixed.
Figure 23:
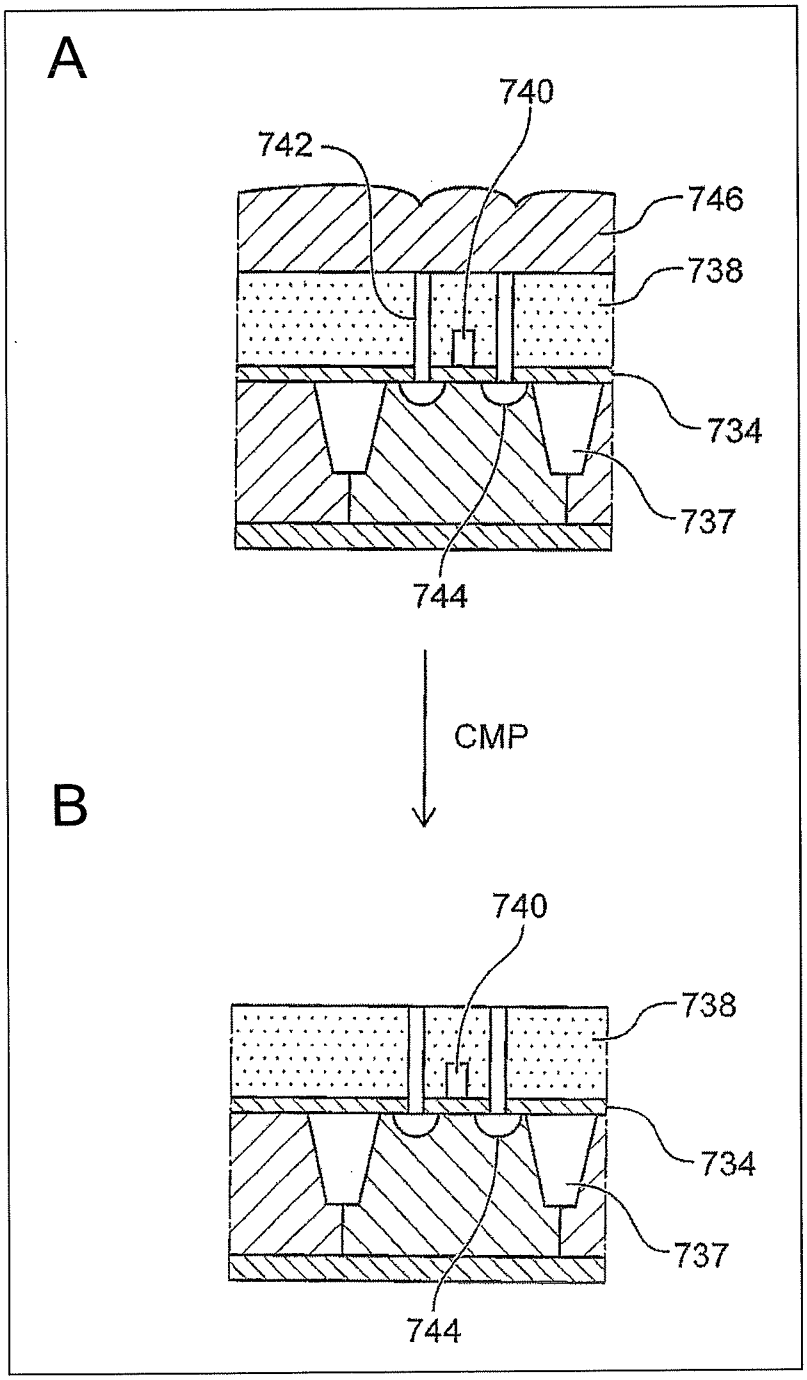
FIG. 23 is a diagram illustrating an example of a case where the film structure of an end point section is a state in which a metal and an insulating film are mixed.
Figure 24:
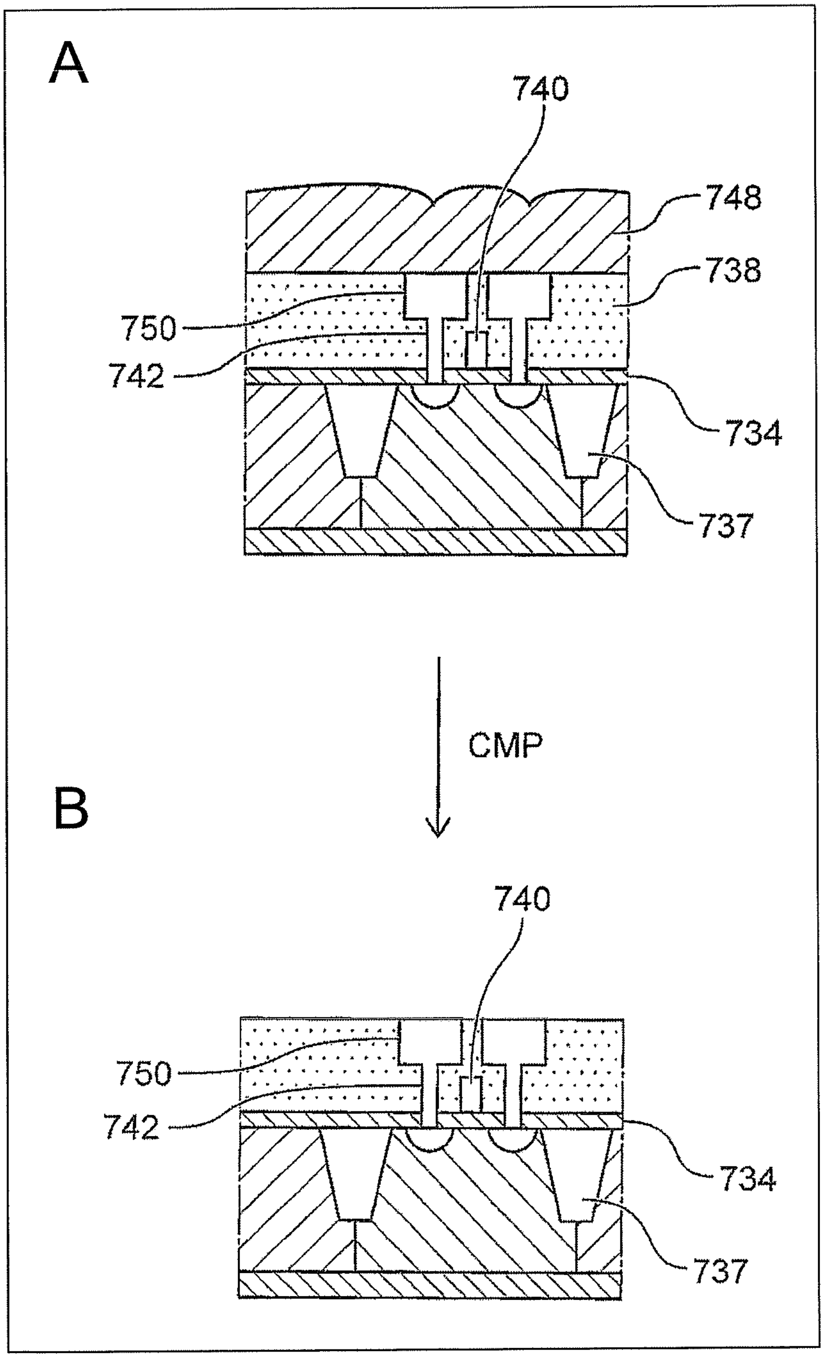
FIG. 24 is a diagram illustrating an example of a case where the film structure of an end point section is a state in which a metal and an insulating film are mixed.

FIGS. 22, 23 and 24 show examples where the film structure of the end point portion is one in which a metal and an insulating film are present in a mixed state. In the following examples, examples of the metal include metals such as Cu, Al, W and Co, and examples of the insulating film include insulating materials such as $SiO_2$, SiN, glass material (SOG (spin-on glass), BPSG (boron phosphorus silicon glass) or the like), Lowk material, resin material and other insulating members. $SiO_2$, SOG, BPSG or the like are manufactured using CVD or coating. FIGS. 22A and 22B are examples where an insulating film is polished. FIG. 22A illustrates a state before polishing and FIG. 22B illustrates a state after polishing. A film 732 is silicon. A film 734 which is an insulating film such as $SiO_2$ (thermal oxide film) and SiN is formed on the film 732. A film 736 which is an insulating film such as an oxide film ($SiO_2$) or glass material (SOG, BPSG) is formed on the film 734 through film formation. The film 736 is polished to a state shown in FIG. 22B.

The film thickness of the film 736 is measured through optical detection. A boundary 758 between the film 736 and the film 734, and a boundary between the film 734 and the film 732 are sensitive to reflection of light. Therefore, optical detection is preferable. When the film 736 and the film 734 are made of different materials, a change in friction may be large during polishing. In this case, optical detection+torque detection is preferable.

FIGS. 23A and 23B illustrate examples where a metal film is polished. FIG. 23A illustrates a state before polishing and FIG. 23B illustrates a state after polishing. An embedded part 737 is an STI. A film 738 similar to the film 736 is formed on the film 734. A gate electrode 740 is formed on the film 734. A diffusion layer 744 which is a drain or source is formed below the film 734. The diffusion layer 744 is connected to a longitudinal wiring 742 such as a via or plug. The gate electrode 740 is connected to the longitudinal wiring 742, which is not shown. The longitudinal wiring 742 penetrates the film 738. A metal film 746 is formed on the film 738. The longitudinal wiring 742 and the metal film 746 are of the same metal. The metal film 746 is polished to a state shown in FIG. 23B. Note that although the gate electrode 740 and the diffusion layer 744 are formed in FIGS. 23A and 23B, other circuit elements may also be formed.

Being a metal film, the metal film 746 detects an eddy current by taking advantage of the fact that there is a large change in the waveform of an eddy current in the metal film 746 when the metal film is drastically reduced. It is also possible to use optical detection taking advantage of the fact that the metal film is reduced from a state in which the amount of reflection of the metal film is large and the amount of reflection drastically changes, together with eddy current detection. Since the film 738 is an insulating film, the film thickness thereof is measured through optical detection.

FIGS. 24A and 24B illustrate examples where a metal film is polished. FIG. 24A illustrates a state before polishing and FIG. 24B illustrates a state after polishing. The embedded part 737 is an STI. The film 738 is formed on the film 734. The gate electrode 740 is formed on the film 734. The diffusion layer 744 which is a drain or source is formed below the film 734. The diffusion layer 744 is connected to the longitudinal wiring 742 such as a via or plug. The gate electrode 740 is connected to the longitudinal wiring 742, which is not shown. The longitudinal wiring 742 penetrates the film 738. A metallic lateral wiring 750 is formed on the via 742. The metal film 748 and the lateral wiring 750 are of the same metal. The metal film 748 is polished to a state shown in FIG. 24B.

Being a metal film, the metal film 748 detects an eddy current using an eddy current sensor. Since the film 738 is an insulating film, its film thickness is measured through optical detection. Note that the embodiment shown in FIG. 22 and subsequent drawings is applicable to all the embodiments in FIG. 1 to FIG. 21.

Figure 25:
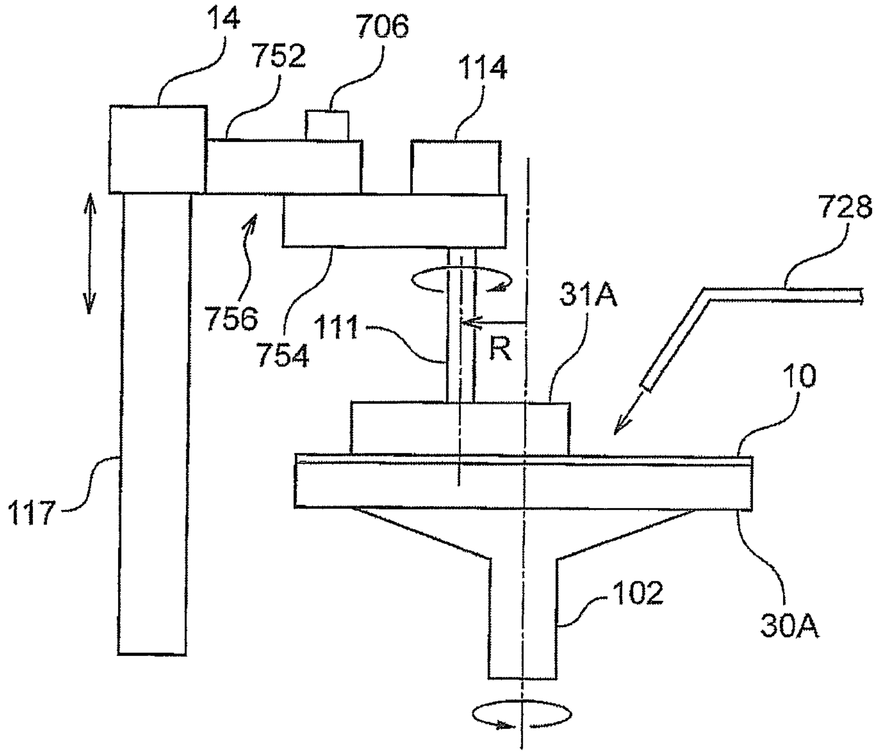
FIG. 25 is a diagram illustrating an embodiment as a modification of FIG. 16.

Next, an embodiment as the modification in FIG. 16 will be described using FIG. 25. In the present embodiment, the swing arm 110 is constructed of a plurality of arms. In FIG. 25, the swing arm 110 is constructed of, for example, an arm 752 and an arm 754. The arm 752 is attached to the swing shaft motor 14 and the top ring 31A is attached to the arm 754. An end point is detected by detecting a torque fluctuation in the swing arm at a joint between the arm 752 and the arm 754.

In the case of the embodiment in FIG. 25, the following problems can be solved. In the case of FIG. 16, regarding end point detection, there is a problem that the accuracy of end point detection deteriorates due to influences of clearance vibration, which will be described later, or the like. In the case of the embodiment in FIG. 25, it is possible to reduce the influences of clearance vibration or the like, and thereby solve this problem.

A torque sensor for detecting a torque fluctuation in the swing arm is disposed at the joint 756 between the arm 752 and the arm 754. The torque sensor includes the load cell 706 and a distortion gauge. At the joint 756, the arm 752 and the arm 754 are mutually fixed by the metal fitting 710. The arm 752 can be caused to swing by the swing shaft motor 14. When a torque change is measured based on a fluctuation in the aforementioned swing motor current, the swing operation may be preferably stopped temporarily and a torque change may be measured. This is because noise in the motor current of the swing motor may increase along with the swing operation.

In the case of the present embodiment, when a fluctuation in polishing torque occurs due to a friction fluctuation in a part where the film quality changes such as the boundary 758 in FIG. 22A, it is possible to detect the boundary 758 using the torque sensor at the joint 756. A fluctuation in polishing torque can also be detected by detecting a current fluctuation in the swing shaft motor 14. Compared to the torque fluctuation detection based on a current fluctuation, torque fluctuation detection by the torque sensor at the joint 756 has the following merits.

The torque fluctuation detection through detection of a current fluctuation is affected by an error in rotation operation (swing) of the swing shaft motor 14 such as clearance vibration of the swing arm 110 by the swing shaft motor 14. The "clearance vibration" is vibration caused by slight backlash generated at the part of the swing arm 110 attached to the swing shaft motor 14 during rotation operation of the swing shaft motor 14. In torque fluctuation detection by the torque sensor at the joint 756, the joint 756 has no clearance vibration and can detect a torque fluctuation corresponding to a friction change of the polishing section. Thus, more accurate end point detection is made possible. It is necessary to stop swinging of the swing arm 110 to reduce clearance vibration. However, in torque fluctuation detection by the torque sensor at the joint 756, accurate end point detection is made possible without stopping swinging of the swing arm 110.

The present embodiment is applicable to a case where there are a plurality of top rings 31A or also applicable to a carousel scheme. As multilayer films of LSI become thinner or functional elements become finer, more accurate polishing end point detection needs to be performed than the prior art in order to make performance more stable and maintain yield. The present embodiment is effective as a technique capable of meeting such requirements.

Figure 26:
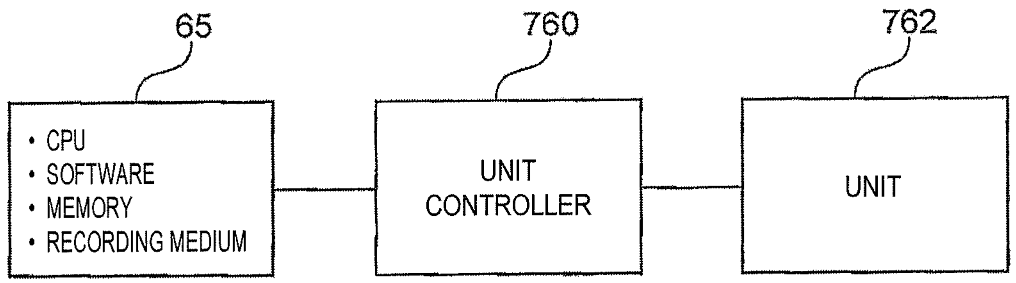
FIG. 26 is a diagram illustrating overall control by a control section.

Next, control of the entire substrate processing apparatus by the control section 65 will be described using FIG. 26. The control section 65 which is a main controller includes a CPU, a memory, a recording medium and software recorded in the recording medium or the like. The control section 65 performs monitoring or control of the entire substrate processing apparatus, exchanges signals therefor, records information or carries out calculations. The control section 65 exchanges signals mainly with a unit controller 760. The unit controller 760 also includes a CPU, a memory, a recording medium and software recorded in the recording medium or the like. In the case of FIG. 26, the control section 65 incorporates a program that functions as end point detection means for detecting a polishing end point indicating an end of polishing and control means for controlling polishing by the polishing unit. Note that the unit controller 760 may incorporate a part or a whole of the program. The program is updatable. Note that the program may not be updatable.

Figure 27:
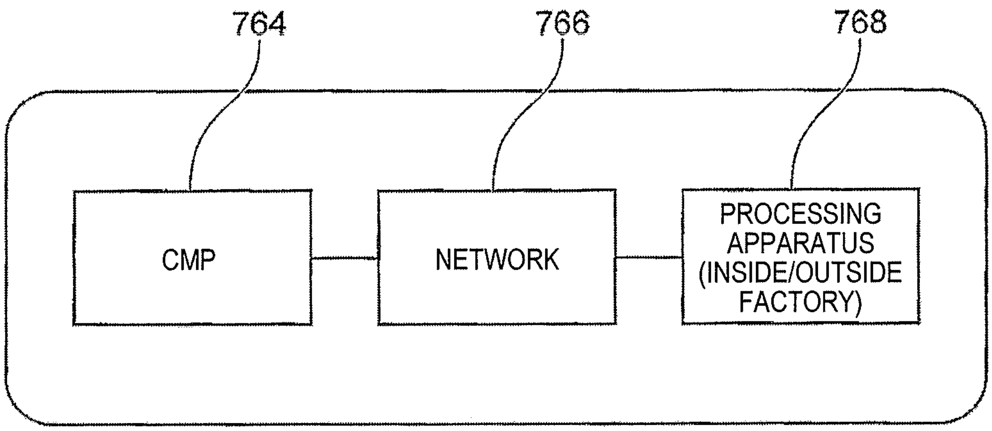
FIG. 27 is a diagram illustrating a configuration of another embodiment.
Figure 28:
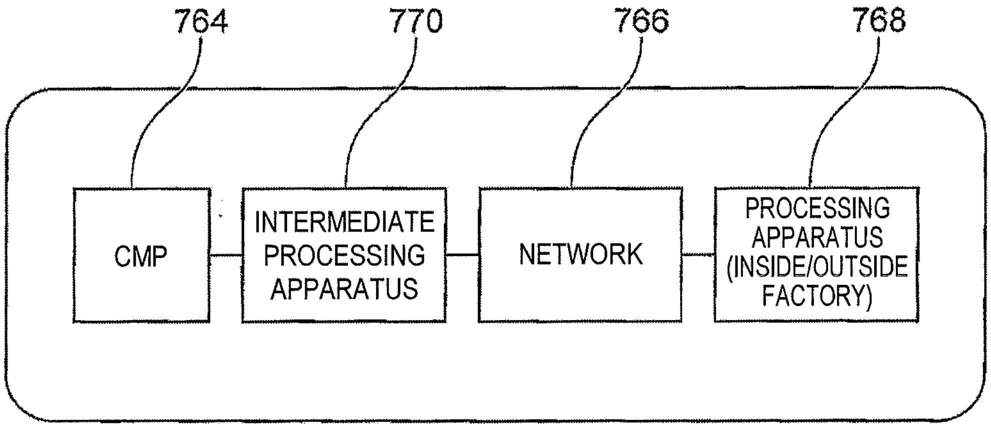
FIG. 28 is a diagram illustrating a modification of the embodiment in FIG. 27.

The embodiment described in FIG. 26 to FIG. 28 can solve the following problems. The control schemes of the polishing apparatuses described so far have the following typical problems. Regarding end point detection, before polishing a target, a plurality of tests are conducted, polishing conditions or end point determination conditions are determined from the data obtained and a recipe which is the polishing conditions is created. A partial signal analysis may be used but processing of determining end point detection is performed using one sensor signal for the semiconductor wafer structure. In this way, however, sufficient accuracy cannot be achieved to meet the following requirements. In order to improve yield of devices or chips to be manufactured, it is necessary to detect an end point with higher accuracy and minimize fluctuations among lots and chips in manufacturing the devices or chips. To meet such requirements, by using a system that carries out end point detection to which the embodiments described in FIG. 26 and subsequent drawings are applied, it is possible to perform more accurate end point detection, improve yield and minimize fluctuations in the amount of polishing among chips.

Particularly, it is possible to achieve high-speed data processing, signal processing using many sensors of many types, data normalized from these signals, learning from data using artificial intelligence (AI), creation of a data set used to determine end point detection, learning through storage of determination examples using the created data set, improvement of accuracy using learning effects, polishing parameters determined and updated by the learned determination function, a high-speed communication processing system that reflects the polishing parameters in a high-speed control system, or the like. These are applicable to all the embodiments shown in FIG. 25 and therebefore.

The unit controller 760 controls a unit 762 (one or in plurality) mounted on the substrate processing apparatus. According to the present embodiment, the unit controller 760 is provided for each unit 762. The load/unload section 62, the polishing section 63 and the cleaning section 64 or the like are provided as the unit 762. The unit controller 760 controls operation of the unit 762, exchanges signals with the monitoring sensor, exchanges control signals and performs high-speed signal processing or the like. The unit controller 760 is constructed of an FPGA (field-programmable gate array), an ASIC (application specific integrated circuit) or the like.

The unit 762 operates according to a signal from the unit controller 760. The unit 762 receives a sensor signal from the sensor and transmits the sensor signal to the unit controller 760. The sensor signal may be further transmitted from the unit controller 760 to the control section 65. The sensor signal is processed (including calculation processing) by the control section 65 or the unit controller 760 and a signal for the next operation is sent from the unit controller 760. The unit 762 operates according to the signal. For example, the unit controller 760 detects a torque fluctuation of the swing arm 110 from a current change in the swing shaft motor 14. The unit controller 760 sends a detection result to the control section 65. The control section 65 performs end point detection.

Examples of the software include the following. The software determines the type of the polishing pad 10 and the amount of slurry supplied according to the data recorded in the control device (control section 65 or unit controller 760). Next, the software specifies maintenance timing of the polishing pad 10 or the polishing pad 10 usable until the maintenance timing, obtains the amount of slurry supplied and outputs the data. The software may also be software that can be installed in the substrate processing apparatus 764 after shipment of the substrate processing apparatus 764.

Communication between the control section 65, unit controller 760 and unit 762 can be carried out wiredly or wirelessly. Communication via the Internet or communication using other communication means (high-speed communication using a dedicated channel) is available for communication between the substrate processing apparatus 764 and the outside. Regarding data communication, it is possible to use a cloud through cloud cooperation and exchange data via smartphones in the substrate processing apparatus through smartphone cooperation. It is thereby possible to exchange an operation situation of the substrate processing apparatus and setting information of substrate processing with the outside of the substrate processing apparatus. A communication network may be formed between sensors as a communication device and this communication network may be used.

Automated operation of the substrate processing apparatus may be performed using the above-described control function and communication function. It is possible to standardize a control pattern of the substrate processing apparatus and use a threshold in determination of a polishing end point for automated operation.

It is possible to predict/determine/display an abnormality/life of the substrate processing apparatus. It is also possible to perform control to make performance more stable.

It is possible to automatically extract feature values of various types of data and polishing data (film thickness and end point of polishing) during operation of the substrate processing apparatus, automatically learn the operation state and polishing state, automatically standardize a control pattern and predict/determine/display an abnormality/life.

For a communication scheme, device interface or the like, it is possible to standardize, for example, a format, use it for information communication between apparatuses/devices to manage the apparatuses/devices.

Next, an embodiment will be described in which the substrate processing apparatus 764 acquires information from the semiconductor wafer 16 via a sensor, data is stored in a data processing apparatus (cloud or the like) installed inside/outside a factory in which the substrate processing apparatus is installed via communication means such as the Internet, the data stored in the cloud or the like is analyzed and the substrate processing apparatus is controlled according to the analysis result. FIG. 27 is a diagram illustrating a configuration of this embodiment.

1. The information acquired from the semiconductor wafer 16 via the sensor can be as follows: •Measured signal or measured data relating to a torque fluctuation of the swing shaft motor 14 •Measured signal or measured data of an SOPM (optical sensor) •Measured signal or measured data of an eddy current sensor •Measured signal or measured data of one or a plurality of combination 2. Communication means such as the Internet can have the following functions and configurations: •Signals or data including the above-described measured signal or measured data are transmitted to the data processing apparatus 768 connected to the network 766. •The network 766 can be communication means such as the Internet or high-speed communication. For example, it is possible to implement the network 766, in which the substrate processing apparatus, gateway, Internet, cloud, Internet, and data processing apparatus are connected in that order. Examples of high-speed communication include high-speed optical communication, high-speed radio communication, or the like. As high-speed radio communication, Wi-Fi (registered trademark), Bluetooth (registered trademark), Wi-Max (registered trademark), 3G, LTE or the like are conceivable. Other high-speed radio communications are also applicable. Note that a cloud may be used as the data processing apparatus. •When the data processing apparatus 768 is installed in a factory, it is possible to process signals from one or a plurality of substrate processing apparatuses in the factory. •When the data processing apparatus 768 is installed outside the factory, it is possible to transmit signals from one or a plurality of substrate processing apparatuses in the factory to the outside of the factory and process the signals. In this case, connections with data processing apparatuses installed in and outside Japan are possible. 3. Regarding the above description that the data processing apparatus 768 analyzes data stored in the cloud or the like and controls the substrate processing apparatus 764 according to the analysis result, the following is possible: •After the measured signal or measured data is processed, they can be transmitted to the substrate processing apparatus 764 as a control signal or control data. •The substrate processing apparatus 764 that has received the data updates polishing parameters relating to polishing processing based on the data and performs polishing operation. When the data from the data processing apparatus 768 is a signal/data indicating that an end point is detected, polishing is completed by determining that an end point is detected. The polishing parameters include (1) pressing forces on four regions of the semiconductor wafer 16, that is, central part, inside intermediate part, outside intermediate part and peripheral edge, (2) polishing time, (3) the number of revolutions of the polishing table 30A and the top ring 31A, and (4) a threshold for determination of a polishing end point.

Next, another embodiment will be described using FIG. 28. FIG. 28 is a diagram illustrating a modification of the embodiment in FIG. 27. The present embodiment has a configuration with the substrate processing apparatus, the intermediate processing apparatus, the network 766, and the data processing apparatus connected in that order. The intermediate processing apparatus is constructed of, for example, an FPGA or ASIC, and has a filtering function, a calculation function, a data processing function and a data set creation function.

Usage of the Internet and high-speed optical communication can be classified into the following three cases: (1) case where the substrate processing apparatus and the intermediate processing apparatus are connected via the Internet and the network 766 is the Internet; (2) case where the substrate processing apparatus and the intermediate processing apparatus are connected via high-speed optical communication and the network 766 is high-speed optical communication; (3) case where the substrate processing apparatus and the intermediate processing apparatus are connected via high-speed optical communication and the intermediate processing apparatus and outside thereof is the Internet.

Case (1): This is a case where the data communication speed and the data processing speed in the entire system can be a communication speed of the Internet. The data sampling speed is on the order of about 1 to 1000 mS and it is possible to carry out data communication of a plurality of polishing condition parameters. In this case, the intermediate processing apparatus 770 creates a data set to be sent to the data processing apparatus 768. Details of the data set will be described later. The data processing apparatus 768 that receives the data set performs data processing, calculates changed values of polishing condition parameters up to the position of an end point, creates a polishing process plan and returns them to the intermediate processing apparatus 770 via the network 766. The intermediate processing apparatus 770 sends the changed values of the polishing condition parameters and necessary control signals to the substrate processing apparatus 764.

Case (2): Communication of sensor signals between the substrate processing apparatus and the intermediate processing apparatus and between the intermediate processing apparatus and the data processing apparatus, and communication between the state management devices correspond to high-speed communication. High-speed communication allows communication at a communication speed of 1 to 1000 Gbps. Data, data sets, commands and control signals or the like can be communicated in high-speed communication. In this case, the intermediate processing apparatus 770 creates a data set and transmits the data set to the data processing apparatus 768. The intermediate processing apparatus 770 extracts data necessary for processing in the data processing apparatus 768, processes the data and creates a data set. For example, a plurality of sensor signals for end point detection are extracted to create a data set.

The intermediate processing apparatus 770 sends the data set created to the data processing apparatus 768 through high-speed communication. The data processing apparatus 768 calculates parameter changed values up to the polishing end point and creates a process plan based on the data set. The data processing apparatus 768 receives data sets from a plurality of substrate processing apparatuses 764, calculates parameter updated values and creates a process plan in the next step for the respective apparatuses and transmits the updated data sets to the intermediate processing apparatus 770. The intermediate processing apparatus 770 converts the updated data sets to control signals based on the updated data sets and transmits the control signals to the control section 65 of the substrate processing apparatus 764 through high-speed communication. The substrate processing apparatus 764 applies polishing according to the updated control signals and performs accurate end point detection.

Case (3): The intermediate processing apparatus 770 receives a plurality of sensor signals of the substrate processing apparatus 764 through high-speed communication. In high-speed optical communication, communication at a communication speed of 1 to 1000 Gbps is possible. In this case, on-line polishing condition control is possible through high-speed communication between the substrate processing apparatus 764, the sensor, the control section 65 and the intermediate processing apparatus 770. Data is processed in order of, for example, reception of a sensor signal (from the substrate processing apparatus 764 to the intermediate processing apparatus 770), creation of a data set, data processing, calculation of a parameter updated value, transmission of updated parameter signals, polishing control by the control section 65 and detection of the updated end point.

In this case, the intermediate processing apparatus 770 performs high-speed end point detection control through high-speed communication. The intermediate processing apparatus 770 periodically transmits a status signal to the data processing apparatus 768, and the data processing apparatus 768 monitors a control state. The data processing apparatus 768 receives status signals from a plurality of substrate processing apparatuses 764 and creates a plan in the next process step for the respective substrate processing apparatuses 764. The data processing apparatus 768 sends a plan signal of the process step based on the plan to the respective substrate processing apparatuses 764 and the respective substrate processing apparatuses 764 prepare for the polishing process and execute the polishing process independently of each other. In this way, the intermediate processing apparatus 770 performs high-speed end point detection control through high-speed communication and the data processing apparatus 768 manages states of the plurality of substrate processing apparatuses 764.

Next, examples of data sets will be described. A sensor signal and necessary control parameters can be formed into a data set. The data set can include a pressure of the top ring 31A on the semiconductor wafer 16, a current of the swing shaft motor 14, a motor current of the polishing table 30A, a measured signal of an optical sensor, a measured signal of an eddy current sensor, the position of the top ring 31A on the polishing pad 10, flow rates/types of slurry and a chemical liquid, correlation calculation data thereof or the like.

The above-described types of data sets can be transmitted using a transmission system whereby one-dimensional data is transmitted in parallel or a transmission system whereby one-dimensional data is transmitted sequentially. As for the data set, the above-described one-dimensional data can be processed into two-dimensional data to form a data set. For example, when it is assumed that the X-axis shows time and the Y-axis shows many data strings, a plurality of pieces of parameter data at the same time are processed into one data set. The two-dimensional data can be handled as something like two-dimensional image data. The merit is that a two-dimensional data transfer allows data associated with time to be exchanged and handled with a smaller amount of wiring than a one-dimensional data transfer. More specifically, when one-dimensional data is formed into one signal, one line as is, many wires are necessary, whereas in the case of a two-dimensional data transfer, a plurality of signals can be transmitted with one line. Furthermore, when a plurality of lines are used, the interface with the data processing apparatus 768 that receives transmitted data becomes complicated and data reassembly in the data processing apparatus 768 becomes complicated.

When such a time-associated two-dimensional data set exists, comparisons with a data set during polishing under a standard polishing condition performed previously and a data set under a standard polishing condition currently being performed become easier. Furthermore, mutual differences between two-dimensional pieces of data can be easily known through difference processing or the like. It is also easy to extract differences and detect a sensor or a parameter signal in which an abnormality occurs. Furthermore, a data set corresponding to a previous standard polishing condition is compared with a data set currently being polished, and it is easier to detect an abnormality by extracting parameter signals in a region where a difference from surroundings differs.

Figure 29A:
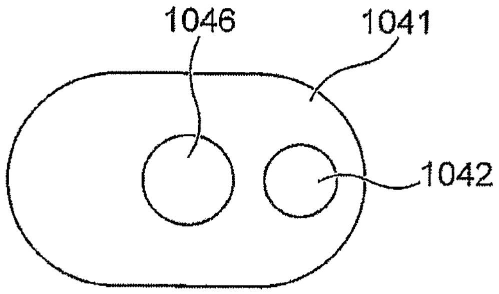
FIGS. 29A and 29B are diagrams illustrating another schematic configuration of the sensor of the polishing apparatus according to the present invention.
Figure 29B:
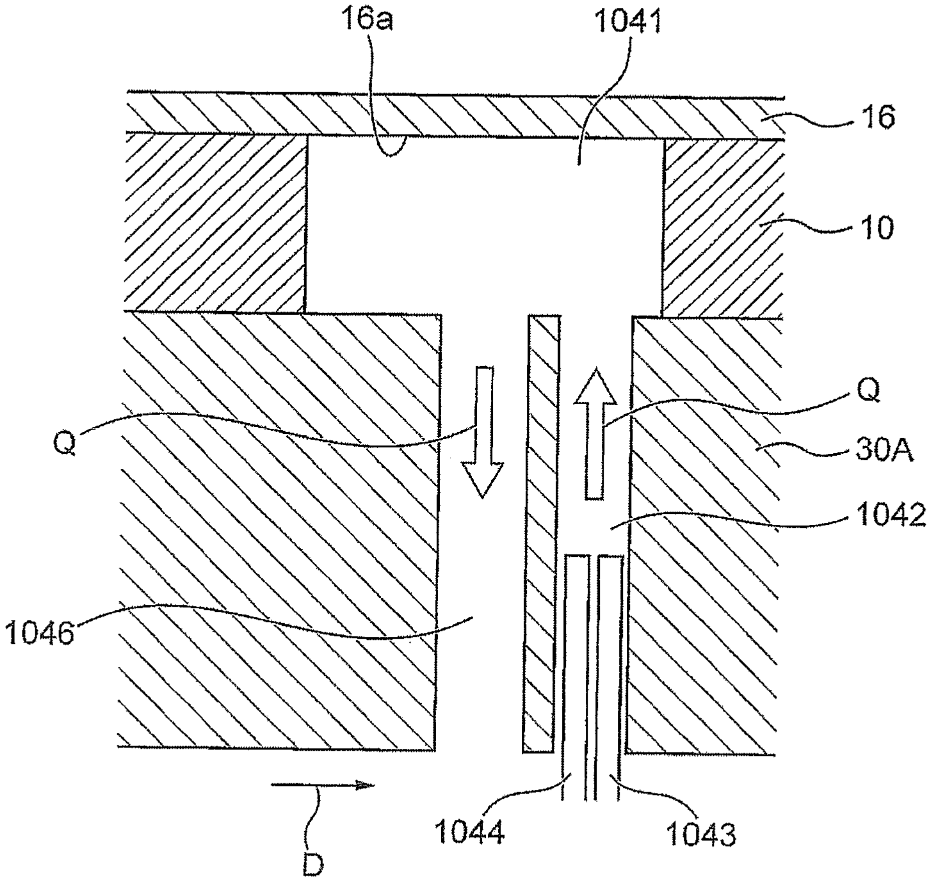

FIGS. 29A and 29B are diagrams illustrating another schematic configuration example of a sensor (embodiment described in the eleventh to fourteenth aspects), FIG. 29A is a plan view and FIG. 29B is a cross-sectional side view. As illustrated, a liquid supply hole 1042 and a liquid discharge hole 1046 are arranged (the liquid discharge hole 1046 and the liquid supply hole 1042 are arranged in that order in the moving direction of the polishing table 30A) so that a midpoint of a line segment connecting the center of the liquid supply hole 1042 and the center of the liquid discharge hole 1046 is located ahead of the center of the through hole 1041 in the moving direction (arrow D direction) of the polishing table 30A, and the through hole 1041 has a substantially elliptic cross section so that the outer periphery of the bottom end face of the through hole 1041 surrounds the top end surfaces of the liquid supply hole 1042 and the liquid discharge hole 1046. By adopting such a configuration, the flow of a transparent liquid Q supplied from the liquid supply hole 1042 into the through hole 1041 becomes a flow moving perpendicularly to the polishable surface 16*a* of the semiconductor wafer 16. By causing the through hole 1041 to have a substantially elliptic cross section, it is possible to minimize the area of the through hole 1041 and reduce influences on a polishing characteristic.

Note that a radiation light optical fiber 1043 and a reflected light optical fiber 1044 are arranged in the liquid supply hole 1042 so that the center lines thereof are parallel to the center line of the liquid supply hole 1042. Note that one radiation light/reflected light optical fiber may be used instead of the radiation light optical fiber 1043 and the reflected light optical fiber 1044.

Figure 30:
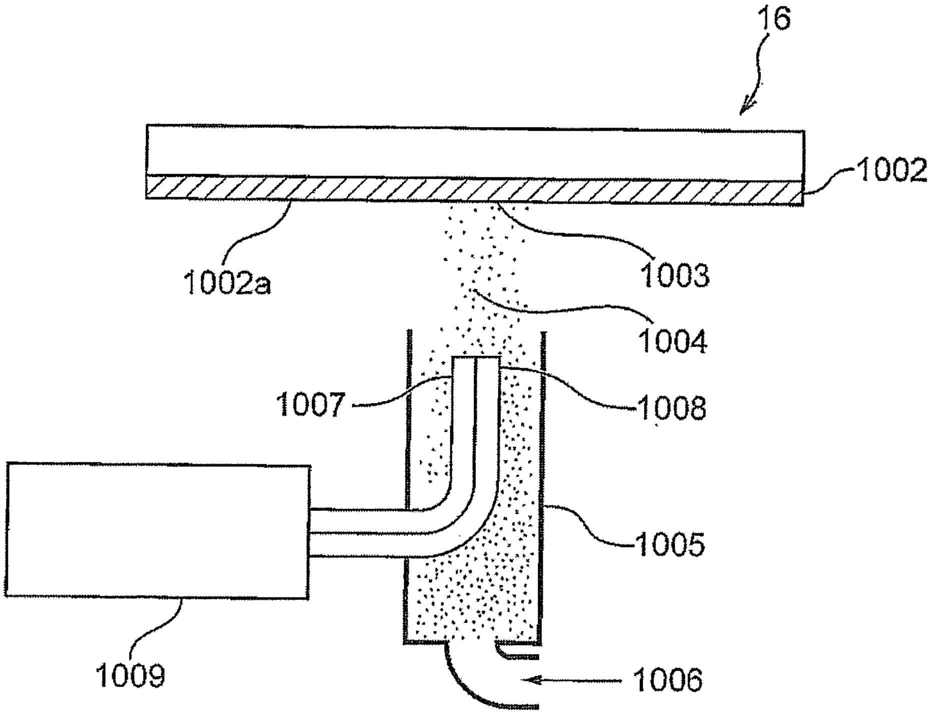
FIG. 30 is a diagram illustrating a schematic configuration example of a further embodiment.

Next, the embodiments corresponding to the fifteenth and sixteenth aspects will be described based on the accompanying drawings. FIG. 30 is a diagram illustrating a schematic configuration of an embodiment of the present invention. In FIG. 30, a water jet nozzle 1005 jets a columnar water flow onto a processing surface 1002*a* of the semiconductor wafer 16, on a surface of which a thin film 1002 is formed and causes the water flow to come into contact therewith. Distal end portions of a radiation fiber 1007 and a light receiving fiber 1008 are inserted and disposed in the water jet nozzle 1005.

In the above-described configuration, a pressurized water flow 1006 is supplied to the water jet nozzle 1005, a fine columnar water flow 1004 is brought from the distal end thereof into contact with the processing surface 1002*a* of the semiconductor wafer 16 at a predetermined position to form a measurement spot 1003. In this condition, a measurement calculation section 1009 transmits light into the water flow 1004 via the radiation fiber 1007, causes the light to pass through the water flow 1004 and irradiates the polishing surface in the measurement spot 1003 of the semiconductor wafer 16 with the light. In this case, the optical axis in the water flow 1004 is preferably substantially perpendicular to the polishing surface in terms of the apparatus configuration. However, depending on the case, if there is a positional relationship in which the light receiving fiber 1008 can receive reflected light from the polishing surface of light from the radiation fiber, a configuration in which the optical axis is set to be diagonal with respect to the polishing surface in the water flow 1004.

The light reflected by the processing surface (polishing surface) 1002*a* passes through the water flow 1004 and the light receiving fiber 1008 and is guided to the measurement calculation section 1009. The measurement calculation section 1009 measures a film thickness of the thin film 1002 from the reflected light. At this time, the inner surface of the water jet nozzle 1005 is mirror-finished and improved so as to efficiently guide radiation/reflected light to the radiation/light receiving fibers 1007 and 1008.

Figure 31:
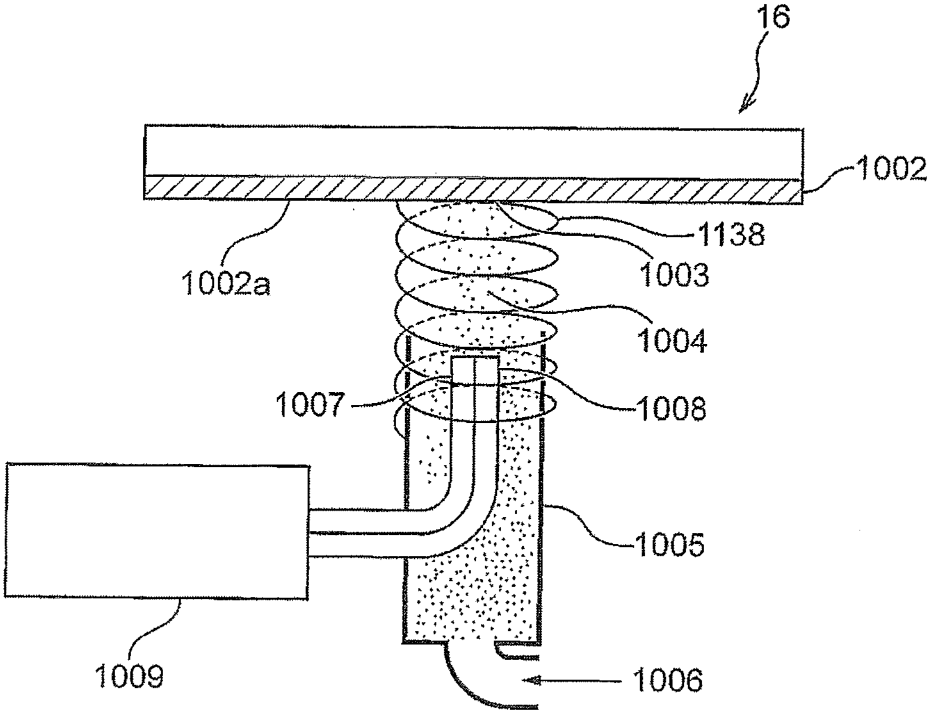
FIG. 31 is a diagram illustrating a schematic configuration example of a still further embodiment.

Furthermore, water droplets may be occasionally trapped in an area where the thin film 1002 and the water flow 1004 come into contact with each other and disturb the measurement spot 1003. Therefore, as shown in FIG. 31, a water discharge member 1138 which is spirally wound and which extends from the water jet nozzle 1005 to the measurement spot 1003 of the thin film 1002 may be provided to remove water droplets. Furthermore, when the water flow 1004 is set diagonally relative to the semiconductor wafer or in a mechanism whereby the water flow 1004 is supplied in an upward or downward direction, means for removing water droplets may be combined as appropriate. Note that as shown in FIG. 31, the water discharge member may be one having a spring-like structure and using surface tension of water or one using a suction nozzle (not shown) set so as to surround the water jet nozzle 1005.

Figure 32:
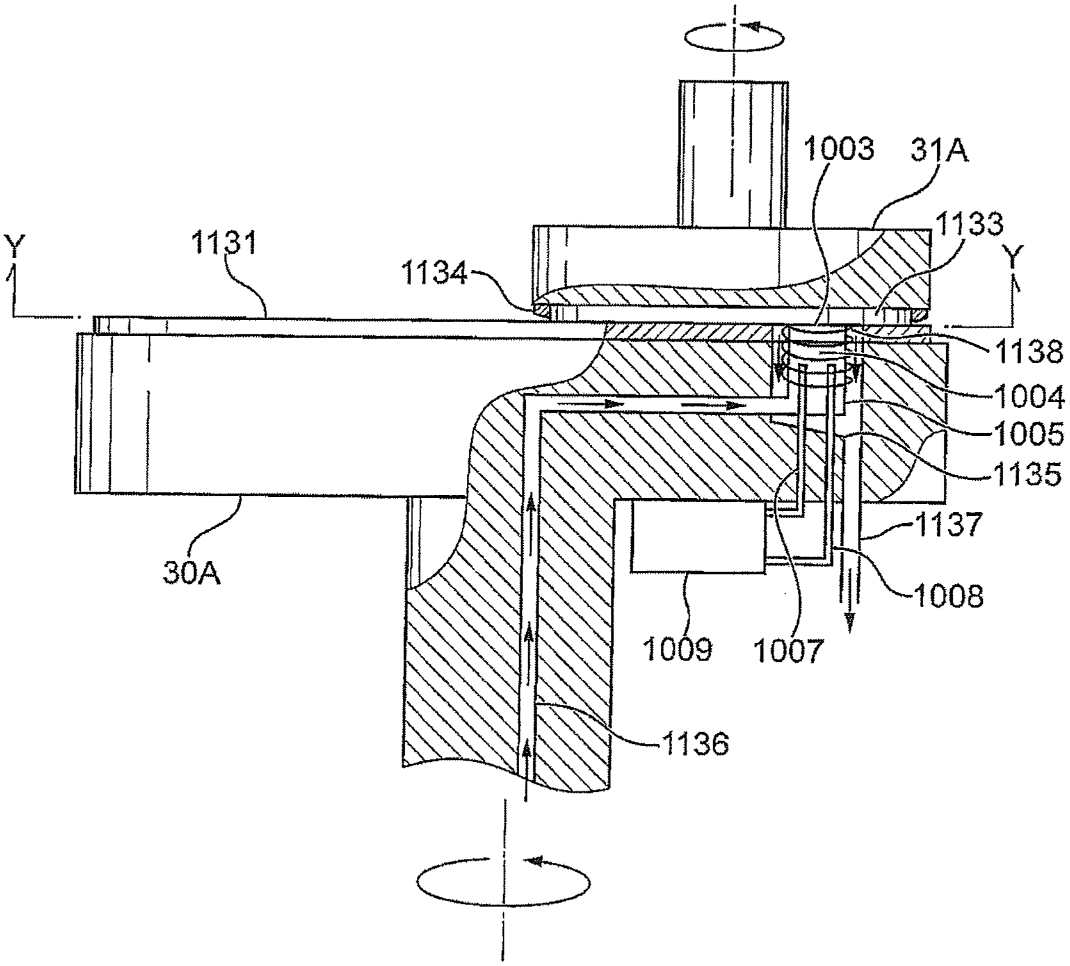
FIG. 32 is a diagram illustrating a configuration example of a polishing apparatus of a still further embodiment.
Figure 33:
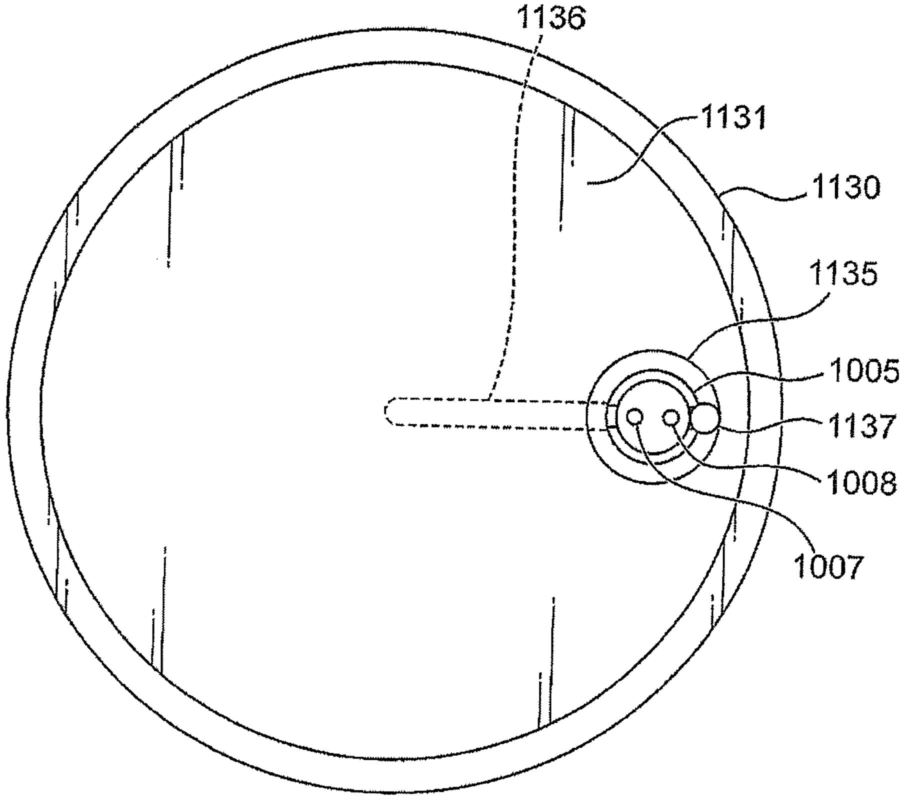
FIG. 33 is a diagram illustrating a cross section along an arrow Y-Y in FIG. 32.

FIGS. 32 and 33 are diagrams illustrating a configuration example of a polishing apparatus that polishes a polishing surface of the semiconductor wafer 16 through relative motion between the semiconductor wafer 16 and the polishing pad 10 in a case where a film thickness of the film being polished is detected in real time. FIG. 32 is a partial cross-sectional side view and FIG. 33 is a figure viewing from the arrow direction of a Y-Y line in FIG. 32.

The water jet nozzle 1005 is similar to that shown in FIG. 30 and FIG. 31, a pressurized water flow pipe 1136 is connected to the water jet nozzle 1005, the water of the water flow 1004 jetted from the water jet nozzle 1005 is received by a water receiver 1135 and discharged through a water discharge pipe 1137. The top end of the water receiver 1135 is open to the top surface of the polishing pad 10 and the water flow 1004 jetted from the water jet nozzle 1005 forms the measurement spot 1003 on the polishing surface of the semiconductor wafer 16 as in the case of FIG. 30 and FIG. 31. Note that although the water jet nozzle 1005 is depicted larger than it actually is in the figure to facilitate an understanding, the diameter of the water jet nozzle 1005 is actually small to form a tiny spot (0.4 mm to 0.7 mm).

As in the case of FIG. 30 and FIG. 31, the distal end portions of the radiation fiber 1007 and the light receiving fiber 1008 are inserted into the water jet nozzle 1005 and light passes through the radiation fiber 1007 from the measurement calculation section 1009, is guided into the water jet nozzle 1005, passes through the water flow 1004 jetted from the water jet nozzle 1005 and is projected into the measurement spot 1003 on the polishing surface with which the water flow 1004 comes into contact. The light reflected by the polishing surface passes through the water flow 1004 and the light receiving fiber 1008 and is guided into the measurement calculation section 9.

The seventeenth aspect is the processing apparatus for polishing a polishable object, including a plurality of processing areas housing a plurality of light-shielded processing units arranged on upper and lower rows and transfer areas housing transporters and arranged between the processing areas, the processing areas are light-shielded from the transfer areas by a light-shielding wall and the front of the transfer area is light-shielded by a maintenance door and the processing units are connected to the light-shielding wall in a light-shielded state.

Thus, by applying a light-shielding process to the processing unit and by light-shielding the processing area in which the processing unit is disposed from the transfer area using the light-shielding wall and light-shielding the front of the transfer area using the maintenance door, it is possible to prevent light from entering from the outside into the transfer area even when the maintenance door of the processing unit is left open and process the polishable object in a light-shielding state by the lower processing unit even when, for example, the upper processing unit of the processing units disposed on the upper and lower rows is under maintenance. Thus, even when some processing units are under maintenance, it is possible to process the polishable object by another processing unit other than the processing unit in question without stopping the apparatus.

The eighteenth aspect is the processing apparatus according to the seventeenth aspect, in which the processing unit is provided with a polishable object insertion port having an openable/closable shutter, the light-shielding wall is provided with a light-shielding film that surrounds the polishable object insertion port and an opening is provided in a region of the light-shielding wall surrounded by the light-shielding film.

In this way, it is possible to transfer the polishable object with the shutter of the processing unit left open and while maintaining the light-shielding state in the processing unit and the transfer area, and prevent light from the outside from entering the transfer area through the opening of the light-shielding wall during maintenance, for example.

The nineteenth aspect is the processing apparatus for polishing a polishable object according to the eighteenth or nineteenth aspect, in which the processing area is a cleaning area and processing on a polishable object is cleaning of a polishable object.

According to the seventeenth to nineteenth aspects, it is possible to prevent photocorrosion of copper wiring or the like due to irradiation of the processed surface of the polishable object with light and process the polishable object, preventing photocorrosion of copper wiring or the like due to irradiation of the processed surface of the polishable object with light although the number of polishable objects processed temporarily decreases.

The seventeenth to nineteenth aspects can have the following features: (1) An apparatus that reduces electrolysis between metal features in a semiconductor material (that is, substrate) including a sealing mechanism for eliminating exposure of the semiconductor material to light having energy equal to or greater than bandgap energy of the semiconductor material. (2) The apparatus described in (1) above in which the sealing mechanism is disposed around a semiconductor processing tool selected from the group consisting of chemical mechanical polishing apparatuses and brush cleaning apparatuses. (3) The apparatus described in (2) above further including a light source capable of generating light having energy lower than bandgap energy. (4) The apparatus described in (3) above further including a process monitoring video camera capable of detecting light having energy lower than bandgap energy. (5) The apparatus described in (4) above, in which the semiconductor material is silicon-based, the sealing mechanism excludes light having a wavelength of approximately 1.1 μm or less, the light source generates light having a wavelength exceeding approximately 1.1 μm, the video camera detects such light. The apparatus may be preferably adapted so as to detect an end point in a polishing process of a silicon-based polishable object in the polishing apparatus described above using, for example, light having a wavelength in the relevant region, for example, infrared light. (6) The apparatus described in (4) above, in which the semiconductor material is gallium arsenide-based, the sealing mechanism excludes light having a wavelength of approximately 0.9 μm or less, the light source generates light having a wavelength exceeding approximately 0.9 μm, and the video camera detects the light. The apparatus may be preferably adapted so as to detect an end point in a polishing process of a gallium arsenide-based polishable object in the polishing apparatus described above using, for example, light having a wavelength in the relevant region, for example, infrared light. (7) An apparatus that reduces electrolysis between metal features in a semiconductor material, including a semiconductor processing tool capable of combining at least one electrolysis inhibitor with the metal features in the semiconductor material. (8) The apparatus described in (7) above, in which the semiconductor material is silicon-based, the sealing mechanism excludes light having a wavelength of approximately 1.1 μm or less, the light source generates light having a wavelength exceeding approximately 1.1 μm and the video camera detects the light. The apparatus may be preferably adapted so as to detect an end point in a polishing process of a silicon-based polishable object in the polishing apparatus described above using, for example, light having a wavelength in the relevant region, for example, infrared light.

In crystalline solids such as materials constituting an integrated circuit, atomic orbits are practically combined to become a continuous "zone" of "crystal" orbits or electronic energy levels. A maximum occupied bandwidth is called a "valence band" and a lowest bandwidth is called a "conduction band." The amount of energy necessary to excite one electron from a maximum point of the valence band to a minimum point of the conduction band is called "bandgap energy (Eg)." Bandgap energy of silicon is Eg=1.12 eV at a room temperature and bandgap energy of gallium arsenide is Eg=1.42 eV. A semiconductor material such as silicon is known to exhibit photoconductivity in which light radiation gives energy enough to excite electrons to the conduction band and increase conductivity of a semiconductor. Light energy is associated with a frequency or wavelength according to equation $E=hv$ or $E=hc/\lambda$, where h is Planck's constant, c is the velocity of light, v is a frequency and λ is a wavelength. For most silicon-based semiconductors at a room temperature, the light energy necessary to achieve photoconductivity needs to reach approximately 1.12 eV, that is, the light needs to have a wavelength of approximately 1.1 μm or less. For gallium arsenide semiconductors, the light needs to have a wavelength of approximately 0.9 μm or less to achieve photoconductivity. For other semiconductors, Eg can be easily obtained from general reference documents and wavelengths can be calculated using the above-described equations. The following description is given focusing on silicon-based semiconductor elements, but those skilled in the art will easily understand that the present invention is likewise applicable to devices manufactured using other semiconductor materials such as gallium arsenide.

Figure 34:
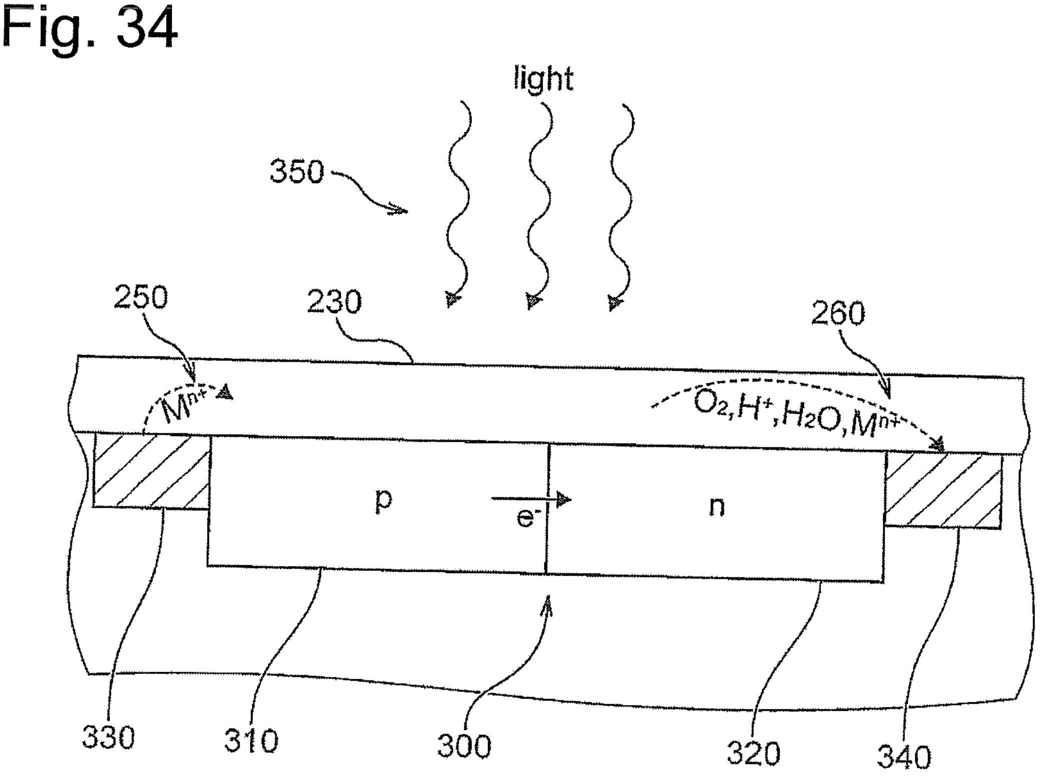
FIG. 34 is a cross-sectional view illustrating an example of PN connection.

The photoconductivity discussed above forms a basis of a photoelectric effect in a PN junction 300 shown in FIG. 34. An n-type semiconductor 320 is silicon doped with a donor impurity such as phosphor or arsenic, which supplies electrons to the silicon conduction band and generates extra negative charge carriers. Therefore, many charge carriers in the n-type semiconductor 320 are negatively charged particles. The p-type semiconductor 310 is silicon doped with an acceptor impurity such as boron which receives electrons from the valence band of silicon and generates extra positive holes or positive charge carriers. Therefore, many charge carriers in the p-type semiconductor 310 are positively charged positive holes. When the PN junction 300 is irradiated with photons of the light 350 having sufficient energy, electrons in both the p-type 310 and the n-type 320 semiconductors are excited from the valence band to the conduction band and positive holes remain. Many of the additional positive charge carriers generated in the n-type semiconductor 320 in this way move toward the p-type 310 side of positive (positive hole) junction 300. Many of the additional negative charge carriers generated in the p-type semiconductor 310 in this way move toward the n-type 320 side of negative (electron) junction 300. The movement of these charge carriers produces a photoelectric effect and generates a similar current source for the battery.

When the PN junction functioning as a current source is connected to metal conductors such as mutual connections 330 and 340 exposed to an electrolyte 230, all elements necessary for electrolysis are present and dissolution of anode metal components takes place if the potential is sufficient. The electrochemical dissolution in FIG. 34 generated by a photoelectric voltage is similar to electrochemical dissolution. Oxidation reaction in the anode 330 generates free cations 250 dissolved into the electrolyte 230 and electrons that flow into the current source (PN junction 300) via an inner connection reaching the cathode 340. This oxidation reaction gives rise to a most outstanding sign of the electrolysis, that is, dissolution of the anode 330 or pitching, but reduction reaction also has to take place. The reduction reaction at the cathode causes electrons to couple with a reactant 260 in the electrolyte 230 and generates a reduced reaction product. It should be noted that some of the metal conductors become cathodes and some other metal conductors become anodes depending on to which of the p side or then side of the PN junction they are connected.

For cancellation or reduction of electrochemical dissolution, a preferred embodiment of the present invention provides a method and an apparatus for eliminating or reducing electrochemical dissolution of global wiring, mutual connection, contacts and other metal features. The preferred embodiment reduces dissolution by eliminating exposure of the PN junction to light which may cause a photoelectric effect or prevent either oxidation or reduction induced by a photoelectric effect or both of oxidation and reduction.

Note that examples of a scheme for holding the top ring and the drive section of the top ring include not only the aforementioned scheme for holding them at an end portion of the swing arm (cantilever arm) but also a scheme for holding a plurality of drive sections for driving each top ring to one carousel. When the first embodiment of the present invention is applied to a carousel, it is also possible to provide a polishing apparatus with reduced differences in the measurement results of the current sensor among a plurality of polishing apparatuses. These top rings and drive sections constitute a set (of polishing apparatuses) and one carousel can be provided with a plurality of sets thereof. By applying the aforementioned embodiment to current values of motor currents of a plurality of drives sections (top ring motor 114), it is possible to implement a polishing apparatus with reduced differences in the measurement results of the current sensor among a plurality of sets of polishing apparatuses.

Figure 35:
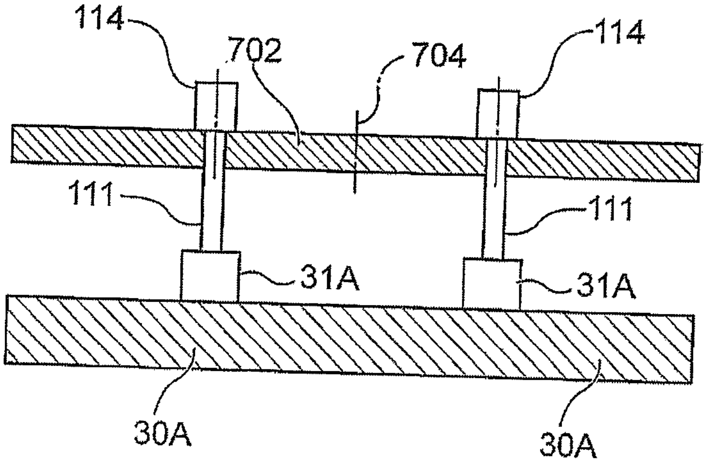
FIG. 35 is a schematic side view illustrating a relationship between a multihead type top ring and a polishing table supported by a carousel.

The carousel will be described with reference to FIG. 35. The carousel is rotatable around an axis of rotation 704 and a top ring motor 114 is attached to the carousel 702. FIG. 35 is a schematic side view illustrating a relationship between a multihead type top ring 31A supported by the carousel 702, the top ring motor 114 and the polishing table 30A. As shown in FIG. 35, a plurality of top ring units are disposed on one polishing table 30A. One top ring may be disposed on the carousel and there may be two or more tables. A plurality of top rings may be disposed in the carousel and there may be a plurality of tables. In this case, one top ring may be placed on one table or a plurality of top rings may be placed on one table. The carousel may perform movement such as rotation or the top ring may move to another table at the next stage and perform polishing.

The carousel 702 is rotatable. A rotation mechanism is provided in the vicinity of the center of the carousel 702. The carousel 702 is supported by pillars (not shown). The carousel 702 is supported by a main rotation shaft of a motor (not shown) attached to the pillars. Therefore, the carousel 702 can rotate around a vertical rotation shaft center 704 through rotation of the main rotation shaft. Note that as a scheme similar to the carousel scheme, for example, a circular rail may be used instead of the carousel. A plurality of drive sections (top ring motors 114) are disposed on the rail. At this time, the drive sections can move on the rail.

Figure 36:
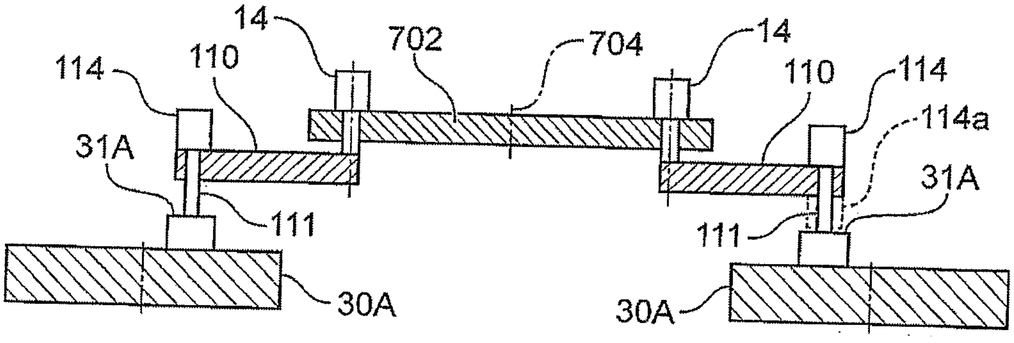
FIG. 36 is a schematic side view illustrating a relationship between a multihead type top ring supported by a carousel including an arm drive section and the polishing table.
Figure 37:
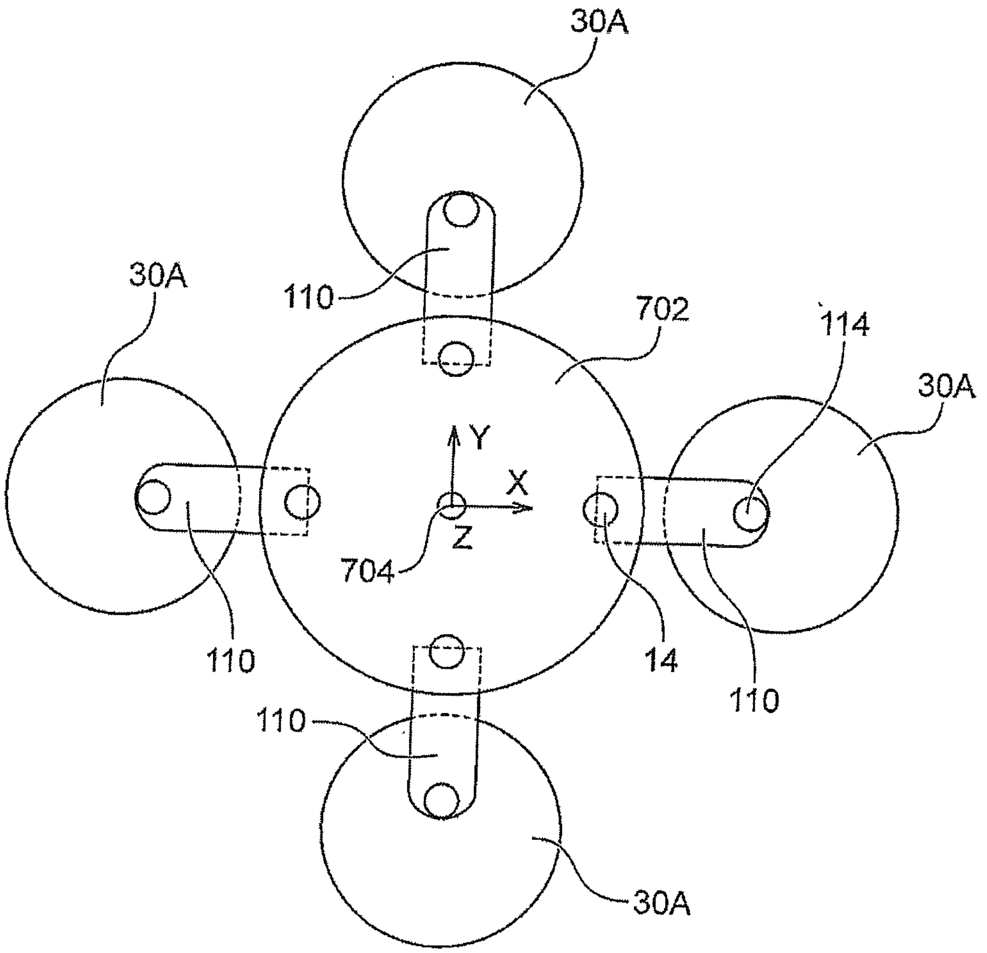
FIG. 37 is a top view of the embodiment shown in FIG. 36.

Next, an embodiment will be described using FIGS. 36 and 37 in which the polishing apparatus includes a carousel which is rotatable around an axis of rotation and the arm drive section is attached to the carousel. FIG. 36 is a schematic side view illustrating a relationship among a multihead-type top rings 31A and swing arms 110 supported by the carousel 702 and the polishing table 30A, and FIG. 37 is a top view.

According to the embodiment shown in FIG. 36 in which the top rings are attached to the carousel 702, it is possible to solve the following problems. When a plurality of top rings 31A are disposed on the large carousel 702, as one of the polishing end point detection means, a method of monitoring a torque fluctuation of the polishing table rotation drive motor or the top ring rotation drive motor is available in addition to the method based on arm torque. According to these methods, a change of rotational resistance force (frictional force) of the top ring 31A is detected. However, a frictional force detection signal involves errors due to errors caused by swinging of the arm, fluctuation of rotation of the top ring and fluctuation of rotation of the table, and it has been conventionally difficult to perform end point detection with high accuracy. Furthermore, when one rotation table includes a plurality of top rings, the table rotation fluctuates in a complicated manner under the influence of the plurality of top rings 31A, and so it has been conventionally difficult to catch exact fluctuation of frictional force of each top ring 31A.

Figure 19:
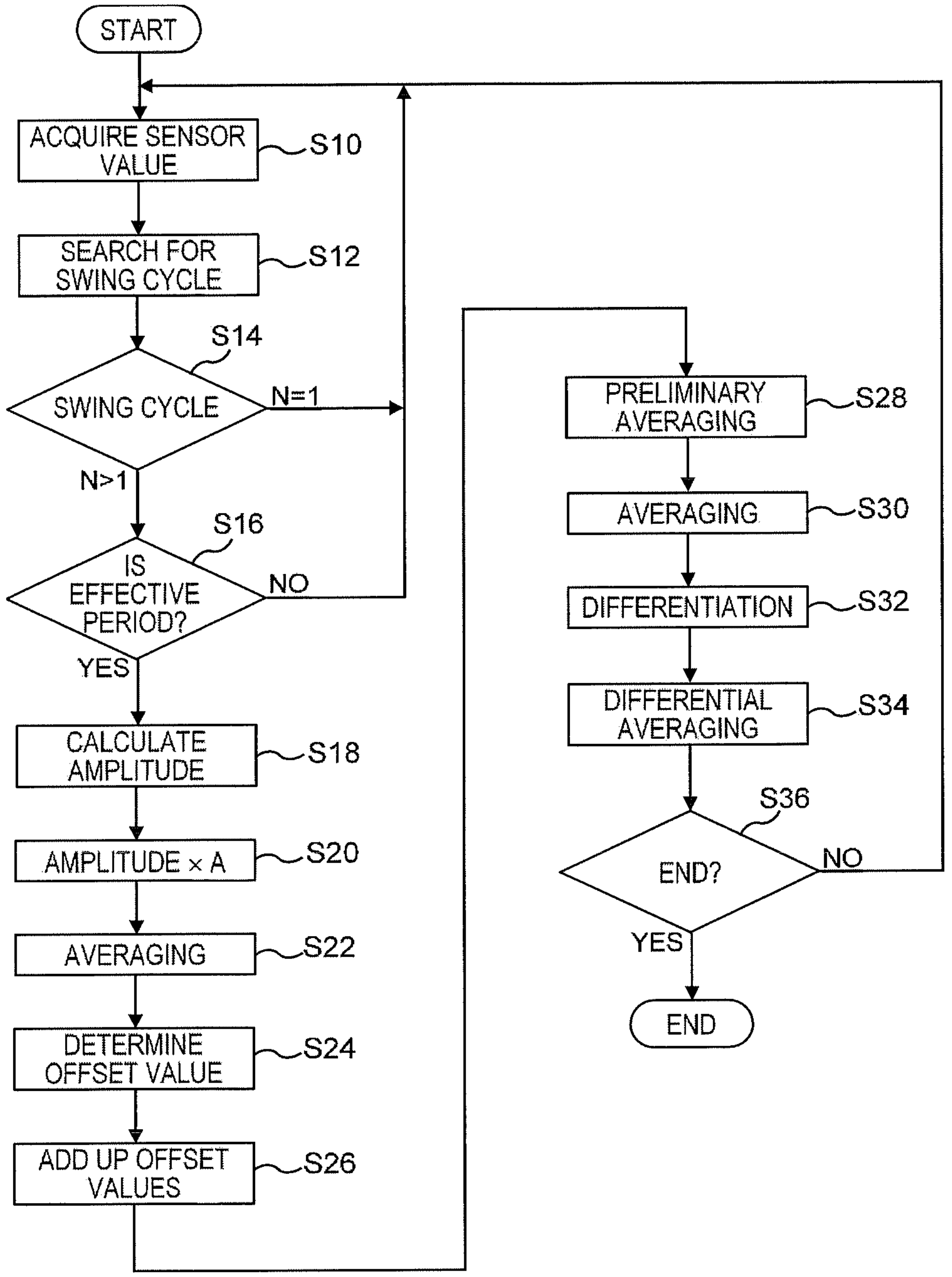
FIG. 19 is a flowchart illustrating processing by the end point detection section.

If the embodiment described regarding FIGS. 18 and 19 is applied to the embodiment shown in FIG. 36, errors caused by swinging of the arm, fluctuation of rotation of the top ring and fluctuation of rotation of the table are reduced and influences of the plurality of top rings 31A are also reduced, and it is thereby possible to solve these problems.

In the polishing apparatus in FIG. 36, the swing arm 110 is attached to the carousel 702 and the top ring 31A is attached to the swing arm 110. A unit is constructed of one swing arm 110 and one top ring 31A (hereinafter, referred to as a "TR unit"), and there is a case where one such unit is set up on the carousel 702 and there is a case where a plurality of such units are set up on the carousel 702 (multihead type). FIG. 36 shows a case where a plurality of such units are set up on the carousel 702.

Note that in FIGS. 35 and 36, the top ring motor 114 is disposed above the swing arm 110, but the top ring motor 114*a* may be disposed below the swing arm 110 as shown by a dotted line in FIG. 36. Note that as shown in FIG. 35, when there are a plurality of top rings 31A on one polishing table 30A, the swing direction or the moving direction of the plurality of top rings 31A needs to be such that the plurality of top rings 31A move so as not to interfere with each other. For example, in the case of an arrangement in which if the plurality of top rings 31A move in such a way as to come closer to each other, the plurality of top rings 31A may interfere with each other, but interference is prevented by moving the plurality of top rings 31A so as not to come closer to each other or moving the top rings 31A in the same direction.

As another embodiment, the carousel 702 in FIGS. 35 and 36 may be replaced by a track. That is, the top ring motor 114 may be directly provided on the track or the swing arm 110 may be provided on the track and the top ring motor 114 may be provided on the swing arm 110.

A circular shape similar to the carousel shown in FIGS. 35 and 36 or a linear shape can be adopted as a shape of the track. The polishing apparatus using the track includes a support frame and a track attached to the support frame to define a conveyance path of the top ring motor 114, and a carriage. The carriage is a carriage that conveys the top ring motor 114 (the swing arm 110 when the top ring motor 114 is attached to the swing arm 110) along the path defined by the track, connected to the track and can move along the track. The carriage may have a mechanism for movement in the XYZ direction which will be described later below a mechanism for movement along the track. The carriage may also include a motor mechanism that rotates the top ring below the mechanism for movement in the XYZ direction. The "track" is also called a "rail".

As the mechanism (carriage) for movement along the track, a linear motor drive scheme can also be used. A track mechanism using a motor and a bearing is also possible. Various carriage moving directions are available. For example, the carriage can move on a straight line (that is, radius) connecting the center 704 of the polishing table 30A and the end portion of the polishing table 30A or on a curve. Alternatively, the carriage may have a mechanism for movement in the X direction, a mechanism for moving in the Y direction and a mechanism for moving in the Z direction as shown in FIG. 37, and can perform movement combining these moving directions. The combination of directions may include (X direction or Y direction)+Z direction or directions other than the X direction or Y direction.

It is possible to perform polishing while the carriage is moving or while the carriage stands still and perform end point detection during polishing. As the monitor output of the frictional force at that time, the motor output of the polishing table 30A or top ring rotation motor output can be used. While the carriage is moving, the output signal fluctuates as the carriage moves, and so end point detection has been conventionally difficult, but it is possible to accurately perform end point detection while moving the carriage during polishing using the processing method according to the embodiment of the present invention.

As a further embodiment, there is an aspect in which the track itself can rotate or can move linearly. In this aspect, the track itself rotates or moves linearly, and can move the top ring to another table section. The carriage makes a small amount of movement adjustment at that time.

In FIGS. 35 and 36, it is also possible to use a linear movement mechanism (carriage) using a linear motor drive scheme instead of the swing arm 110. As the linear movement direction, there is a direction in which the carriage moves on a radius in one direction between the center 704 of the carousel 702 and the end portion. Alternatively, it is possible to include a mechanism for movement in the X direction, a mechanism for movement in the Y direction and a mechanism for movement in the Z direction as shown in FIG. 37, and perform movement combining these moving directions. Examples of the combination of directions include (X direction or Y direction)+Z direction or directions other than the X direction or the Y direction.

In the aspect shown in FIGS. 35 to 37, the arm or the carriage swings or moves and performs polishing while swinging or moving. When the arm or the carriage swings or moves, a motor current signal fluctuates even when the frictional force does not change during polishing. In such a case, the embodiment shown in FIG. 16 and subsequent drawings is effective. In the embodiment shown in FIG. 16 and subsequent drawings, it is possible to detect a change of the material of the surface of the semiconductor wafer 16 along with the progress of polishing and a change of the frictional force caused by a change of the circuit pattern. End point detection is performed based on the detected change of the frictional force.

Although the embodiments of the present invention have been described so far, the aforementioned embodiments are intended to facilitate an understanding of the present invention, but not intended to limit the present invention. The present invention can be changed or improved without departing from the spirit and scope of the present invention, and it goes without saying that the present invention includes its equivalent components. Furthermore, within a scope in which at least some of the aforementioned problems can be solved or within a scope in which at least some effects can be exerted, the scope of patent claims and the respective components described in the specification can be arbitrarily combined or omitted.

This application claims priority under the Paris Convention to Japanese Patent Application No. 2017-233315 filed on Dec. 5, 2017. The entire disclosure of Japanese Patent Laid-Open Nos. 2004-249458 and 2001-252866 and U.S. Pat. No. 6,293,845 including specification, claims, drawings and summary is incorporated herein by reference in its entirety.

REFERENCE SIGNS LIST

10 . . . Polishing pad
14 . . . Swing shaft motor
16 . . . Semiconductor wafer
18 . . . Driver
26 . . . Arm torque detection section
28 . . . End point detection section
50 . . . Eddy current sensor
110 . . . Swing arm
760 . . . Unit controller
810 . . . Current detection section

What is claimed is:

1. A polishing apparatus for polishing between a polishing pad and a polishable object disposed opposed to the polishing pad, the polishing apparatus comprising:
- a polishing table that can hold the polishing pad;
- a first electric motor that can drive to rotate the polishing table;
- a holding section that can hold the polishable object and press the polishable object against the polishing pad;
- a second electric motor that can drive to rotate the holding section;
- a swing arm configured to hold the holding section;
- a third electric motor configured to swing the swing arm around a swing center on the swing arm;
- a detection circuitry configured to detect an electric current value of one electric motor of the first, second and third electric motors and/or a torque command value of the one electric motor and can generate a first output,
- a change detection circuitry configured to increase a change amount of the first output while causing the polishable object to swing around the swing center on the swing arm and polishing the polishable object, and configured to detect a change of a frictional force between the polishing pad and the polishable object, and
- an end point detection circuitry configured to detect a polishing end point indicating an end of polishing based on the increased change amount of the first output while causing the polishable object to swing around the swing center on the swing arm and polishing the polishable object,
- wherein the end point detection circuitry is configured to determine, based on a present time point first output value and a plurality of past first output values stored in the end point detection circuitry, a swing cycle count to which the present time point first output value corresponds.

2. The polishing apparatus according to claim 1, wherein the first output is configured to be synchronized with swing motion of the swing arm.

3. The polishing apparatus according to claim 1, wherein the first output is configured to be synchronized with the fluctuation of arm torque added to the swing arm regarding to the swing center.

4. The polishing apparatus according to claim 1, wherein the change detection circuitry is configured to increase the change amount of the first output by multiplying the first output by a constant.

5. The polishing apparatus according to claim 1, wherein the change detection circuitry averages the first output and can thereby reduce noise included in the first output.

6. The polishing apparatus according to claim 1, wherein the change detection circuitry amplifies the first output or adds a predetermined value in accordance with the first output to the first output and can thereby increase the change amount of the first output.

7. The polishing apparatus according to claim 1, wherein the change detection circuitry is configured to obtain an amount of the first output subjected to smoothing.

8. The polishing apparatus according to claim 1, wherein the end point detection circuitry is further configured to determine whether or not the first output is within an effective period when the swing cycle count corresponds to a second or later swing cycle, the effective period is defined as a time period when a predetermined period has passed after polishing starts.

9. A polishing apparatus comprising:
- a first electric motor configured to drive to rotate a polishing table that can hold a polishing pad;
- a second electric motor configured to drive to rotate a holding section configured to hold a polishable object and to press the polishable object against the polishing pad;
- a third electric motor configured to swing a swing arm that holds the holding section around a swing center on the swing arm;
- a detection circuitry configured to detect an electric current value of one electric motor of the first, second and third electric motors and/or a torque command value of the one electric motor and to generate a first output; and
- a non-transitory computer readable medium having stored thereon computer readable instructions that upon execution by a computer, cause the polishing apparatus to at least perform the operations comprising:
- swinging the swing arm around the swing center on the swing arm using the third electric motor;
- detecting a change of a frictional force between the polishing pad and the polishable object by increasing a change amount of the first output while swinging the polishable object around the swing center on the swing arm and polishing the polishable object, and detecting a polishing end point indicating an end of polishing based on the increased change amount of the first output while swinging the polishable object around the swing center on the swing arm and polishing the polishable object, wherein the end of polishing is determined based on a comparison of the increased change amount of the first output to a stored reference value corresponding to a prior swing cycle, and determining, based on a present time point first output value and a plurality of past first outputs values stored in the detection circuitry, a swing cycle count to which the present time point first output value corresponds.

* * * * *